United States Patent
Taguchi et al.

(10) Patent No.: US 8,632,951 B2
(45) Date of Patent: Jan. 21, 2014

(54) POSITIVE-WORKING LITHOGRAPHIC PRINTING PLATE PRECURSOR FOR INFRARED LASER AND PROCESS FOR MAKING LITHOGRAPHIC PRINTING PLATE

(75) Inventors: Yoshinori Taguchi, Shizuoka (JP); Noriaki Watanabe, Shizuoka (JP); Norio Aoshima, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 196 days.

(21) Appl. No.: 13/040,972

(22) Filed: Mar. 4, 2011

(65) Prior Publication Data

US 2011/0217656 A1 Sep. 8, 2011

(30) Foreign Application Priority Data

Mar. 8, 2010 (JP) .................................. 2010-050565
Mar. 18, 2010 (JP) .................................. 2010-063159

(51) Int. Cl.
| | |
|---|---|
| B41M 5/00 | (2006.01) |
| B41N 1/00 | (2006.01) |
| G03F 7/00 | (2006.01) |
| G03F 7/26 | (2006.01) |

(52) U.S. Cl.
USPC .................. 430/284.1; 430/270.1; 430/281.1; 430/302; 430/309; 101/453; 101/463.1

(58) Field of Classification Search
USPC .......... 430/270.1, 302; 101/450.1, 453, 463.1
See application file for complete search history.

(56) References Cited

U.S. PATENT DOCUMENTS

| | | | |
|---|---|---|---|
| 2002/0106583 A1* | 8/2002 | Kawamura et al. | 430/271.1 |
| 2003/0118849 A1* | 6/2003 | Yamasaki et al. | 428/447 |
| 2009/0186301 A1* | 7/2009 | Ray et al. | 430/302 |
| 2009/0208869 A1* | 8/2009 | Kamiya et al. | 430/283.1 |

FOREIGN PATENT DOCUMENTS

| | | |
|---|---|---|
| EP | 1903396 A1 | 3/2008 |
| JP | 10-312058 A | 11/1998 |
| JP | 10-312058 A1 * | 11/1998 |
| JP | 11-218914 A | 8/1999 |
| JP | 2003-177533 A | 6/2003 |
| JP | 2007-17913 A | 1/2007 |

OTHER PUBLICATIONS

Extended European Search Report, dated Jul. 14, 2011, issued in European Patent Application No. 11154487.0-1226.

* cited by examiner

*Primary Examiner* — Chanceity Robinson
(74) *Attorney, Agent, or Firm* — Sughrue Mion, PLLC

(57) ABSTRACT

A positive-working lithographic printing plate precursor for infrared laser is provided that includes, layered sequentially above a support, a lower layer and an upper layer, the lower layer and/or the upper layer including an infrared absorbing agent, either the lower layer comprising an alkali-soluble group-containing graft copolymer or the upper layer comprising a sulfonamide group-, active imide group-, and/or amide group-containing graft copolymer, and the graft copolymer being a polyurethane resin having as a graft chain an ethylenically unsaturated monomer-derived constitutional unit. There is also provided a process for making a lithographic printing plate, the process including in sequence an exposure step of imagewise exposing by means of an infrared laser the positive-working lithographic printing plate precursor for infrared laser and a development step of developing using an aqueous alkali solution with a pH of 8.5 to 10.8.

8 Claims, 1 Drawing Sheet

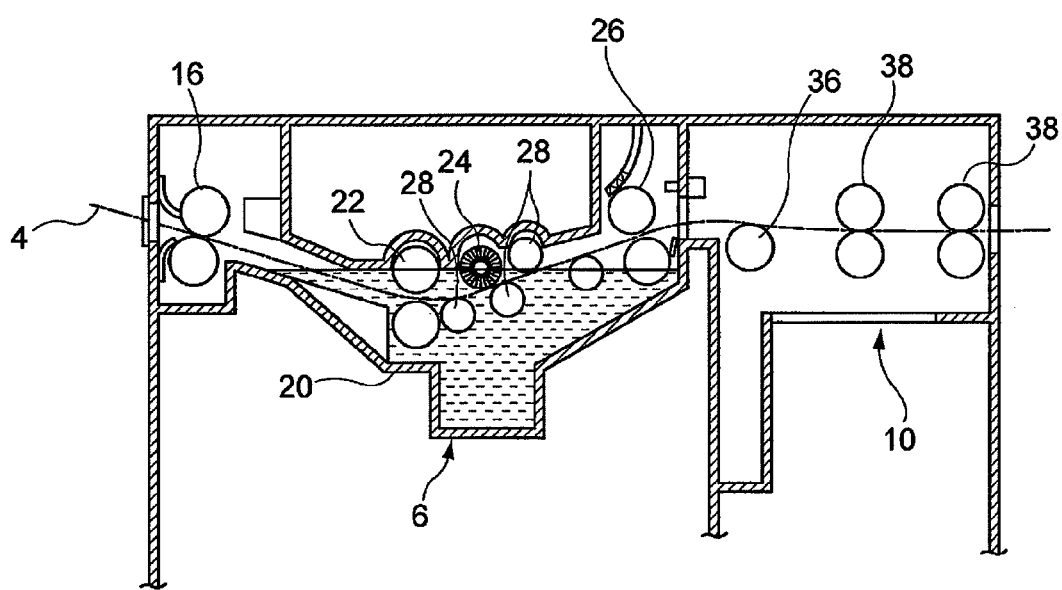

POSITIVE-WORKING LITHOGRAPHIC PRINTING PLATE PRECURSOR FOR INFRARED LASER AND PROCESS FOR MAKING LITHOGRAPHIC PRINTING PLATE

TECHNICAL FIELD

The present invention relates to a positive-working lithographic printing plate precursor for infrared laser and a process for making a lithographic printing plate.

BACKGROUND ART

Conventionally, various photosensitive compositions have been used for formation of a visible image or as a lithographic printing plate material. In particular, recent development of lasers for lithographic printing has been remarkable, and in particular solid-state lasers/semiconductor lasers with an emission range in the near-infrared to infrared that have high output and small size are readily available. These lasers are very useful as an exposure light source when making a plate directly from digital data of a computer, etc.

A positive-working lithographic printing plate precursor for infrared laser comprises as essential components an alkali-soluble binder resin and an infrared absorbing agent, etc., which absorbs light and generates heat. This infrared absorbing agent, etc. functions in an unexposed area (image area) as a development inhibitor, which substantially suppresses solubility of the binder resin in a developer by virtue of interaction with the binder resin; in an exposed area (non-image area) the interaction between the infrared absorbing agent, etc. and the binder resin weakens due to the generated heat and dissolution in an alkali developer progresses, thus forming a lithographic printing plate. However, such a positive-working lithographic printing plate material for infrared laser does not have sufficient processability (development latitude) when a developer is exhausted and the activity drops off.

In order to solve such a problem with development latitude, use of a recording layer comprising a material that can be more easily developed in a non-image area, that is, has better solubility in aqueous alkali solution could be considered, but such a recording layer has the problems that it becomes chemically weak in an image area also and has poor durability in normal printing and, furthermore, has poor chemical resistance such that it is easily damaged by a developer or an ink washing solvent, a plate cleaner, etc. used during printing.

As a solution for these problems, a method in which a recording layer is formed as multiple layers is known (JP-A-11-218914 (JP-A denotes a Japanese unexamined patent application publication)).

Furthermore, as a solution for these problems, a method in which a recording layer is formed as multiple layers and an upper layer and/or a lower layer thereof employs a polyurethane resin having good solubility in aqueous alkali solution and high durability has been used (JP-A-2003-177533 and JP-A-2007-17913).

On the other hand, for the purpose of improving solvent resistance and durability, a lithographic printing plate employing a polyurethane resin having an acidic hydrogen atom-containing macromonomer unit in a side chain has been disclosed (JP-A-10-312058).

SUMMARY OF THE INVENTION

Problems to be Solved by the Invention

However, it cannot be said that the method in which a recording layer is formed as multiple layers gives on its own a sufficient difference (discrimination; hereinafter, also called 'dissolution discrimination') between dissolution resistance against a developer in unexposed areas (image areas) and solubility of exposed areas (non-image areas) under various application conditions; there is the problem that excessive development or insufficient development due to variation in application conditions easily occurs, and there is a strong desire in particular for a material that has excellent development latitude and durability in unexposed areas.

It is an object of the present invention to provide a positive-working lithographic printing plate precursor for infrared laser having excellent development latitude, dissolution discrimination, and printing durability and having little post-exposure degradation in developability over time, and a process for making a lithographic printing plate employing the positive-working lithographic printing plate precursor for infrared laser.

Means for Solving the Problems

The object of the present invention has been attained by means <1>, <2>, <10>, <12>, and <20> below. They are listed together with <3> to <9>, <11>, <13> to <19>, and <21>, which are preferred embodiments.

<1> A positive-working lithographic printing plate precursor for infrared laser comprising, layered sequentially above a support, a lower layer and an upper layer, the lower layer and/or the upper layer comprising an infrared absorbing agent, either the lower layer comprising an alkali-soluble group-containing graft copolymer or the upper layer comprising a sulfonamide group-, active imide group-, and/or amide group-containing graft copolymer, and the graft copolymer being a polyurethane resin having as a graft chain an ethylenically unsaturated monomer-derived constitutional unit, <2> a positive-working lithographic printing plate precursor for infrared laser comprising, layered sequentially above a support, a lower layer comprising an alkali-soluble group-containing graft copolymer and an upper layer that increases in solubility in aqueous alkali solution upon exposure, the lower layer and/or the upper layer comprising an infrared absorbing agent, and the graft copolymer in the lower layer being a polyurethane having as a graft chain an ethylenically unsaturated monomer-derived constitutional unit, <3> the positive-working lithographic printing plate precursor for infrared laser according to <2> above, wherein the polyurethane is a reaction product of a diisocyanate and a diol, <4> the positive-working lithographic printing plate precursor for infrared laser according to <2> or <3> above, wherein the graft chain comprises an acidic hydroxy group and/or an acidic amino group as the alkali-soluble group, <5> the positive-working lithographic printing plate precursor for infrared laser according to any one of <2> to <4> above, wherein the graft chain has a terminal bonded to a diol compound residue via a sulfur atom, <6> the positive-working lithographic printing plate precursor for infrared laser according to any one of <2> to <5> above, wherein the graft chain comprises as the alkali-soluble group a group selected from the group consisting of a sulfonamide group, an active imide group, a sulfonic acid group, a phosphoric acid group, and a phosphonic acid group, <7> the positive-working lithographic printing plate precursor for infrared laser according to any one of <2> to <6> above, wherein the graft chain comprises as the alkali-soluble group a group selected from the group consisting of a sulfonamide group and an active imide group, <8> the positive-working lithographic printing plate precursor for infrared laser according to <3> above, wherein the diol comprises a carboxy group-containing diol and a diol having a graft chain containing a group selected from the group consisting of a sulfonamide group and an active imide group,
<9> the positive-working lithographic printing plate precursor for infrared laser according to any one of <2> to <8> above, wherein the upper layer comprises an infrared absorbing agent,
<10> a process for making a lithographic printing plate, comprising in sequence an exposure step of imagewise exposing the positive-working lithographic printing plate precursor according to any one of <1> to <9> above and a development step of developing using an aqueous alkali solution with a pH of 8.5 to 10.8,
<11> the process for making a lithographic printing plate according to <10> above, wherein the aqueous alkali solution further comprises an anionic surfactant or a nonionic surfactant,
<12> a positive-working lithographic printing plate precursor for infrared laser comprising, layered sequentially above a support, a lower layer comprising a water-insoluble and alkali-soluble resin and an infrared absorbing agent and an upper layer comprising a sulfonamide group-, active imide group-, and/or amide group-containing graft copolymer, the graft copolymer being a polyurethane resin having as a graft chain an ethylenically unsaturated monomer-derived constitutional unit,
<13> the positive-working lithographic printing plate precursor for infrared laser according to <12> above, wherein the polyurethane resin is a reaction product of a diisocyanate and a diol,
<14> the positive-working lithographic printing plate precursor for infrared laser according to <13> above, wherein the diol comprises (A-1) a diol having a graft chain comprising a group selected from the group consisting of a sulfonamide group, an active imide group, and an amide group,
<15> the positive-working lithographic printing plate precursor for infrared laser according to <14> above, wherein the diol (A-1) has a sulfonamide group,
<16> the positive-working lithographic printing plate precursor for infrared laser according to <14> or <15> above, wherein the diol (A-1) is a diol compound obtained by radical polymerization of an ethylenically unsaturated monomer having a sulfonamide group, an active imide group, and/or an amide group in the presence of a compound having a mercapto group and two hydroxy groups,
<17> the positive-working lithographic printing plate precursor for infrared laser according to any one of <14> to <16> above, wherein the diol further comprises (A-2) a carboxy group-containing diol,
<18> the positive-working lithographic printing plate precursor for infrared laser according to any one of <12> to <17> above, wherein the graft chain has a terminal bonded to a diol compound residue via a sulfur atom,
<19> the positive-working lithographic printing plate precursor for infrared laser according to any one of <12> to <18> above, wherein the upper layer further comprises an infrared absorbing agent,
<20> a process for making a lithographic printing plate, comprising in sequence an exposure step of imagewise exposing the positive-working lithographic printing plate precursor for infrared laser according to any one of <12> to <19> above and a development step of developing using an aqueous alkali solution with a pH of 8.5 to 10.8, and
<21> the process for making a lithographic printing plate according to <20> above, wherein the aqueous alkali solution comprises an anionic surfactant or a nonionic surfactant.

BRIEF DESCRIPTION OF DRAWINGS

FIG. 1 is an explanatory diagram schematically showing the structure of an automatic processor.

EXPLANATION OF REFERENCE NUMERALS AND SYMBOLS

4: lithographic printing plate precursor, 6: development section, 10: drying section, 16: transport roller, 20: development tank, 22: transport roller, 24: brush roller, 26: squeegee roller, 28: backup roller, 36: guide roller, 38: skewer roller

MODE FOR CARRYING OUT THE INVENTION

Lithographic Printing Plate Precursor for Infrared Laser

The positive-working lithographic printing plate precursor for infrared laser of the present invention (hereinafter, simply called also a 'lithographic printing plate precursor') comprises, layered sequentially above a support, a lower layer and an upper layer, the lower layer and/or the upper layer comprising an infrared absorbing agent, either the lower layer comprising an alkali-soluble group-containing graft copolymer or the upper layer comprising a sulfonamide group-, active imide group-, and/or amide group-containing graft copolymer, and the graft copolymer being a polyurethane resin having as a graft chain an ethylenically unsaturated monomer-derived constitutional unit.

Furthermore, the positive-working lithographic printing plate precursor for infrared laser of the present invention is preferably a positive-working lithographic printing plate precursor for infrared laser in a first or second embodiment below.

The positive-working lithographic printing plate precursor for infrared laser of a first embodiment of the present invention comprises, layered sequentially above a support, a lower layer comprising an alkali-soluble group-containing graft copolymer and an upper layer that increases in solubility in aqueous alkali solution upon exposure, the lower layer and/or the upper layer comprising an infrared absorbing agent, and the graft copolymer in the lower layer being a polyurethane resin having as a graft chain an ethylenically unsaturated monomer-derived constitutional unit.

The positive-working lithographic printing plate precursor for infrared laser of a second embodiment of the present invention comprises, layered sequentially above a support, a lower layer comprising a water-insoluble and alkali-soluble resin and an infrared absorbing agent and an upper layer comprising a sulfonamide group-, active imide group-, and/or amide group-containing graft copolymer, the graft copolymer being a polyurethane resin having as a graft chain an ethylenically unsaturated monomer-derived constitutional unit.

The lithographic printing plate precursors of the first and second embodiments of the present invention are lithographic printing plate precursors that are broadly sensitive to infrared in plate making, are particularly suitable for infrared laser exposure, and give a positive-working image.

The lithographic printing plate precursors of the first and second embodiments of the present invention comprise as essential layers two layers, that is, a lower layer and an upper layer, layered above a support. In addition to these two upper and lower layers, a hydrophilic undercoat layer, etc. may be provided between the support and the lower layer, etc.

Furthermore, these two upper and lower layers form a recording layer (also called a 'photosensitive layer'); the upper layer is also called a recording layer upper layer and the lower layer is also called a recording layer lower layer.

The positive-working lithographic printing plate precursor for infrared laser of the first embodiment of the present invention is explained below.

In accordance with the positive-working lithographic printing plate precursor for infrared laser of the first embodiment of the present invention, development can be carried out stably and well, even when stored after exposure.

The lower layer comprises an alkali-soluble group-containing graft copolymer; this lower layer is insoluble in neutral water but soluble in aqueous alkali solution in processing with a standard developing time. The neutral water referred to here means neutral ion-exchanged water, and the aqueous alkali solution means an aqueous alkali solution with a pH of 8.5 to 13.5.

The upper layer has the property that its solubility in aqueous alkali solution increases upon exposure to infrared. The alkali-soluble group-containing graft copolymer contained in the lower layer is a polyurethane having as a graft chain an ethylenically unsaturated monomer-derived constitutional unit.

The mechanism of action of the lithographic printing plate precursor of the first embodiment of the present invention is not clear, but it is surmised to be as follows. A polyurethane having high durability is highly cohesive as a polymer, has a tendency for low permeability toward a developer, is easily affected by the activity of a developer, and has insufficient development latitude. On the other hand, when it is designed so as to increase in permeability toward a developer, it falls into a trade-off relationship in which, although the development latitude increases, the durability of a printing plate is degraded. On the other hand, it is surmised that, since the polyurethane in the present invention has a graft copolymer structure, high mobility of a graft chain can be utilized during permeation of a developer while maintaining durability as a lithographic printing plate based on the high cohesiveness of the polyurethane, and degradation of developability can be suppressed even for a developer whose activity is lowered.

Details of the positive-working lithographic printing plate precursor of the first embodiment of the present invention are explained below.

Graft Copolymer Contained in Lower Layer

The lower layer comprises a graft copolymer resin. The main chain of this graft copolymer is a polyurethane, and the polyurethane is preferably a reaction product between a diisocyanate and a diol. The polyurethane main chain of the copolymer is therefore linear.

The graft chain preferably comprises as an alkali-soluble group an acidic hydroxy group and/or an acidic amino group. Furthermore, the alkali-soluble group is preferably selected from the group consisting of a sulfonamide group, an active imide group, a sulfonic acid group, a phosphoric acid group, and a phosphonic acid group, and is more preferably selected from the group consisting of a sulfonamide group and an active imide group.

The graft chain of the graft copolymer comprises an ethylenically unsaturated monomer-derived constitutional unit. The graft copolymer comprises the alkali-soluble group.

A terminal of the graft chain is preferably bonded to a diol residue of the polyurethane main chain via a sulfur atom. A diol having such a chemical structure is obtained by radical polymerization of an ethylenically unsaturated monomer in the presence of a compound having a mercapto group and two hydroxy groups (mercapto group-containing diol) as a so-called chain-transfer agent.

The diol used in synthesis of the polyurethane preferably comprises a carboxy group-containing diol and a diol having a graft chain comprising a group selected from the group consisting of a sulfonamide group and an active imide group.

The graft copolymer used in the first embodiment of the present invention preferably has a weight-average molecular weight of 5,000 to 800,000, more preferably 10,000 to 100,000, and particularly preferably 20,000 to 30,000. The macromonomer (per graft chain of the polyurethane) preferably has a weight-average molecular weight of at least 500 but no greater than 20,000, more preferably 800 to 15,000, and particularly preferably 800 to 10,000.

The ratio by weight of the polyurethane in the graft copolymer is preferably 20 to 80 wt %, and more preferably 30 to 60 wt %.

From the viewpoint of developability and printing durability, the graft copolymer preferably has an acid value of 0.50 to 4.0 mmol/g, and more preferably 2.40 to 3.50 mmol/g.

A method for synthesizing the polyurethane having as a graft chain an ethylenically unsaturated monomer-derived constitutional unit is explained in further detail below.

Polyurethane Having Macromonomer Unit in Side Chain

In synthesis of the alkali-soluble group-containing graft copolymer used in the first embodiment of the present invention, processes for producing a polyurethane and a macromonomer having an acidic hydrogen atom can be referred to, and they are described in, for example, JP-A-4-178416 and JP-A-4-178417.

In the present invention, 'macromonomer' denotes a macromolecule having at one terminal two alcoholic hydroxy groups that can make it behave as a monomer.

Examples of the macromonomer having an acidic hydrogen atom that can be used in the first embodiment of the present invention include vinyl polymer system resins such as polyacrylates, polystyrenes, polyvinyl ethers, and polyacrylonitriles. An addition reaction employing a vinyl polymer system can be cited as an example of a macromonomer that can be particularly suitably used, and a macromonomer having two hydroxy groups that is obtained by radical polymerization of an ethylenically unsaturated group-containing monomer is preferable. The explanation below is given taking this macromonomer as an example.

Examples of the ethylenically unsaturated group-containing monomer that is used when producing a macromonomer having two hydroxy groups by radical polymerization of the ethylenically unsaturated group-containing monomer in the first embodiment of the present invention include acrylate esters such as methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, and tetrahydrofurfurylacrylate, aryl acrylates such as phenyl acrylate and furfuryl acrylate, methacrylate esters such as methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, and tetrahydrofurfuryl methacrylate, and aryl methacrylates such as phenyl methacrylate, cresyl methacrylate, and naphthyl methacrylate. There can be further cited, as acrylamides and derivatives thereof, N-alkylacrylamides such as N-methylacrylamide, N-ethylacrylamide, N-propylacrylamide, N-butylacrylamide, N-t-butylacrylamide, N-heptylacrylamide, N-octylacrylamide, N-cyclohexylacrylamide, and N-benzylacrylamide, N-arylacrylamides such as N-phenylacrylamide, N-tolylacrylamide, N-nitrophenylacrylamide, N-naphthylacrylamide, and N-hydroxyphenylacrylamide, N,N-dialkylacrylamides such as N,N-dimethylacrylamide, N,N-diethylacrylamide, N,N-dibutylacrylamide, N,N-diisobutylacrylamide, N,N-diethylhexylacrylamide, and N,N-dicyclohexylacrylamide, N,N-arylacrylamides such as N-methyl-N-phenylacrylamide, N-hydroxyethyl-N-methylacrylamide, N-2-acetamidoethyl-N-acetylacrylamide, as methacrylamides and derivatives thereof, N-alkylmethacrylamides such as N-methylmethacrylamide, N-ethylmethacrylamide, N-propylmethacrylamide, N-butylmethacrylamide, N-t-butylmethacrylamide, N-ethylhexylmethacrylamide, N-hydroxyethylmethacrylamide, and N-cyclohexylmethacrylamide, N-arylmethacrylamides such as N-phenylmethacrylamide and N-naphthylmethacrylamide, N,N-dialkylmethacrylamides such as N,N-diethylmethacrylamide, N,N-dipropylmethacrylamide, and N,N-dibutylmethacrylamide, and N,N-diarylmethacrylamides such as N,N-diphenylmethacrylamide, methacrylamide derivatives such as N-hydroxyethyl-N-methylmethacrylamide, N-methyl-N-phenylmethacrylamide, and N-ethyl-N-phenylmethacrylamide, allyl compounds such as allyl acetate, allyl caproate, allyl caprylate, allyl laurate, allyl palmitate, allyl stearate, allyl benzoate, allyl acetoacetate, allyl lactate, and allyloxyethanol, vinyl ethers such as hexyl vinyl ether, octyl vinyl ether, dodecyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether, vinyl phenyl ether, vinyl tolyl ether, vinyl chlorophenyl ether, vinyl 2,4-dichlorophenyl ether, vinyl naphthyl ether, and vinyl anthranyl ether, vinyl esters such as vinyl butyrate, vinyl isobutyrate, vinyl trimethylacetate, vinyl diethylacetate, vinyl valerate, vinyl caproate, vinyl chloroacetate, vinyl methoxyacetate, vinyl butoxyacetate, vinyl phenylacetate, vinyl acetoacetate, vinyl lactate, vinyl β-phenylbutyrate, vinyl cyclohexylcarboxylate, vinyl benzoate, vinyl salicylate, vinyl chlorobenzoate, vinyl tetrachlorobenzoate, and vinyl naphthoate, styrenes such as methylstyrene, dimethylstyrene, trimethylstyrene, ethylstyrene, diethylstyrene, isopropylstyrene, butylstyrene, hexylstyrene, cyclohexylstyrene, dodecylstyrene, benzylstyrene, chloromethylstyrene, trifluoromethylstyrene, ethoxymethylstyrene, acetoxymethylstyrene, methoxystyrene, 4-methoxy-3-methylstyrene, dimethoxystyrene, chlorostyrene, dichlorostyrene, trichlorostyrene, tetrachlorostyrene, pentachlorostyrene, bromostyrene, dibromostyrene, iodostyrene, fluorostyrene, 2-bromo-4-trifluoromethylstyrene, and 4-fluoro-3-trifluoromethylstyrene, crotonate esters such as butyl crotonate, hexyl crotonate, crotonic acid, and glycerol monocrotonate, dialkyl itaconates such as dimethyl itaconate, diethyl itaconate, and dibutyl itaconate, dialkyl esters of maleic acid or fumaric acid such as dimethyl maleate and dibutyl fumarate, maleimides such as maleimide, N-phenylmaleimide, N-2-methylphenylmaleimide, N-2,6-diethylphenylmaleimide, N-2-chlorophenylmaleimide, N-cyclohexylmaleimide, N-laurylmaleimide, and N-hydroxyphenylmaleimide, and others such as N-vinylpyrrolidone, N-vinylpyridine, acrylonitrile, and methacrylonitrile.

From the viewpoint of development latitude and exposure latitude, the ethylenically unsaturated monomer used when producing a macromonomer having two hydroxy groups obtained by radical polymerization of an ethylenically unsaturated monomer in the first embodiment of the present invention is preferably a monomer having an ethylenically unsaturated group and an acidic hydroxy group- and/or acidic amino group-containing group as an alkali-soluble group.

Examples of the alkali-soluble group- and ethylenically unsaturated group-containing monomer used when producing a macromonomer in the first embodiment of the present invention include a carboxy group- and radically polymerizable unsaturated group-containing monomer such as acrylic acid, methacrylic acid, or 4-vinylbenzoic acid and a radically polymerizable unsaturated group-containing monomer having an acidic hydroxy group, an acidic amide group, an active imide group, a sulfonic acid group, a phosphoric acid group, or a phosphonic acid group. In particular, a phenolic hydroxy group- and radically polymerizable unsaturated group-containing monomer such as N-(4-hydroxyphenyl)methacrylamide, monomethacryloylhydroquinone, o-hydroxystyrene, p-hydroxystyrene, p-isopropenylphenol, or m-isopropenylphenol, a sulfonamide group- and radically polymerizable unsaturated group-containing monomer such as N-(4-sulfamoylphenyl)methacrylamide, N-phenylsulfonylmethacrylamide, or N-phenylsulfonylmaleimide, a sulfonic acid group- and radically polymerizable unsaturated group-containing monomer such as 2-acrylamido-2-methylpropanesulfonic acid, a phosphoric acid group- and radically polymerizable unsaturated group-containing monomer such as 2-methacryloyloxyethyl phosphate, a phosphonic acid group- and radically polymerizable unsaturated group-containing monomer such as vinylphosphonic acid, and an active methylene group- and radically polymerizable unsaturated group-containing monomer described in JP-A-63-127237 are preferably used.

From the viewpoint of interaction with an infrared-absorbing dye, among the acidic hydroxy group and/or the acidic amino group, the alkali-soluble group contained in the graft chain is preferably one having a carboxy group, a sulfonamide group, an active imide group, a sulfonic acid group, a phosphoric acid group, or a phosphonic acid group, more preferably one having a sulfonamide group, an active imide group, a sulfonic acid group, a phosphoric acid group, or a phosphonic acid group and, from the viewpoint of printing durability and production suitability most preferably one having a sulfonamide group.

With regard to these monomers having an acidic hydroxy group and/or an acidic amino group and a radically polymerizable unsaturated bond, one type may be used on its own or a plurality of monomers may be used as a mixture. They may be used as a mixture with a monomer having a radically polymerizable unsaturated bond but not containing the above-mentioned acidic group.

Furthermore, from the viewpoint of printing durability after baking, the ethylenically unsaturated group-containing monomer used when producing a macromonomer having two hydroxy groups by radical polymerization of an ethylenically unsaturated group-containing monomer in the first embodiment of the present invention is preferably a monomer having a thermally crosslinkable group and an ethylenically unsaturated group. Here, being thermally crosslinkable means being thermally curable when heated at 200° C. for 5 minutes.

Specific examples of compounds having a thermally crosslinkable group and an ethylenically unsaturated group include (meth)acrylamides represented by Formula (1) such as N-(hydroxymethyl)acrylamide and N-(butoxymethyl)acrylamide, an ethylenically unsaturated group-containing monomer represented by Formula (2), an ethylenically unsaturated group-containing monomer represented by Formula (3), a urea group- or urethane group- and ethylenically unsaturated group-containing monomer represented by Formula (4), an epoxy group- and ethylenically unsaturated group-containing monomer represented by Formula (5) such as glycidyl methacrylate, an oxetanyl group- and ethylenically unsaturated group-containing monomer represented by Formula (6) such as (3-methyl-3-oxetanyl)methyl methacrylate, and an oxazoline group- and ethylenically unsaturated group-containing monomer represented by Formula (7). From the viewpoint of thermal crosslinkablility, among them a monomer represented by Formula (1), a monomer represented by Formula (4), a monomer represented by Formula (5), and a monomer represented by Formula (6) are preferable, and a monomer represented by Formula (1) and a monomer represented by Formula (4) are more preferable.

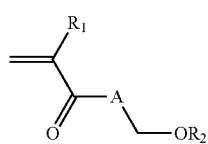

(1)

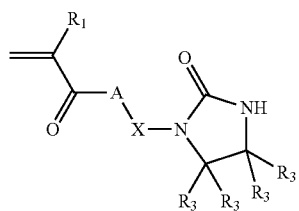

(2)

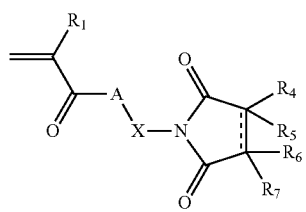

(3)

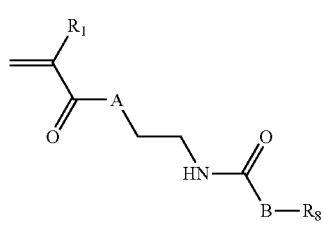

(4)

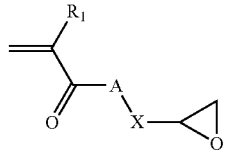

(5)

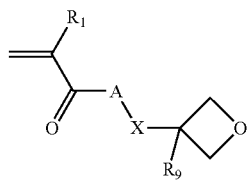

(6)

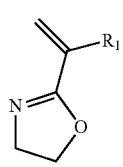

(7)

Substituents in Formulae (1) to (7) are as follows.

$R_1$ denotes a hydrogen atom or $CH_3$, $R_2$ denotes a hydrogen atom or an alkyl group having 1 to 10 carbon atoms, $R_3$ to $R_7$ independently denote a hydrogen atom or an alkyl group having 1 to 10 carbon atoms, two or more of which may be bonded to form a ring structure, and $R_8$ and $R_9$ denote a hydrogen atom, an alkyl group having 1 to 20 carbon atoms, a cycloalkyl group, an alkenyl group, an alkynyl group, or an aryl group. A and B denote —O—, —S—, or —N($R_{10}$)—, $R_{10}$ denotes a hydrogen atom or an alkyl group having 1 to 10 carbon atoms, and X denotes a single bond or a divalent linking group.

As described above, the macromonomer thus obtained preferably has a weight-average molecular weight of 500 to 20,000, more preferably 800 to 15,000, and particularly preferably 800 to 10,000.

Examples of a solvent when producing the macromonomer include ethylene dichloride, cyclohexanone, methyl ethyl ketone, acetone, methanol, ethanol, ethylene glycol monomethyl ether, ethylene glycol monoethyl ether, 2-methoxyethyl acetate, 1-methoxy-2-propanol, 1-ethoxy-2-propanol, 1-methoxy-2-propyl acetate, 1-ethoxy-2-propyl acetate, 2-butanone, N,N-dimethylformamide, N,N-dimethylacetamide, dimethyl sulfoxide, N-methyl-2-pyrrolidone, N-ethyl-2-pyrrolidone, toluene, ethyl acetate, methyl lactate, and ethyl lactate. With regard to these solvents, one type may be used on its own or two or more types may be used as a mixture.

Examples of the mercaptan-based chain transfer agent having two or more hydroxy groups and one mercapto group used when producing a macromonomer used in the first embodiment of the present invention include 3-mercapto-1,2-propanediol, 2-mercapto-1,3-propanediol, 2-mercapto-2-methyl-1,3-propanediol, 2-mercapto-2-ethyl-1,3-propanediol, 2-mercaptoethyl-2-methyl-1,3-propanediol, and 2-mercaptoethyl-2-ethyl-1,3-propanediol.

Ethylenically unsaturated monomers used in synthesis of macromonomers as specific examples MM-1 to MM-42 are listed below. The chemical structures of chain transfer agent C-1 and monomers A-1 to A-11 and O-1 to O-6 used are as described later.

|  | Chain transfer agent | | Monomer used | | | | | | | | | Weight average molecular weight |
|---|---|---|---|---|---|---|---|---|---|---|---|---|
|  | | | Alkali-soluble group | | Thermally crosslinkable group | | Other 1 | | Other 2 | | |
| Macro-monomer | Structure | Amount added (mol %) | Structure | Amount added (mol %) | Structure | Amount added (mol %) | Structure | Amount added (mol %) | Structure | Amount added (mol %) | |
| MM-1 | C-1 | 20 | — | 0 | — | 0 | O-1 | 80 | — | 0 | 1,000 |
| MM-2 | C-1 | 20 | — | 0 | — | 0 | O-2 | 80 | — | 0 | 1,200 |
| MM-3 | C-1 | 20 | — | 0 | — | 0 | O-3 | 80 | — | 0 | 1,400 |
| MM-4 | C-1 | 20 | — | 0 | — | 0 | O-4 | 80 | — | 0 | 1,000 |
| MM-5 | C-1 | 20 | — | 0 | — | 0 | O-5 | 50 | O-6 | 30 | 1,200 |
| MM-6 | C-1 | 20 | A-1 | 80 | — | 0 | — | 0 | — | 0 | 1,500 |
| MM-7 | C-1 | 20 | A-2 | 80 | — | 0 | — | 0 | — | 0 | 800 |
| MM-8 | C-1 | 20 | A-3 | 80 | — | 0 | — | 0 | — | 0 | 800 |
| MM-9 | C-1 | 20 | A-4 | 80 | — | 0 | — | 0 | — | 0 | 1,400 |
| MM-10 | C-1 | 20 | A-5 | 80 | — | 0 | — | 0 | — | 0 | 2,000 |
| MM-11 | C-1 | 11 | A-5 | 89 | — | 0 | — | 0 | — | 0 | 4,000 |
| MM-12 | C-1 | 8 | A-5 | 92 | — | 0 | — | 0 | — | 0 | 5,600 |
| MM-13 | C-1 | 5 | A-5 | 95 | — | 0 | — | 0 | — | 0 | 10,000 |
| MM-14 | C-1 | 20 | A-6 | 80 | — | 0 | — | 0 | — | 0 | 2,000 |
| MM-15 | C-1 | 20 | A-7 | 80 | — | 0 | — | 0 | — | 0 | 2,000 |
| MM-16 | C-1 | 20 | A-8 | 80 | — | 0 | — | 0 | — | 0 | 800 |
| MM-17 | C-1 | 20 | A-9 | 80 | — | 0 | — | 0 | — | 0 | 2,000 |
| MM-18 | C-1 | 20 | A-10 | 80 | — | 0 | — | 0 | — | 0 | 2,000 |
| MM-19 | C-1 | 20 | A-11 | 80 | — | 0 | — | 0 | — | 0 | 1,100 |
| MM-20 | C-1 | 20 | A-2 | 40 | — | 0 | O-5 | 20 | O-6 | 20 | 1,000 |
| MM-21 | C-1 | 20 | A-5 | 40 | — | 0 | O-2 | 40 | — | 0 | 1,700 |
| MM-22 | C-1 | 20 | A-5 | 40 | — | 0 | O-4 | 40 | — | 0 | 1,600 |
| MM-23 | C-1 | 20 | A-5 | 40 | — | 0 | O-5 | 20 | O-6 | 20 | 1,900 |
| MM-24 | C-1 | 20 | A-7 | 40 | — | 0 | O-5 | 20 | O-6 | 20 | 1,900 |
| MM-25 | C-1 | 20 | A-8 | 40 | — | 0 | O-2 | 40 | — | 0 | 1,500 |
| MM-26 | C-1 | 20 | A-8 | 40 | — | 0 | O-5 | 20 | O-6 | 20 | 1,500 |
| MM-27 | C-1 | 20 | A-9 | 40 | — | 0 | O-5 | 20 | O-6 | 20 | 1,600 |
| MM-28 | C-1 | 20 | A-10 | 40 | — | 0 | O-5 | 20 | O-6 | 20 | 1,600 |
| MM-29 | C-1 | 20 | A-11 | 40 | — | 0 | O-5 | 20 | O-6 | 20 | 1,200 |
| MM-30 | C-1 | 20 | — | 0 | B-1 | 80 | — | 0 | — | 0 | 1,100 |
| MM-31 | C-1 | 20 | — | 0 | B-2 | 80 | — | 0 | — | 0 | 1,600 |
| MM-32 | C-1 | 20 | — | 0 | B-3 | 80 | — | 0 | — | 0 | 2,200 |
| MM-33 | C-1 | 20 | — | 0 | B-4 | 80 | — | 0 | — | 0 | 1,900 |
| MM-34 | C-1 | 20 | — | 0 | B-5 | 80 | — | 0 | — | 0 | 2,500 |
| MM-35 | C-1 | 20 | — | 0 | B-6 | 80 | — | 0 | — | 0 | 2,000 |
| MM-36 | C-1 | 20 | — | 0 | B-7 | 80 | — | 0 | — | 0 | 1,200 |
| MM-37 | C-1 | 20 | — | 0 | B-8 | 80 | — | 0 | — | 0 | 1,700 |
| MM-38 | C-1 | 20 | — | 0 | B-9 | 80 | — | 0 | — | 0 | 1,100 |
| MM-39 | C-1 | 20 | A-5 | 40 | B-1 | 40 | — | 0 | — | 0 | 800 |
| MM-40 | C-1 | 20 | A-5 | 40 | B-2 | 40 | — | 0 | — | 0 | 900 |
| MM-41 | C-1 | 20 | A-5 | 40 | B-5 | 40 | — | 0 | — | 0 | 1,500 |
| MM-42 | C-1 | 20 | A-5 | 40 | B-2 | 30 | O-1 | 10 | — | 0 | 800 |

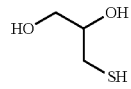

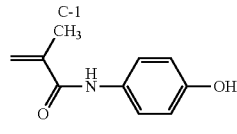

A-1

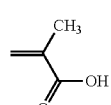

A-2

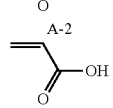

A-3

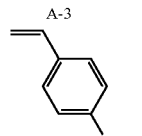

A-4

-continued

| | Monomer used | | | | | | | | | | |
|---|---|---|---|---|---|---|---|---|---|---|---|
| | Chain transfer agent | | Alkali-soluble group | | Thermally crosslinkable group | | Other 1 | | Other 2 | | Weight |
| Macro-monomer | Structure | Amount added (mol %) | Structure | Amount added (mol %) | Structure | Amount added (mol %) | Structure | Amount added (mol %) | Structure | Amount added (mol %) | average molecular weight |

A-5: methacrylamide-C6H4-SO2NH2

A-6: acrylamide-C6H4-SO2NH2

A-7: methacrylamide-SO2-C6H4-CH3

A-8: acrylamide (CH2=CH-C(O)-NH2)

A-9: acrylamide-C(CH3)(CH3)-CH2-SO3H

A-10: methacrylate-O-CH2CH2-O-P(=O)(OH)(OH)

A-11: vinyl phosphonic acid (CH2=CH-P(=O)(OH)(OH))

B-1: acrylamide-N-CH2-OH

B-2: acrylamide-N-CH2-OC4H9

B-3: methacrylate-O-N(phthalimide)

B-4: methacrylate-O-CH2CH2-N(imidazolidinone)

B-5: methacrylate-O-CH2CH2-NH-C(=O)-NH-C6H5

| | | Monomer used | | | | | | | | | |
|---|---|---|---|---|---|---|---|---|---|---|---|
| | Chain transfer agent | | Alkali-soluble group | | Thermally crosslinkable group | | Other 1 | | Other 2 | | Weight |
| Macro-monomer | Structure | Amount added (mol %) | Structure | Amount added (mol %) | Structure | Amount added (mol %) | Structure | Amount added (mol %) | Structure | Amount added (mol %) | average molecular weight |

Structures B-6, B-7, B-8, B-9, O-1, O-2, O-3, O-4, O-5, O-6.

Moreover, examples of the polyurethane having a macromonomer unit in a side chain used in this reaction include those obtained by reacting, as a diol component, a macromonomer obtained by radical polymerization of a monomer having a radically polymerizable unsaturated bond as an essential component in the presence of a mercaptan-based chain transfer agent having two hydroxy groups and one mercapto group with at least one type of diisocyanate compound and as necessary another diol component.

The polyurethane may be produced by various methods. There can be cited, for example, a polyurethane having as a basic skeleton a reaction product of a diisocyanate compound represented by Formula (III) below and a diol compound represented by Formula (I) or (II) below and the above-mentioned macromonomer as a diol component.

$$OCN-R^1-NCO \quad\quad (III)$$

In the formula, $R^1$ denotes a divalent aliphatic or aromatic hydrocarbon that may have a substituent (alkyl, alkenyl, aralkyl, aryl, alkoxy, and halogeno groups are for example preferable). As necessary, $R^1$ may have another functional group that does not react with an isocyanate group such as, for example, an ester, urethane, amide, or ureido group or a carbon-carbon unsaturated bond.

Specifically, the diisocyanate compound represented by Formula (III) includes those below. That is, examples include aromatic diisocyanate compounds such as 2,4-tolylene diisocyanate, 2,4-tolylene diisocyanate dimer, 2,6-tolylene diisocyanate, p-xylylene diisocyanate, m-xylylene diisocyanate, 4,4'-diphenylmethane diisocyanate, 1,5-naphthylene diisocyanate, and 3,3'-dimethylbiphenyl-4,4'-diisocyanate; aliphatic diisocyanate compounds such as hexamethylene diisocyanate, trimethylhexamethylene diisocyanate, lysine diisocyanate, and dimer acid diisocyanate, alicyclic diisocyanate compounds such as isophorone diisocyanate, 4,4'-methylenebis (cyclohexyl isocyanate), methylcyclohexane-2,4- (or 2,6-) diisocyanate, and 1,3-(isocyanatomethyl)cyclohexane; and diisocyanate compounds that are the reaction product of a diol and a diisocyanate, such as for example the adduct of 1 mole of 1,3-butylene glycol and 2 moles of tolylene diisocyanate.

The polyurethane is preferably a reaction product between a diisocyanate and a diol mixture in which a diol compound to which a terminal of the graft chain is bonded via a sulfur atom and an acidic hydrogen atom-containing diol represented by Formula (IV) to (VI) below are combined, and more preferably a reaction product between a diisocyanate and a diol mixture with a carboxy group-containing diol represented by Formula (IV).

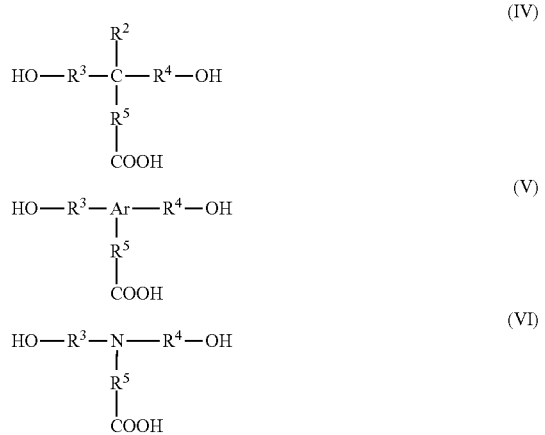

$R^2$ denotes hydrogen atom, an alkyl, alkenyl, aralkyl, aryl, alkoxy, or aryloxy group that may have a substituent (alkyl, aryl, alkoxy, ester, urethane, amide, ureido or halogeno groups are for example preferable.), preferably hydrogen atom, an alkyl group having 1 to 8 carbon atoms, an alkenyl group having 2 to 8 carbon atoms, or an aryl group having 6 to 15 carbon atoms, more preferably an alkyl group having 1 to 4 carbon atoms.

$R^3$, $R^4$ and $R^5$ independently denote single bond, a divalent aliphatic or aromatic hydrocarbon group that may have a substituent (alkyl, alkenyl, aralkyl, aryl, alkoxy or halogeno groups are for example preferable.), preferably an alkylene group having 1 to 20 carbon atoms, or an arylene group having 6 to 15 carbon atoms, more preferably an alkylene group having 1 to 8 carbon atoms, particularly preferably an alkylene group having 1 to 4 carbon atoms.

As necessary, $R^3$, $R^4$ and $R^5$ may have another functional group that does not react with an isocyanate group such as, for example, an ester, urethane, amide, or ureido group or a carbon-carbon unsaturated bond. Two or three of $R^2$, $R^3$, $R^4$ and $R^5$ may be bonded to form a ring structure.

Ar denotes a trivalent aromatic hydrocarbon group that may have a substituent, preferably a trivalent aromatic hydrocarbon group having 6 to 15 carbon atoms.

Furthermore, the polyurethane used in the first embodiment of the present invention preferably has a molecular weight as a weight average (polystyrene standard) of 5,000 to 800,000. The weight-average molecular weight is more preferably 10,000 to 500,000, and particularly preferably 20,000 to 200,000. Here, the dispersity (Mw/Mn) is preferably no greater than 20, more preferably no greater than 16, and particularly preferably no greater than 14. When the molecular weight is in the above-mentioned range, a desired effect can be obtained.

The content of the polyurethane in the photosensitive composition is preferably 1 to 30 wt %, and more preferably 2 to 20 wt % on a solids content basis. The polyurethane in the first embodiment of the present invention is synthesized by adding to the diisocyanate compound and the diol compound in an aprotic solvent a known catalyst having an activity commensurate with the reactivity of the two, and heating.

The molar ratio of the diisocyanate to the diol compound used is preferably 0.8:1 to 1.2:1, and when an isocyanate group remains at the polymer terminal, a treatment with an alcohol or an amine, etc. is carried out, thus finally eliminating the remaining isocyanate group.

The polyurethane in the first embodiment of the present invention may comprise a diol component not containing an alkali-soluble group, and a diol represented by Formula (I) or (II) below can be cited as a component.

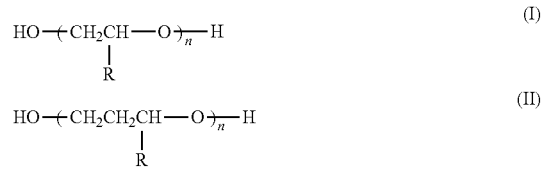

In the formula, the Rs independently denote a hydrogen atom or an alkyl group having 1 to 8 carbon atoms, and n denotes an integer of 2 or greater.

Examples of the alkyl group having 1 to 8 carbon atoms denoted by R include a methyl group, an ethyl group, an i-propyl group, an n-propyl group, an n-butyl group, and an i-butyl group.

Specific examples of diols represented by Formula (I) or (II) above are illustrated below, but the present invention should not be construed as being limited thereto.

Specific Examples of (I)

HO—(CH$_2$CH$_2$O)$_3$—H
HO—(CH$_2$CH$_2$O)$_4$—H
HO—(CH$_2$CH$_2$O)$_6$—H
HO—(CH$_2$CH$_2$O)$_6$—H
HO—(CH$_2$CH$_2$O)$_7$—H
HO—(CH$_2$CH$_2$O)$_8$—H
HO—(CH$_2$CH$_2$O)$_{10}$H
HO—(CH$_2$CH$_2$O)$_{12}$—H
Polyethylene glycol (Mw=1,000)
Polyethylene glycol (Mw=2,000)
Polyethylene glycol (Mw=4,000)

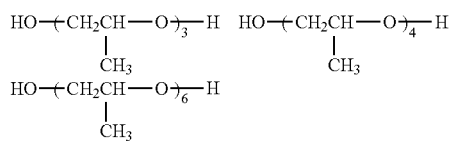

Polypropylene glycol (Mw=1,000)
Polypropylene glycol (Mw=2,000)
Polypropylene glycol (Mw=4,000)
Specific examples of (II)

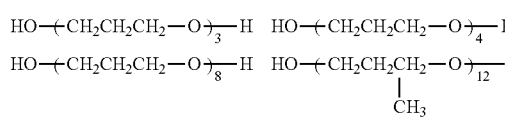

Here, among the copolymerization components of the polyurethane, the weight added of the macromonomer obtained by radical polymerization of a radically polymerizable unsaturated bond-containing monomer as an essential component in the presence of a mercaptan-based chain transfer agent having two hydroxy groups and one mercapto group is preferably at least 5 wt % but no greater than 95 wt %, more preferably at least 20 wt % but no greater than 80 wt %, and particularly preferably at least 40 wt % but no greater than 70 wt %.

As the macromonomer diol obtained by radical polymerization of a radically polymerizable unsaturated bond-containing monomer as an essential component in the presence of a mercaptan-based chain transfer agent having two hydroxy groups and one mercapto group, MM-1 to MM-42 above can be cited as examples.

Among the macromonomers cited, the sulfonamide group-containing macromonomers MM-10 to MM-13 and the sulfonamide group- and thermally crosslinkable group-containing macromonomers MM-40 and MM-41 can be cited as specific preferred examples.

Preferred examples of the diisocyanate component include 2,4-tolylene diisocyanate, 4,4'-diphenylmethane diisocyanate, hexamethylene diisocyanate, isophorone diisocyanate, and a mixture of two or more types thereof.

Preferred examples of the other diol component, which is used in combination, include carboxylic acid group-containing diols such as 2,2-bis(hydroxymethyl)propionic acid and 2,2-bis(hydroxymethyl)butanoic acid, (poly)alkylene glycols such as ethylene glycol, diethylene glycol, tetraethylene glycol, polypropylene glycol 700, and polypropylene glycol 1000, and alkyl diols such as butanediol, hexanediol, and decanediol.

A combination comprising as a diisocyanate component 2,4-tolylene diisocyanate, 4,4'-diphenylmethane diisocyanate, or a mixture thereof and as diol components the above-mentioned macromonomer and a carboxylic acid group-containing diol such as 2,2-bis(hydroxymethyl)propionic acid or 2,2-bis(hydroxymethyl)butanoic acid is more preferable.

As a solvent used when synthesizing the polyurethane, the same solvent as that used when synthesizing the macromonomer may be used.

Specific examples of the polyurethane are shown below.

Among the polyurethanes cited as examples, polyurethanes having a sulfonamide group as in PU-10 to PU-13 and polyurethanes having a sulfonamide group and a thermally crosslinkable group as in PU-40 and PU-41 are preferable.

| Poly-urethane | Diisocyanate component | | Diol component | | Mw |
|---|---|---|---|---|---|
| PU-1  | DI-1 40 | DI-2 10 | MM-1 13  | DO-1 37 | 23,000 |
| PU-2  | DI-1 40 | DI-2 10 | MM-2 13  | DO-1 37 | 20,000 |
| PU-3  | DI-1 40 | DI-2 10 | MM-3 13  | DO-1 37 | 24,000 |
| PU-4  | DI-1 40 | DI-2 10 | MM-4 13  | DO-1 37 | 25,000 |
| PU-5  | DI-1 40 | DI-2 10 | MM-5 13  | DO-1 37 | 30,000 |
| PU-6  | DI-1 40 | DI-2 10 | MM-6 13  | DO-1 37 | 25,000 |
| PU-7  | DI-1 40 | DI-2 10 | MM-7 13  | DO-1 37 | 22,000 |
| PU-8  | DI-1 40 | DI-2 10 | MM-8 13  | DO-1 37 | 23,000 |
| PU-9  | DI-1 40 | DI-2 10 | MM-9 13  | DO-1 37 | 24,000 |
| PU-10 | DI-1 40 | DI-2 10 | MM-10 13 | DO-1 37 | 20,000 |
| PU-11 | DI-1 40 | DI-2 10 | MM-11 13 | DO-1 37 | 25,000 |
| PU-12 | DI-1 40 | DI-2 10 | MM-12 13 | DO-1 37 | 26,000 |
| PU-13 | DI-1 40 | DI-2 10 | MM-13 13 | DO-1 37 | 23,000 |
| PU-14 | DI-1 40 | DI-2 10 | MM-14 13 | DO-1 37 | 24,000 |
| PU-15 | DI-1 40 | DI-2 10 | MM-15 13 | DO-1 37 | 22,000 |
| PU-16 | DI-1 40 | DI-2 10 | MM-16 13 | DO-1 37 | 30000 |
| PU-17 | DI-1 40 | DI-2 10 | MM-17 13 | DO-1 37 | 22,000 |
| PU-18 | DI-1 40 | DI-2 10 | MM-18 13 | DO-1 37 | 23,000 |
| PU-19 | DI-1 40 | DI-2 10 | MM-19 13 | DO-1 37 | 20,000 |
| PU-20 | DI-1 40 | DI-2 10 | MM-20 13 | DO-1 37 | 22,000 |
| PU-21 | DI-1 40 | DI-2 10 | MM-21 13 | DO-1 37 | 21,000 |
| PU-22 | DI-1 40 | DI-2 10 | MM-22 13 | DO-1 37 | 28,000 |
| PU-23 | DI-1 40 | DI-2 10 | MM-23 13 | DO-1 37 | 23,000 |
| PU-24 | DI-1 40 | DI-2 10 | MM-24 13 | DO-1 37 | 25,000 |
| PU-25 | DI-1 40 | DI-2 10 | MM-25 13 | DO-1 37 | 25,000 |
| PU-26 | DI-1 40 | DI-2 10 | MM-26 13 | DO-1 37 | 24,000 |
| PU-27 | DI-1 40 | DI-2 10 | MM-27 13 | DO-1 37 | 26,000 |
| PU-28 | DI-1 40 | DI-2 10 | MM-28 13 | DO-1 37 | 22,000 |
| PU-29 | DI-1 40 | DI-2 10 | MM-29 13 | DO-1 37 | 29,000 |
| PU-30 | DI-1 40 | DI-2 10 | MM-30 13 | DO-1 37 | 20,000 |
| PU-31 | DI-1 40 | DI-2 10 | MM-31 13 | DO-1 37 | 21,000 |
| PU-32 | DI-1 40 | DI-2 10 | MM-32 13 | DO-1 37 | 23,000 |
| PU-33 | DI-1 40 | DI-2 10 | MM-33 13 | DO-1 37 | 24,000 |
| PU-34 | DI-1 40 | DI-2 10 | MM-34 13 | DO-1 37 | 28,000 |
| PU-35 | DI-1 40 | DI-2 10 | MM-35 13 | DO-1 37 | 26,000 |
| PU-36 | DI-1 40 | DI-2 10 | MM-36 13 | DO-1 37 | 34,000 |
| PU-37 | DI-1 40 | DI-2 10 | MM-37 13 | DO-1 37 | 33,000 |
| PU-38 | DI-1 40 | DI-2 10 | MM-38 13 | DO-1 37 | 28,000 |

-continued

| | | | | | | |
|---|---|---|---|---|---|---|
| PU-39 | DI-1 40 | DI-2 10 | MM-39 13 | DO-1 37 | | 21,000 |
| PU-40 | DI-1 40 | DI-2 10 | MM-40 13 | DO-1 37 | | 23,000 |
| PU-41 | DI-1 40 | DI-2 10 | MM-41 13 | DO-1 37 | | 24,000 |
| PU-42 | DI-1 40 | DI-2 10 | MM-42 13 | DO-1 37 | | 24,000 |
| PU-43 | DI-1 50 | | MM-10 13 | DO-1 37 | | 21,000 |
| PU-44 | DI-2 50 | | MM-10 13 | DO-1 37 | | 21,000 |
| PU-45 | DI-3 50 | | MM-10 13 | DO-1 37 | | 23,000 |
| PU-46 | DI-4 50 | | MM-10 13 | DO-1 37 | | 24,000 |
| PU-47 | DI-5 50 | | MM-10 13 | DO-1 37 | | 24,000 |
| PU-48 | DI-6 50 | | MM-10 13 | DO-1 37 | | 21,000 |
| PU-49 | DI-7 50 | | MM-10 13 | DO-1 37 | | 21,000 |
| PU-50 | DI-8 50 | | MM-10 13 | DO-1 37 | | 23,000 |
| PU-51 | DI-1 40 | DI-2 10 | MM-10 5 | DO-1 45 | | 24,000 |
| PU-52 | DI-1 40 | DI-2 10 | MM-10 9 | DO-1 41 | | 24,000 |
| PU-53 | DI-1 40 | DI-2 10 | MM-10 17 | DO-1 33 | | 21,000 |
| PU-54 | DI-1 40 | DI-2 10 | MM-10 21 | DO-1 29 | | 21,000 |
| PU-55 | DI-1 40 | DI-2 10 | MM-10 25 | DO-1 25 | | 23,000 |
| PU-56 | DI-1 40 | DI-2 10 | MM-10 40 | DO-1 10 | | 24,000 |
| PU-57 | DI-1 40 | DI-2 10 | MM-10 50 | | | 24,000 |
| PU-58 | DI-1 40 | DI-2 10 | MM-10 15 | DO-1 30 | DO-2 5 | 21,000 |
| PU-59 | DI-1 40 | DI-2 10 | MM-10 15 | DO-1 30 | DO-3 5 | 29,000 |
| PU-60 | DI-1 40 | DI-2 10 | MM-10 15 | DO-1 30 | DO-4 5 | 28,000 |
| PU-61 | DI-1 40 | DI-2 10 | MM-10 15 | DO-1 30 | DO-5 5 | 29,000 |
| PU-62 | DI-1 40 | DI-2 10 | MM-10 15 | DO-1 30 | DO-6 5 | 20,000 |
| PU-63 | DI-1 40 | DI-2 10 | MM-10 15 | DO-1 30 | DO-7 5 | 22,000 |
| PU-64 | DI-1 40 | DI-2 10 | MM-10 15 | DO-1 30 | DO-8 5 | 23,000 |
| PU-65 | DI-1 40 | DI-2 10 | MM-10 15 | DO-9 35 | | 21,000 |
| PU-66 | DI-1 40 | DI-2 10 | MM-10 15 | DO-1 30 | DO-9 5 | 26,000 |
| PU-67 | DI-1 40 | DI-2 10 | MM-10 15 | DO-1 30 | DO-10 5 | 27,000 |
| PU-68 | DI-1 40 | DI-2 10 | MM-7 5 | DO-1 45 | | 28,000 |
| PU-69 | DI-1 40 | DI-2 10 | MM-7 17 | DO-1 33 | | 22,000 |
| PU-70 | DI-1 40 | DI-2 10 | MM-7 40 | DO-1 10 | | 21,000 |
| PU-71 | DI-1 40 | DI-2 10 | MM-16 5 | DO-1 45 | | 23,000 |
| PU-72 | DI-1 40 | DI-2 10 | MM-16 17 | DO-1 33 | | 20,000 |
| PU-73 | DI-1 40 | DI-2 10 | MM-16 40 | DO-1 10 | | 24,000 |
| PU-74 | DI-1 40 | DI-2 10 | MM-18 5 | DO-1 45 | | 25,000 |
| PU-75 | DH 40 | DI-2 10 | MM-18 17 | DO-1 33 | | 30,000 |
| PU-76 | DI-1 40 | DI-2 10 | MM-18 40 | DO-1 10 | | 25,000 |
| PU-77 | DI-1 40 | DI-2 10 | MM-20 15 | DO-1 30 | DO-2 5 | 22,000 |
| PU-78 | DI-1 40 | DI-2 10 | MM-20 15 | DO-1 30 | DO-3 5 | 23,000 |
| PU-79 | DI-1 40 | DI-2 10 | MM-20 15 | DO-1 30 | DO-4 5 | 24,000 |
| PU-80 | DI-1 40 | DI-2 10 | MM-20 15 | DO-1 30 | DO-5 5 | 20,000 |
| PU-81 | DI-1 40 | DI-2 10 | MM-23 15 | DO-1 30 | DO-6 5 | 25,000 |
| PU-82 | DI-1 40 | DI-2 10 | MM-23 15 | DO-1 30 | DO-7 5 | 26,000 |
| PU-83 | DI-1 40 | DI-2 10 | MM-23 15 | DO-1 30 | DO-8 5 | 23,000 |
| PU-84 | DI-1 40 | DI-2 10 | MM-26 15 | DO-1 30 | DO-2 5 | 24,000 |
| PU-85 | DI-1 40 | DI-2 10 | MM-26 15 | DO-1 30 | DO-3 5 | 22,000 |
| PU-86 | DI-1 40 | DI-2 10 | MM-26 15 | DO-1 30 | DO-4 5 | 30,000 |
| PU-87 | DI-1 40 | DI-2 10 | MM-26 15 | DO-1 30 | DO-5 5 | 22,000 |
| PU-88 | DI-1 40 | DI-2 10 | MM-27 15 | DO-1 30 | DO-6 5 | 23,000 |
| PU-89 | DI-1 40 | DI-2 10 | MM-27 15 | DO-1 30 | DO-7 5 | 20,000 |
| PU-90 | DI-1 40 | DI-2 10 | MM-27 15 | DO-1 30 | DO-8 5 | 22,000 |
| PU-91 | DI-1 40 | DI-2 10 | MM-29 15 | DO-1 30 | DO-2 5 | 21,000 |
| PU-92 | DI-1 40 | DI-2 10 | MM-29 15 | DO-1 30 | DO-3 5 | 28,000 |
| PU-93 | DI-1 40 | DI-2 10 | MM-29 15 | DO-1 30 | DO-4 5 | 23,000 |
| PU-94 | DI-1 40 | DI-2 10 | MM-29 15 | DO-1 30 | DO-5 5 | 25,000 |
| PU-95 | DI-1 40 | DI-2 10 | MM-40 15 | DO-1 30 | DO-6 5 | 25,000 |
| PU-96 | DI-1 40 | DI-2 10 | MM-40 15 | DO-1 30 | DO-7 5 | 24,000 |
| PU-97 | DI-1 40 | DI-2 10 | MM-40 15 | DO-1 30 | DO-8 5 | 26,000 |

DI-1

DI-2

DI-3

DI-4

DI-5

DI-6

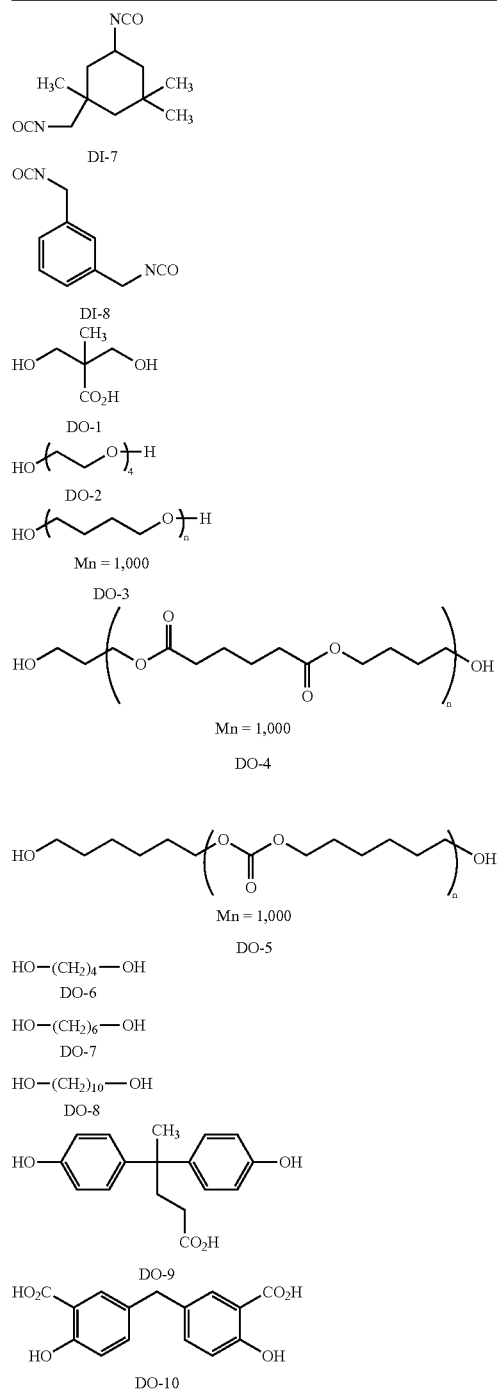

Infrared Absorbing Agent

In the lithographic printing plate precursor of the first embodiment of the present invention, the upper layer and/or the lower layer comprise as a photothermal conversion agent an infrared absorbing agent, that is, an infrared absorbing dye or pigment. Here, the photothermal conversion agent may be used without any restriction on the absorption wavelength region as long as it is a material that absorbs light energy radiation and generates heat, but from the viewpoint of suitability for readily available high-output lasers, an infrared absorbing dye or pigment having an absorption maximum at a wavelength of 760 nm to 1,200 nm can be preferably cited.

The infrared absorbing agent is preferably added to a layer that is far from a support, and it is preferably added to the upper layer rather than to the lower layer.

As the dye, commercial dyes and known dyes described in the literature such as, for example, 'Senryo Binran' (Dye Handbook) (Ed. The Society of Synthetic Organic Chemistry, Japan, 1970) may be used. Specific examples thereof include azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts, metal thiolate complexes, oxonol dyes, diimonium dyes, aminium dyes, and croconium dyes.

Examples of preferred dyes include cyanine dyes described in JP-A-58-125246, JP-A-59-84356, JP-A-59-202829, JP-A-60-78787, etc., methine dyes described in JP-A-58-173696, JP-A-58-181690, JP-A-58-194595, etc., naphthoquinone dyes described in JP-A-58-112793, JP-A-58-224793, JP-A-59-48187, JP-A-59-73996, JP-A-60-52940, JP-A-60-63744, etc., squarylium dyes described in JP-A-58-112792 etc., and cyanine dyes described in British Patent No. 434,875, etc.

Furthermore, there can also be appropriately used near-infrared-absorbing sensitizers described in U.S. Pat. No. 5,156,938 and, moreover, substituted arylbenzo(thio)pyrylium salts described in U.S. Pat. No. 3,881,924, trimethinethiapyrylium salts described in JP-A-57-142645 (U.S. Pat. No. 4,327,169), pyrylium-based compounds described in JP-A-58-181051, JP-A-58-220143, JP-A-59-41363, JP-A-59-84248, JP-A-59-84249, JP-A-59-146063, and JP-A-59-146061, cyanine dyes described in JP-A-59-216146, pentamethinethiopyrylium salts, etc. described in U.S. Pat. No. 4,283,475, and pyrylium compounds, etc. as disclosed in JP-B-5-13514 (JP-B denotes a Japanese examined patent application publication) and JP-B-5-19702.

Furthermore, other examples of preferred dyes include near-infrared-absorbing dyes represented by Formulae (I) and (II) in U.S. Pat. No. 4,756,993.

Among these dyes, particularly preferred examples include cyanine dyes, phthalocyanine dyes, oxonol dyes, squarylium dyes, pyrylium salts, thiopyrylium dyes, and nickel thiolate complexes. Furthermore, compounds described on pages 26 to 38 of JP-A-2005-99685 are preferable since they have excellent photothermal conversion efficiency and, in particular, it is most preferable to use a cyanine dye represented by Formula (a) of JP-A-2005-99685 in a photosensitive composition since high interaction with an alkali soluble resin is obtained and stability and economic efficiency are excellent.

The upper layer, which increases in solubility in aqueous alkali solution upon exposure, is now explained.

In order to form such an upper layer, it is preferable to use a novolac resin.

Preferred examples of the novolac resin used in the first embodiment of the present invention include pyrogallol-acetone resins and novolac resins such as a phenol formaldehyde resin, a m-cresol formaldehyde resin, a p-cresol formaldehyde resin, a mixed m-/p-cresol formaldehyde resin, and a mixed phenol/cresol (any of m-, p-, or mixed m-/p-) formaldehyde resin.

Furthermore, as described in U.S. Pat. No. 4,123,279, a condensation polymer between formaldehyde and a phenol having as a substituent an alkyl group having 3 to 8 carbon atoms, such as a t-butylphenol formaldehyde resin or an octylphenol formaldehyde resin can be cited. The weight-average molecular weight thereof is preferably at least 500, and more preferably 1,000 to 700,000. The number-average molecular weight thereof is preferably at least 500, and more preferably 750 to 650,000. The dispersity (weight-average molecular weight/number-average molecular weight) is preferably 1.1 to 10.

Furthermore, the novolac resin used in the first embodiment of the present invention is preferably at least 50 wt % of the total solids content of the photosensitive layer when an infrared-sensitive photosensitive composition is used in an upper layer of a lithographic printing plate, and with this content an effect of improving printing durability by baking is obtained. The content is more preferably at least 70 wt %, and particularly preferably at least 80 wt %.

Other Additives

When forming the recording layer comprising the lower layer and the upper layer, in addition to the above-mentioned components, various additives may be added as necessary as long as the effects of the present invention are not impaired.

The additives cited below may be added only to the recording layer lower layer (lower layer), only to the uppermost layer (upper layer), or to both layers.

With regard to details of the below-mentioned development accelerator, surfactant, printing-out agent/colorant, plasticizer, wax agent, and a method for forming the recording layer, those described in JP-A-2007-86219 may be referred to.

Development Accelerator

For the purpose of improving the sensitivity, an acid anhydride, a phenol, or an organic acid may be added to the upper layer and/or the lower layer.

The acid anhydride is preferably a cyclic acid anhydride, and specific examples of the cyclic acid anhydride, described in U.S. Pat. No. 4,115,128, include phthalic anhydride, tetrahydrophthalic anhydride, hexahydrophthalic anhydride, 3,6-endooxytetrahydrophthalic anhydride, tetrachlorophthalic anhydride, maleic anhydride, chloromaleic anhydride, α-phenylmaleic anhydride, succinic anhydride, and pyrromellitic anhydride. As an acyclic acid anhydride, acetic anhydride, etc. can be cited.

Examples of the phenol include bisphenol A, 2,2-bishydroxysulfone, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, 4,4',3", 4"-tetrahydroxy-3,5,3',5'-tetramethyltriphenylmethane, etc.

As the organic acid, there are those described in JP-A-60-88942, JP-A-2-96755, etc., and specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid.

The ratio of the acid anhydride, phenol, and organic acid relative to the total solids content of the lower layer or the upper layer is preferably 0.05 to 20 wt %, more preferably 0.1 to 15 wt %, and particularly preferably 0.1 to 10 wt %.

Surfactant

For the purpose of improving the coating properties and enhancing the stability to treatment under development conditions, the upper layer and/or the lower layer may contain a nonionic surfactant described in JP-A-62-251740 and JP-A-3-208514, an amphoteric surfactant described in JP-A-59-121044 and JP-A-4-13149, or a copolymer of a fluorine-containing monomer described in JP-A-62-170950, JP-A-11-288093, and JP-A-2003-057820.

Specific examples of the nonionic surfactant include sorbitan tristearate, sorbitan monopalmitate, sorbitan trioleate, monoglycerol stearate, and polyoxyethylene nonyl phenyl ether.

Specific examples of the amphoteric surfactant include an alkyldi(aminoethyl)glycine, an alkylpolyaminoethylglycine hydrochloride, a 2-alkyl-N-carboxyethyl-N-hydroxyethylimidazolinium betaine, and an N-tetradecyl-N,N-betaine type (e.g. product name 'Amogen K': Dai-Ichi Kogyo Seiyaku Co., Ltd.).

The ratio of the surfactant relative to the total solids content of the lower layer or upper layer is preferably 0.01 to 15 wt %, more preferably 0.01 to 5 wt %, and yet more preferably 0.05 to 2.0 wt %.

Printing-Out Agent/Colorant

The upper layer and/or the lower layer may contain a dye or a pigment as a printing-out agent or an image colorant to immediately form a visible image after the heating caused by exposure.

As a representative example of the printing-out agent, there can be cited a combination of a compound releasing an acid as a result of the heating caused by exposure (photo-acid generator) and a salt-forming organic dye. Examples of the photo-acid generator include an o-naphthoquinonediazido-4-sulfonic acid halogenide, an oxazole-based compound, a triazine-based compound and a trihalomethyl compound.

Furthermore, preferred examples of the photo-acid generator include an onium salt, and more preferred examples include an iodonium salt, a sulfonium salt, and a diazonium salt. Specific examples of the onium salt include diphenyliodonium hexafluorophosphate, triphenylsulfonium hexafluoroantimonate, phenylmethyl-ortho-cyanobenzylsulfonium trifluoromethanesulfonate, 2-methoxy-4-aminophenyldiazonium hexafluorophosphate, and tris(4-chlorophenyl)sulfonium 2-methoxy-4-hydroxy-5-benzoylbenzenesulfonate.

The content of the printing-out agent relative to the total solids content of the lower layer or the upper layer is preferably 0.01 to 50 wt %, more preferably 0.1 to 25 wt %, and yet more preferably 0.5 to 20 wt %.

In addition to the above-mentioned salt-forming organic dyes, another known dye may be used as the colorant. As well as the salt-forming organic dyes, oil-soluble dyes and basic dyes are suitable dyes. There can be specifically cited Oil Yellow #101, Oil Yellow #103, Oil Pink #312, Oil Green BG, Oil Blue BOS, Oil Blue #603, Oil Black BY, Oil Black BS, Oil Black T-505 (the above dyes are manufactured by Orient Kagaku Kogyo K. K.), Victoria Pure Blue, Crystal Violet Lactone, Crystal Violet (CI42555), Methyl Violet (CI42535), Ethyl Violet, Rhodamine B (CI145170B), Malachite Green (CI42000), Methylene Blue (CI52015), etc. Moreover, dyes described in JP-A-62-293247 are particularly preferred.

These dyes are preferably added at a ratio of 0.01 to 10 wt % relative to the total solids content of the lower layer or the upper layer, and more preferably at a ratio of 0.1 to 3 wt %.

Plasticizer

A plasticizer may be added to the upper layer and/or the lower layer in order to impart flexibility, etc. to the coating. Examples thereof include butylphthalyl butylglycolete, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid.

These plasticizers are preferably added at a ratio of 0.5 to 10 wt % relative to the total solids content of the lower layer or the upper layer, and more preferably at a ratio of 1.0 to 5 wt %.

Wax Agent

For the purpose of imparting resistance to scratching, a compound that reduces the coefficient of static friction of the surface may be added to the upper layer. Specific examples thereof include compounds comprising esters of long chain alkylcarboxylic acids, such as those described in U.S. Pat. No. 6,117,913, JP-A-2003-149799, JP-A-2003-302750, or JP-A-2004-12770.

The amount thereof added as a proportion in the upper layer is preferably 0.1 to 10 wt %, and more preferably 0.5 to 5 wt %.

The positive-working lithographic printing plate precursor for infrared laser of the second embodiment of the present invention is explained below.

The positive-working lithographic printing plate precursor for infrared laser of the second embodiment of the present invention comprises, layered sequentially above a support, a lower layer comprising a water-insoluble and alkali-soluble resin and an infrared absorbing agent and an upper layer comprising a sulfonamide group-, active imide group-, and/or amide group-containing graft copolymer, the graft copolymer being a polyurethane resin having as a graft chain an ethylenically unsaturated monomer-derived constitutional unit.

The lower layer comprises a water-insoluble and alkali-soluble resin. In the present invention, being 'water-insoluble' means being insoluble in ion exchanged water that is neutral (pH 7), and being 'alkali-soluble' means being soluble in aqueous alkali solution having a pH of 8.5 to 13.5 in processing with a standard developing time.

In general, a polymer having high durability tends to have lower permeability for a developer and is easily affected by developer activity (insufficient development latitude), and the two fall into a trade-off relationship. On the other hand, the polyurethane resin has a graft structure, and while the high durability of the polyurethane main chain is maintained, the sulfonamide group, active imide group, and/or amide group of the graft portion have high mobility, and the developer easily permeates.

Furthermore, since the lithographic printing plate precursor of the second embodiment of the present invention comprises the polyurethane resin in the upper layer, the dissolution discrimination is excellent.

Moreover, it is surmised that, when the polyurethane resin coexists with an infrared absorbing agent, there is a strong interaction between a group such as a sulfonamide group and the infrared absorbing agent, and since "ON" in an unexposed area (when coating) and "OFF" in an exposed area become more effective, this is also accompanied by further improvement in dissolution discrimination.

Details of the positive-working lithographic printing plate precursor of the second embodiment of the present invention are explained below.

Polyurethane Resin

The positive-working lithographic printing plate precursor for infrared laser of the second embodiment of the present invention comprises a sulfonamide group-, active imide group-, and/or amide group-containing graft copolymer in an upper layer, the graft copolymer being a polyurethane resin having an ethylenically unsaturated monomer-derived constitutional unit as a graft chain. That is, the polyurethane resin contained in the upper layer of the positive-working lithographic printing plate precursor for infrared laser of the second embodiment of the present invention is a polyurethane resin having a polyurethane chain as a main chain and an ethylenically unsaturated monomer-derived constitutional unit as a graft chain, and having a sulfonamide group, active imide group, and/or amide group.

The polyurethane resin may have a sulfonamide group, an active imide group, and/or an amide group either in the graft chain or the polyurethane main chain, and preferably has them in the graft chain.

Furthermore, the active imide group is preferably an imide group having at least one sulfonyl group bonded thereto, more preferably a carbonylsulfonimide group or a disulfonimide group, and yet more preferably a carbonylsulfonimide group.

Furthermore, it is preferable that the sulfonamide group, the active imide group, and the amide group have at least one hydrogen atom on the nitrogen atom, and it is more preferable that all of the groups on the nitrogen atom apart from the carbonyl and sulfonyl groups are hydrogen atoms.

The polyurethane resin preferably has a thermally crosslinkable group.

The polyurethane resin may have the thermally crosslinkable group either in the graft chain or in the polyurethane main chain, but it is preferably in the graft chain.

Examples of the thermally crosslinkable group include an N-hydroxymethyl group, an N-alkoxymethyl group, a urea group, a urethane group, an N-acyloxyphthalimide group, an epoxy group, an oxetanyl group, and an oxazolyl group.

The polyurethane resin used in the second embodiment of the present invention is preferably a polyurethane resin obtained by reacting a polyisocyanate with, as a polyol component, a polymer (a type of macromonomer) obtained by radical polymerization of a specific ethylenically unsaturated monomer (a sulfonamide group-containing ethylenically unsaturated monomer, etc.) in the presence of a mercaptan-based chain transfer agent having two or more hydroxy groups and one mercapto group. Examples of a process for producing such a polyurethane resin include methods described in JP-A-4-178416, JP-A-4-178417, etc.

The specific ethylenically unsaturated monomer is a compound having a sulfonamide group, an active imide group, and/or an amide group and a radically polymerizable unsaturated group. Examples of such a monomer include an amide group- and radically polymerizable unsaturated group-containing monomer such as acrylamide or methacrylamide, a sulfonamide group- and radically polymerizable unsaturated group-containing monomer such as N-(4-sulfamoylphenyl)methacrylamide, N-phenylsulfonylmethacrylamide, or N-phenylsulfonylmaleimide, and an active methylene group- and radically polymerizable unsaturated group-containing monomer described in JP-A-63-127237.

From the viewpoint of printing durability and production suitability, the polyurethane resin is most preferably one having a sulfonamide group.

With regard to these ethylenically unsaturated group-containing monomers, one type thereof may be used on its own or a mixture of a plurality thereof may be used.

Furthermore, the macromonomer may comprise an ethylenically unsaturated monomer other than the specific ethylenically unsaturated monomer as a constituent.

In particular, a monomer having a thermally crosslinking group and an ethylenically unsaturated group is preferable. Specific examples of the compound having a thermally crosslinkable group and an ethylenically unsaturated group include, described above for the first embodiment, (meth)acrylamides represented by Formula (1) such as N-(hydroxymethyl)acrylamide and N-(butoxymethyl)acrylamide, an ethylenically unsaturated group-containing monomer represented by Formula (2), an ethylenically unsaturated group-containing monomer represented by Formula (3), a urea group- or urethane group- and ethylenically unsaturated group-containing monomer represented by Formula (4), an epoxy group- and ethylenically unsaturated group-containing monomer represented by Formula (5) such as glycidyl methacrylate, an oxetanyl group- and ethylenically unsaturated group-containing monomer represented by Formula (6) such as (3-methyl-3-oxetanyl)methyl methacrylate, and an oxazoline group- and ethylenically unsaturated group-containing monomer represented by Formula (7).

Furthermore, examples of a monomer that is copolymerized with the macromonomer include an acrylate ester such as methyl acrylate, an aryl acrylate, a methacrylate ester such as methyl methacrylate, an aryl methacrylate, acrylamide, an N-alkylacrylamide, an allyl compound, a vinyl ether, a vinyl ester, a styrene such as methylstyrene, a crotonate ester, a dialkyl itaconate, a dialkyl ester of maleic acid or fumaric acid such as dimethyl maleate or dibutyl fumarate, a maleimide, N-vinylpyrrolidone, N-vinylpyridine, acrylonitrile, and methacrylonitrile.

Examples of a solvent used when producing the macromonomer include ethylene dichloride, cyclohexanone, methyl ethyl ketone, acetone, methanol, ethanol, ethylene glycol monomethyl ether, ethylene glycol monoethyl glycol, 2-methoxyethyl acetate, 1-methoxy-2-propanol, 1-ethoxy-2-propanol, 1-methoxy-2-propyl acetate, 1-ethoxy-2-propyl acetate, 2-butanone, N,N-dimethylformamide, N,N-dimethylacetamide, dimethyl sulfoxide, N-methyl-2-pyrrolidone, N-ethyl-2-pyrrolidone, toluene, ethyl acetate, methyl lactate, and ethyl lactate. These solvents may be used individually or two or more types may be used as a mixture.

Examples of the mercaptan-based chain transfer agent having two or more hydroxy groups and one mercapto group used when producing the macromonomer include 3-mercapto-1,2-propanediol, 2-mercapto-1,3-propanediol, 2-mercapto-2-methyl-1,3-propanediol, 2-mercapto-2-ethyl-1,3-propanediol, 2-mercaptoethyl-2-methyl-1,3-propanediol, and 2-mercaptoethyl-2-ethyl-1,3-propanediol.

Specific preferred examples of the macromonomer include MM-10 to MM-16, MM-21 to MM-26, and MM-30 to MM-38 above, but needless to say the macromonomer that can be used in the second embodiment of the present invention is not limited thereto.

Among them, particularly preferred examples of the macromonomer include the sulfonamide group-containing macromonomers MM-10 to MM-13 and the sulfonamide group- and thermally crosslinkable group-containing macromonomers MM-31, MM-34, and MM-35.

The weight-average molecular weight (Mw) of the macromonomer thus obtained is not particularly limited, but is preferably at least 500 but no greater than 20,000.

The polyurethane resin is preferably obtained by reacting the macromonomer as a part of the diol component with a diisocyanate and another diol component.

A polyisocyanate compound and a polyol compound other than the macromonomer that can be used in synthesis of the polyurethane resin are not particularly limited, and known compounds may be used.

The polyisocyanate compound is preferably a diisocyanate compound, and more preferably a compound represented by Formula (I) below.

The polyol compound other than the macromonomer is preferably a diol compound. The polyol compound preferably comprises a carboxy group-containing polyol compound, more preferably comprises a carboxy group-containing diol compound, and yet more preferably comprises a compound represented by Formula (II) or Formula (III) below.

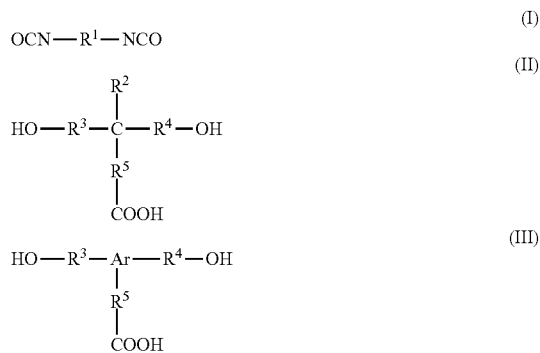

In Formula (I), $R^1$ denotes a divalent linking group. Examples of the divalent linking group include an aliphatic hydrocarbon group, an alicyclic hydrocarbon group, and an aromatic hydrocarbon group, and preferred examples thereof include an alkylene group having 2 to 10 carbon atoms and an arylene group having 6 to 30 carbon atoms. $R^1$ may have another functional group that does not react with an isocyanate group.

In Formula (II), $R^2$ denotes a hydrogen atom, an alkyl group, an aralkyl group, an aryl group, an alkoxy group, or an aryloxy group. Here, $R^2$ may have a substituent.

Preferred examples of $R^2$ include a hydrogen atom, an unsubstituted alkyl group having 1 to 8 carbon atoms, and an unsubstituted aryl group having 6 to 15 carbon atoms.

In Formula (II) or Formula (III), $R^3$, $R^4$, and $R^5$ may be identical to or different from each other and denote a single bond or a divalent linking group. Examples of the divalent linking group include an aliphatic hydrocarbon group and an aromatic hydrocarbon group. Here, $R^3$, $R^4$, and $R^5$ may have a substituent. With regard to $R^3$, $R^4$, and $R^5$, an unsubstituted alkylene group having 1 to 20 carbon atoms and an unsubstituted arylene group having 6 to 15 carbon atoms are preferably cited, and an unsubstituted alkylene group having 1 to 8 carbon atoms is more preferably cited. $R^3$, $R^4$, and $R^5$ may have another functional group that does not react with an isocyanate group.

In Formula (III), Ar denotes an optionally substituted trivalent aromatic hydrocarbon, and is preferably a trivalent aromatic hydrocarbon group having 6 to 15 carbon atoms.

Specific examples of the diisocyanate compound represented by Formula (I) above are listed below, but the present invention should not be construed as being limited thereto.

Examples include aromatic diisocyanate compounds such as 2,4-tolylene diisocyanate, 2,4-tolylene diisocyanate dimer, 2,6-tolylene diisocyanate, p-xylylene diisocyanate, metaxylylene diisocyanate, 4,4'-diphenylmethane diisocyanate, 1,5-naphthylene diisocyanate, and 3,3'-dimethylbiphenyl-4,4'-diisocyanate; aliphatic diisocyanate compounds such as hexamethylene diisocyanate, trimethylhexamethylene diisocyanate, lysine diisocyanate, and dimer acid diisocyanate; alicyclic diisocyanate compounds such as isophorone diisocyanate, 4,4'-methylenebis(cyclohexyl isocyanate), methylcyclohexane-2,4-(or 2,6-) diisocyanate, and 1,3-bis(isocyanatomethyl)cyclohexane, and a reaction product between a diol and a diisocyanate, such as for example the adduct of 1 mole of 1,3-butylene glycol and 2 moles of tolylene diisocyanate. Among them, one having an aromatic ring such as 4,4'-diphenylmethane diisocyanate, xylylene diisocyanate, or tolylene diisocyanate is preferable from the viewpoint of printing durability.

Furthermore, specific examples of the carboxy group-containing diol compound represented by Formula (II) or Formula (III) above are listed below, but the present invention should not be construed as being limited thereto.

Examples include 3,5-dihydroxybenzoic acid, 2,2-bis(hydroxymethyl)propionic acid, 2,2-bis(hydroxyethyl)propionic acid, 2,2-bis(3-hydroxypropyl)propionic acid, 2,2-bis(hydroxymethyl)acetic acid, bis(4-hydroxyphenyl)acetic acid, 4,4-bis(4-hydroxyphenyl)pentanoic acid, and tartaric acid. Among them, from the viewpoint of reactivity with an isocyanate 2,2-bis(hydroxymethyl)propionic acid and 2,2-bis(hydroxyethyl)propionic acid are more preferable.

Specific preferred examples of the polyurethane resin that can be used in the second embodiment of the present invention include the above-mentioned PU-10 to PU-16, PU-21 to PU-26, PU-30 to PU-38, PU-43 to PU-67, PU-71 to PU-73, and PU-81 to PU-87, but needless to say the polyurethane resin is not limited thereto.

Among them, particularly preferred examples of the polyurethane resin include the sulfonamide group-containing polyurethane resins PU-10 to PU-13 and the sulfonamide group- and thermally crosslinkable group-containing polyurethane resins PU-31, PU-34, and PU-35.

As a solvent used when synthesizing the polyurethane resin, the same solvent as that used when synthesizing the macromonomer may be used.

The polyurethane resin is synthesized by adding to the diisocyanate compound and the diol compound in an aprotic solvent a known catalyst having an activity commensurate with the reactivity of the two, and heating. The molar ratio of the diisocyanate to the diol compound used is preferably 0.8:1 to 1.2:1, and when an isocyanate group remains at the polymer terminal, a treatment with an alcohol or an amine, etc. is carried out, thus finally eliminating the remaining isocyanate group.

Among the copolymerization components of the polyurethane resin, the content of the macromonomer is preferably at least 5 wt % but no greater than 95 wt %, more preferably at least 20 wt % but no greater than 80 wt %, and most preferably at least 40 wt % but no greater than 70 wt %.

The molecular weight of the polyurethane that can suitably be used in the second embodiment of the present invention is, as a weight average (polystyrene standard), preferably 5,000 to 800,000, more preferably 10,000 to 500,000, and yet more preferably 20,000 to 100,000. The dispersity (Mw/Mn) is preferably no greater than 20, more preferably no greater than 16, and yet more preferably no greater than 14. When the molecular weight is in the above-mentioned range, a sufficient effect can be obtained and the developability is excellent.

The content of the polyurethane resin in a photosensitive composition used for formation of the upper layer is preferably 1 to 30 wt % on a solids content basis, and more preferably 2 to 20 wt %.

The content of the polyurethane resin contained in the upper layer relative to the total solids content is preferably 2 to 99.5 wt %, more preferably 5 to 99 wt %, and yet more preferably 10 to 98 wt %.

Furthermore, the upper layer in the second embodiment of the present invention may comprise in combination another resin as long as the effects of the present invention are not impaired. Since the upper layer itself is required to exhibit alkali solubility in a non-image area in particular, it is necessary to select a resin that does not impair this property. From this viewpoint, examples of the resin that can be used in combination include a water-insoluble and alkali-soluble resin. Normal water-insoluble and alkali-soluble resins are described in detail below, and among them preferred examples include a polyamide resin, an epoxy resin, a polyacetal resin, an acrylic resin, a methacrylic resin, a polystyrene-based resin, and a novolac type phenol-based resin.

The amount mixed is preferably no greater than 50 wt % relative to the polyurethane resin.

Water-Insoluble and Alkali-Soluble Resin

The lithographic printing plate precursor of the second embodiment of the present invention comprises a water-insoluble and alkali-soluble resin (hereinafter, also called simply an 'alkali-soluble resin') in the lower layer.

The alkali-soluble resin that can be used in the present invention is not particularly limited as long as it has the property of dissolving upon contact with an alkaline developer, and is preferably a homopolymer containing an acidic group in the main chain and/or a side chain of the polymer, a copolymer thereof, or a mixture thereof.

Such an acidic group-containing alkali-soluble resin preferably has a functional group such as a phenolic hydroxy group, a carboxy group, a sulfonic acid group, a phosphoric acid group, a sulfonamide group, or an active imide group, and particularly preferably a sulfonamide group. Therefore, such a resin may be suitably formed by copolymerization of a monomer mixture comprising one or more ethylenically unsaturated monomers containing the above-mentioned functional groups. Preferred examples of the functional group-containing ethylenically unsaturated monomer include acrylic acid, methacrylic acid, a compound represented by the formula below, and a mixture thereof. In the formula below, $R^4$ denotes a hydrogen atom or a methyl group.

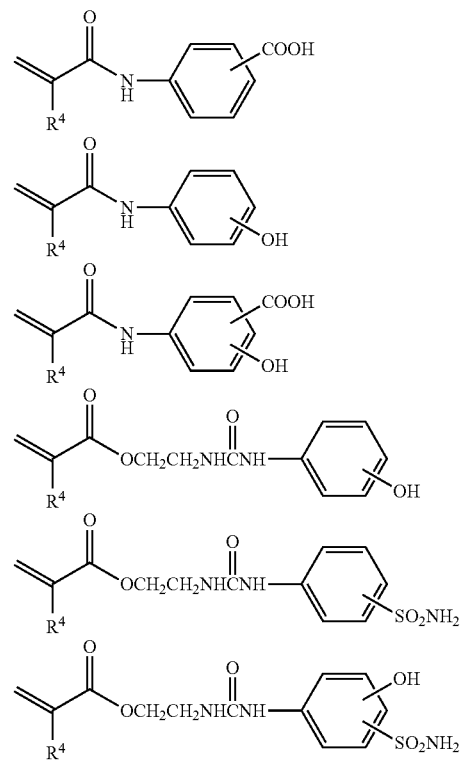

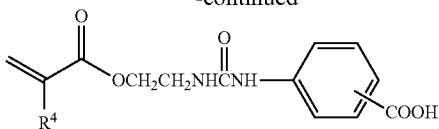

The alkali-soluble resin that can be used in the second embodiment of the present invention is preferably a polymer compound obtained by copolymerizing, in addition to the above-mentioned polymerizable monomer, another polymerizable monomer. With regard to the copolymerization ratio in this case, it is preferable for at least 10 mole % of a monomer that imparts alkali solubility such as a monomer comprising a functional group such as a phenolic hydroxy group, a carboxy group, a sulfonic acid group, a phosphoric acid group, a sulfonamide group, or an active imide group to be contained, and it is more preferable for at least 20 mole % to be contained. When the copolymerization component of the monomer that imparts alkali solubility is at least 10 mole %, sufficient alkali solubility is obtained and developability is excellent.

Examples of the other polymerizable monomer that can be used include the compounds cited below.

Alkyl acrylates and alkyl methacrylates such as methyl acrylate, ethyl acrylate, propyl acrylate, benzyl acrylate, methyl methacrylate, ethyl methacrylate, cyclohexyl methacrylate, and benzyl methacrylate. Aliphatic hydroxy group-containing acrylate esters and methacrylate esters such as 2-hydroxyethyl acrylate and 2-hydroxyethyl methacrylate. Acrylamides and methacrylamides such as acrylamide, methacrylamide, N-methylacrylamide, N-ethylacrylamide, and N-phenylacrylamide. Vinyl esters such as vinyl acetate, vinyl chloroacetate, vinyl butyrate, and vinyl benzoate. Styrenes such as styrene, α-methylstyrene, methylstyrene, and chloromethylstyrene. Nitrogen atom-containing monomers such as N-vinylpyrrolidone, N-vinylpyridine, acrylonitrile, and methacrylonitrile. Maleimides such as N-methylmaleimide, N-ethylmaleimide, N-propylmaleimide, N-butylmaleimide, N-phenylmaleimide, N-2-methylphenylmaleimide, N-2,6-diethylphenylmaleimide, N-2-chlorophenylmaleimide, N-cyclohexylmaleimide, N-laurylmaleimide, and N-hydroxyphenylmaleimide.

Among these other ethylenically unsaturated monomers, a (meth)acrylate ester, a (meth)acrylamide, a maleimide, and (meth)acrylonitrile are suitably used.

Furthermore, as the alkali-soluble resin, a novolac resin can be cited preferably as an example.

Preferred examples of the novolac resin that can be used in the second embodiment of the present invention include pyrogallol acetone resins and novolac resins such as a phenol formaldehyde resin, a m-cresol formaldehyde resin, a p-cresol formaldehyde resin, a mixed m-/p-cresol formaldehyde resin, and a mixed phenol/cresol (any of m-, p-, or mixed m-/p-) formaldehyde resin.

Furthermore, as described in U.S. Pat. No. 4,123,279, a condensation polymer between formaldehyde and a phenol having as a substituent an alkyl group having 3 to 8 carbon atoms such as a t-butylphenol formaldehyde resin or an octylphenol formaldehyde resin can be cited. The weight-average molecular weight (Mw) thereof is preferably at least 500, and more preferably 1,000 to 700,000. The number-average molecular weight (Mn) thereof is preferably at least 500, and more preferably 750 to 650,000. The dispersity (weight-average molecular weight/number-average molecular weight) is preferably 1.1 to 0.10.

The alkali-soluble resin preferably has a weight-average molecular weight of at least 2,000 and a number-average molecular weight of at least 500, and more preferably a weight-average molecular weight of 5,000 to 300,000 and a number-average molecular weight of 800 to 250,000. The alkali-soluble resin preferably has a dispersity (weight-average molecular weight/number-average molecular weight) of 1.1 to 10.

In the lithographic printing plate precursor of the second embodiment of the present invention, with regard to the alkali-soluble resin, one type may be used on its own or two or more types may be used in combination.

With regard to the content of the alkali-soluble resin relative to the total solids content of the lower layer in the second embodiment of the present invention, the amount added is preferably 50 to 98 wt %. When the amount of alkali-soluble resin added is at least 50 wt % the recording layer (photosensitive layer) has excellent durability, and when it is no greater than 98 wt % both sensitivity and durability are excellent.

Infrared Absorbing Agent

The lithographic printing plate precursor of the second embodiment of the present invention comprises an infrared absorbing agent in the lower layer. Adding an infrared absorbing agent to the lower layer gives excellent sensitivity.

Furthermore, the lithographic printing plate precursor of the second embodiment of the present invention preferably further comprises an infrared absorbing agent in the upper layer.

The infrared absorbing agent is not particularly limited as long as it is a dye that absorbs infrared light and generates heat, and various dyes known as infrared absorbing agents may be used.

As the infrared absorbing agent that can be used in the second embodiment of the present invention, commercial dyes and known dyes described in the literature (e.g. 'Senryo Binran (Dye Handbook)', Ed. The Society of Synthetic Organic Chemistry, Japan, 1970). Specific examples thereof include dyes such as azo dyes, metal complex salt azo dyes, pyrazolone azo dyes, anthraquinone dyes, phthalocyanine dyes, carbonium dyes, quinonimine dyes, methine dyes, and cyanine dyes. In the second embodiment of the present invention, among these dyes, one that absorbs at least infrared or near-infrared light is preferable since it is suitable for utilization with a laser that emits infrared or near-infrared light, and a cyanine dye is particularly preferable.

Examples of such a dye that absorbs at least infrared or near-infrared include cyanine dyes described in JP-A-58-125246, JP-A-59-84356, JP-A-59-202829, JP-A-60-78787, etc., methine dyes described in JP-A-58-173696, JP-A-58-181690, JP-A-58-194595, etc., naphthoquinone dyes described in JP-A-58-112793, JP-A-58-224793, JP-A-59-48187, JP-A-59-73996, JP-A-60-52940, JP-A-60-63744, etc., squarylium dyes described in JP-A-58-112792 etc., and cyanine dyes described in British Patent No. 434,875, etc.

Furthermore, as the dyes, there can also be appropriately used near-infrared-absorbing sensitizers described in U.S. Pat. No. 5,156,938 and, moreover, substituted arylbenzo(thio)pyrylium salts described in U.S. Pat. No. 3,881,924, trimethinethiapyrylium salts described in JP-A-57-142645 (U.S. Pat. No. 4,327,169), pyrylium compounds described in JP-A-58-181051, JP-A-58-220143, JP-A-59-41363, JP-A-59-84248, JP-A-59-84249, JP-A-59-146063, and JP-A-59-146061, cyanine dyes described in JP-A-59-216146, pentamethinethiopyrylium salts, etc. described in U.S. Pat. No. 4,283,475, and pyrylium compounds, etc. as disclosed in JP-B-5-13514 and JP-B-5-19702, and as commercially available products, Epolight III-178, Epolight III-130, Epolight III-125, and the like manufactured by Epolin, Inc. are particularly preferably used.

Furthermore, other examples of particularly preferred dyes include near-infrared absorbing dyes denoted by Formulae (I) and (II) in U.S. Pat. No. 4,756,993.

A particularly preferred dye is cyanine dye A below.

Cyanine dye A

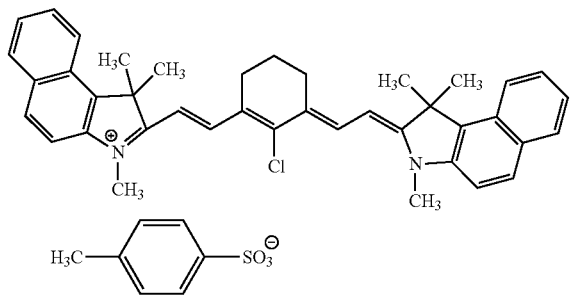

The amount of infrared absorbing agent added to the lower layer is preferably 0.01 to 50 wt % relative to the total solids content of the lower layer, more preferably 0.1 to 30 wt %, and particularly preferably 1.0 to 30 wt %. When the amount added is at least 0.01 wt %, the sensitivity becomes high, and when it is no greater than 50 wt %, the layer uniformity is good and the layer durability is excellent.

Furthermore, it is also preferable to add an infrared absorbing agent to the upper layer separately from the lower layer. The amount of infrared absorbing agent added to the upper layer relative to the total solids content of the upper layer is preferably 0.01 to 50 wt %, more preferably 0.1 to 30 wt %, and particularly preferably 1.0 to 30 wt %. When the amount added is at least 0.01 wt % the sensitivity is excellent, and when it is no greater than 50 wt % the uniformity of the upper part of a recording layer is good and the durability of the upper layer is excellent.

Other Additives

When forming the lower layer and the upper layer, in addition to the above-mentioned essential components, various additives may be added as necessary as long as the effects of the present invention are not impaired. The additives cited below may be added only to the lower layer, only to the upper layer, or to both layers.

Examples of the other additives include a development accelerator, a surfactant, a printing-out agent/colorant, a plasticizer, and a wax agent, and specific examples include those described above. Preferred embodiments of the other additives are the same as the preferred embodiments in the first embodiment.

Formation of Lower Layer and Upper Layer

The lower layer and the upper layer of the lithographic printing plate precursor in the first and second embodiments of the present invention may usually be formed by dissolving the above-mentioned components in a solvent and coating an appropriate support therewith.

Examples of the solvent used here include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, and toluene, but are not limited thereto. These solvents may be used on their own or as a mixture.

The lower layer and the upper layer are in principle preferably formed as two separate layers.

Examples of a method for forming two separate layers include a method in which a difference in solvent solubility between components contained in the lower layer and components contained in the upper layer is utilized and a method in which, after an upper layer is applied, the solvent is rapidly removed by drying.

Details of these methods are described in JP-A-2002-251003.

These methods are described in detail below, but a method for coating as two separate layers is not limited to these methods.

As the method in which a difference in solvent solubility between components contained in the lower layer and components contained in the upper layer is utilized, a solvent system in which all of the components contained in the lower layer are insoluble is used when applying an upper layer coating solution. This enables each layer to be formed in a clearly separated manner even when carrying out two-layer coating. For example, making two layers is possible by selecting as a lower layer component a component that is insoluble in a solvent, such as methyl ethyl ketone or 1-methoxy-2-propanol, that dissolves an alkali-soluble resin, which is an upper layer component, coating and drying the lower layer using a solvent system that dissolves the lower layer component, and subsequently dissolving an upper layer mainly containing an alkali-soluble resin in methyl ethyl ketone, 1-methoxy-2-propanol, etc., followed by coating and drying.

The method for very rapidly drying the solvent after a second layer (upper layer) is applied may be achieved by blowing high-pressure air via a slit nozzle placed at substantially right angles relative to the web travel direction, applying thermal energy as conductive heat from a lower face of a web using a roll having a heating medium such as steam supplied to the interior thereof (heating roll), or combining the above.

In order to impart a new function, the upper layer and the lower layer may proactively be made partially miscible in a range in which the effects of the present invention are sufficiently exhibited. As a method for carrying out the above, in the method utilizing a difference in solvent solubility and in the method in which the solvent is very rapidly dried after coating with a second layer, it may be carried out by adjusting the extent of the difference or the extent of the rapid drying.

The concentration of the components, excluding solvent, in a lower layer/upper layer coating solution (the total solids content including additives) with which a support is coated is preferably 1 to 50 wt %.

As a method for coating, various methods may be used, and examples thereof include bar coater coating, spin coating, spray coating, curtain coating, dip coating, air knife coating, blade coating, and roll coating.

In particular, the upper layer coating method is preferably a non-contact method since it can prevent damage to the lower layer when applying the upper layer. Furthermore, although it is a contact method, it is possible to use bar coater coating as a method that is normally used for solvent system coating, and it is preferable to carry out coating in direct roll drive mode in order to prevent damage to the lower layer.

The dry coat weight of the lower layer component applied onto the support of the lithographic printing plate precursor in the first and second embodiments of the present invention is preferably in the range of 0.5 to 4.0 g/m$^2$, and more preferably in the range of 0.6 to 2.5 g/m$^2$. When it is at least 0.5 g/m$^2$, printing durability is excellent, and when it is no greater than 4.0 g/m², image reproduction and sensitivity are excellent.

The dry coat weight of the upper layer component is preferably in the range of 0.05 to 1.0 g/m², and more preferably in the range of 0.08 to 0.7 g/m². When it is at least 0.05 g/m² the development latitude and scratch resistance are excellent, and when it is no greater than 1.0 g/m² the sensitivity is excellent.

The dry coat weight of the lower layer and the upper layer in total is preferably in the range of 0.6 to 4.0 g/m², and more preferably in the range of 0.7 to 2.5 g/m². When it is at least 0.6 g/m² the printing durability is excellent, and when it is no greater than 4.0 g/m² the image reproduction and the sensitivity are excellent.

Support

A support used in the lithographic printing plate precursor of the first and second embodiments of the present invention is not particularly limited as long as it is a plate-shaped material having the required strength and durability and dimensional stability, and examples thereof include paper, paper laminated with a plastic (e.g. polyethylene, polypropylene, polystyrene, etc.), a metal plate (e.g. aluminum, zinc, copper, etc.), a plastic film (e.g. cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinylacetal, etc.), and paper or a plastic film laminated or vapor-deposited with the above-mentioned metal.

Among them, in the first and second embodiments of the present invention, a polyester film and an aluminum plate are preferable, and an aluminum plate, which has good dimensional stability and is relatively inexpensive, is particularly preferable. A desirable aluminum plate is a pure aluminum plate or an alloy plate containing aluminum as a main component and a trace amount of another element, or may be a plastic film laminated or vapor-deposited with aluminum. Examples of the other element contained in the aluminum alloy include silicon, iron, manganese, copper, magnesium, chromium, zinc, bismuth, nickel, and titanium. The content of the other element in the alloy is preferably no greater than 10 wt %.

A particularly desirable aluminum in the first and second embodiments of the present invention is pure aluminum, but since it is difficult to produce completely pure aluminum in terms of refining techniques, it may contain a trace amount of another element.

Such an aluminum plate applied to the first and second embodiments of the present invention is not specified in terms of composition, and an aluminum plate formed from a conventionally known, widely used material may appropriately be used. The aluminum plate used in the first and second embodiments of the present invention preferably has a thickness of 0.1 to 0.6 mm, more preferably 0.15 to 0.4 mm, and particularly preferably 0.2 to 0.3 mm.

Such an aluminum plate may be subjected as necessary to a surface treatment such as a surface roughening treatment or an anodizing process. These surface treatments are briefly explained below.

Prior to roughening the surface of the aluminum plate, if desired, a degreasing treatment with, for example, a surfactant, an organic solvent, or an aqueous alkaline solution is carried out in order to remove rolling oil from the surface. The treatment to roughen the surface of the aluminum plate may be carried out by various methods such as, for example, a method involving mechanical roughening, a method involving electrochemical dissolution-roughening of the surface, and a method involving selective chemical dissolution of the surface. With regard to the mechanical method, a known method such as a ball grinding method, a brush grinding method, a blast grinding method, or a buff grinding method can be employed. With regard to the electrochemical roughening method, there is a method in which alternating current or direct current is used in a hydrochloric acid or nitric acid electrolytic solution. As disclosed in JP-A-54-63902, a method in which the two are combined can also be employed.

The aluminum plate whose surface has been thus roughened is subjected to an alkali etching treatment and a neutralization treatment as necessary and then, if desired, to an anodizing treatment in order to improve the water retention and the abrasion resistance of the surface. With regard to the electrolyte used for the anodizing treatment of the aluminum plate, various electrolytes for forming a porous oxide coating can be used and, in general, sulfuric acid, phosphoric acid, oxalic acid, chromic acid, or a mixture of these acids is used. The concentration of the electrolyte is determined according to the type of electrolyte as appropriate.

The conditions for the anodizing treatment depend on the type of electrolyte used and cannot, as a rule, be fixed but in general an electrolyte solution concentration of 1 to 80 wt %, a solution temperature of 5° C. to 70° C., a current density of 5 to 60 A/dm², a voltage of 1 to 100 V, and an electrolysis time of 10 sec to 5 min are preferable. The amount of anodized coating is preferably no greater than 1.0 g/m². When it is no greater than 1.0 g/m², the printing durability is excellent, the non-image areas of the lithographic printing plate become resistant to scratching, and the so-called 'scratch staining', which is caused by ink becoming attached to scratched areas during printing, can be suppressed.

After being subjected to the anodizing treatment, the surface of the aluminum is subjected as necessary to a treatment to hydrophilize the surface.

With regard to the hydrophilization treatment employed in the first and second embodiments of the present invention, there are methods employing an alkali metal silicate (for example, an aqueous solution of sodium silicate) as disclosed in U.S. Pat. Nos. 2,714,066, 3,181,461, 3,280,734, and 3,902,734. In these methods, the support is immersed in an aqueous solution of sodium silicate or subjected to electrolysis. It is also possible to employ a method involving treatment with potassium fluorozirconate as disclosed in JP-B-36-22063, or with polyvinylphosphonic acid as disclosed in U.S. Pat. Nos. 3,276,868, 4,153,461, and 4,689,272.

Undercoat Layer

The lithographic printing plate precursor of the first and second embodiments of the present invention comprises two layers, that is, the lower layer and the upper layer, layered above a support, and an undercoat layer may be provided as necessary between the support and the lower layer.

As undercoat layer components, various organic compounds having a low or high molecular weight may be used, and preferred examples thereof include carboxymethylcellulose, dextrin, gum arabic, an amino group-containing phosphonic acid such as 2-aminoethylphosphonic acid, an optionally substituted organic phosphonic acid such as phenylphosphonic acid, naphthylphosphonic acid, an alkylphosphonic acid, glycerophosphonic acid, methylenediphosphonic acid, or ethylenediphosphonic acid, an optionally substituted organic phosphoric acid such as phenylphosphoric acid, naphthylphosphoric acid, an alkylphosphoric acid, or glycerophosphoric acid, an optionally substituted organic phosphinic acid such as phenylphosphinic acid, naphthylphosphinic acid, an alkylphosphinic acid, or glycerophosphinic acid, an amino acid such as glycine or β-alanine, and a hydroxy group-containing amine hydrochloride such as triethanolamine hydrochloride. A copolymer of 4-vinylphenylmethyl(triethyl)ammonium chloride and 4-vinylbenzoic acid can also be cited as a preferred example. With regard to these undercoat layer components, one type may be used on its own or two or more types may be used as a mixture.

This organic undercoat layer may be provided by the following methods. That is, there is a method in which a solution formed by dissolving the above-mentioned organic compound in water, an organic solvent such as methanol, ethanol, or methyl ethyl ketone, or a mixed solvent thereof is applied onto an aluminum plate and dried or a method in which an aluminum plate is immersed in a solution formed by dissolving the above-mentioned organic compound in water, an organic solvent such as methanol, ethanol, or methyl ethyl ketone, or a mixed solvent thereof so as to make the above-mentioned compound adsorb thereon, followed by washing with water, etc. and drying to provide an organic undercoat layer. In the former method, a solution of the above-mentioned organic compound at a concentration of 0.005 to 10 wt % may be applied by various methods. In the latter method, the concentration of the solution is preferably 0.01 to 20 wt %, and more preferably 0.05 to 5 wt %, the immersion temperature is preferably 20° C. to 90° C., and more preferably 25° C. to 50° C., and the immersion time is preferably 0.1 sec. to 20 min., and more preferably 2 sec. to 1 min. With regard to the solution used therefor, its pH may be adjusted by a basic substance such as ammonia, triethylamine, or potassium hydroxide, or an acidic substance such as hydrochloric acid or phosphoric acid so that the pH is in the range of 1 to 12. A yellow dye may be added for the purpose of improving the tone reproduction properties of the image recording material.

The coverage of the organic undercoat layer is preferably 2 to 200 mg/m$^2$, and more preferably 5 to 100 mg/m$^2$. When the coverage is in the above-mentioned range, sufficient printing durability can be obtained.

The lithographic printing plate precursor produced above is imagewise exposed and then developed.

Backcoat Layer

The reverse face of the support (the face of the support opposite to the face where there is a recording layer) of the lithographic printing plate precursor in the first and second embodiments of the present invention is provided with a backcoat layer as necessary. As such a backcoat layer, a coating layer comprising an organic polymer compound described in JP-A-5-45885 or a coating layer comprising a metal oxide obtained by hydrolysis and polycondensation of an organic or inorganic metal compound described in JP-A-6-35174 is preferably used. Among these coating layers, use of a silicon alkoxy compound such as $Si(OCH_3)_4$, $Si(OC_2H_5)_4$, $Si(OC_3H_7)_4$, or $Si(OC_4H_9)_4$ is particularly preferable since starting materials are inexpensive and readily available and the metal oxide coating layer obtained therefrom has excellent developer resistance.

The lithographic printing plate precursors of the first and second embodiments of the present invention preferably have provided a 0.1 to 5 μm thick backcoat layer comprising an organic polymer.

Furthermore, in the first and second embodiments of the present invention, when the polyurethane and the infrared absorbing agent are contained in one layer, compared with the case of a straight-chain polyurethane, the difference between "ON" in an unexposed area in a coated state and "OFF" in an area exposed to infrared becomes more effective due to interaction between the polyurethane and the infrared absorbing agent by virtue of the high mobility of the graft chain, and it is surmised that this is also accompanied by an improvement in dissolution latitude.

It is surmised that, since the "ON" and "OFF" are more apparent when an alkali-soluble group is present, in particular when a specific structure containing an acidic hydroxy group and/or an acidic secondary amino group is present, there is a contribution from hydrogen bonding between the infrared absorbing agent and the acidic group. When a sulfonamide group is introduced into a graft copolymer as the alkali-soluble group, multilayer coating suitability is particularly improved due to the high polarity thereof.

Process for Making Lithographic Printing Plate

The process for making a lithographic printing plate of the present invention preferably comprises, in order, an exposure step of imagewise exposing the positive-working lithographic printing plate precursor for infrared laser of the first and second embodiments of the present invention and a development step of carrying out development using a developer.

The lithographic printing plate of the present invention is a lithographic printing plate obtained by the process for making a lithographic printing plate of the present invention.

Exposure Step

The process for making a lithographic printing plate of the present invention preferably comprises an exposure step of imagewise exposing the positive-working lithographic printing plate precursor for infrared laser of the first and second embodiments of the present invention using an infrared laser.

The actinic radiation light source used for imagewise exposure of the lithographic printing plate precursor of the present invention is preferably a light source having an emission wavelength in the near-infrared to infrared region, and is more preferably a solid-state laser or a semiconductor laser. Among them, in the present invention, it is particularly preferable to carry out imagewise exposure using a solid-state laser or semiconductor laser that emits infrared radiation having a wavelength of 750 to 1,400 nm.

The laser output is preferably at least 100 mW, and in order to shorten the exposure time it is preferable to use a multi-beam laser device. It is also preferable for the exposure time per pixel to be within 20 μsec.

The energy with which a lithographic printing plate precursor is irradiated is preferably 10 to 300 mJ/cm$^2$. When in this range, curing progresses sufficiently, laser ablation can be suppressed, and damage to an image can be prevented.

Exposure in the present invention may be carried out by making light beams of the light source overlap. Overlap means that the sub-scanning pitch width is smaller than the beam diameter. When the beam diameter is expressed as a full width half maximum (FWHM) of the beam intensity, the overlap may be expressed quantitatively using for example FWHM/sub-scanning pitch width (overlap factor). In the present invention, this overlap factor is preferably at least 0.1.

The scanning method of the light source of exposure equipment that can be used in the present invention is not particularly limited, and a cylinder outer face scanning method, a cylinder inner face scanning method, a flat face scanning method, etc. may be used. The light source channel may be single channel or multi channel, but in the case of the cylinder outer face method multi channel is preferably used.

Development Step

The process for making a lithographic printing plate of the present invention preferably comprises a development step of carrying out development using a developer.

The developer (hereinafter, also called a 'processing solution') used in the development step is preferably an aqueous solution having a pH of 6 to 13.5, more preferably an aqueous alkali solution having a pH of 8.5 to 13.5, and particularly preferably an aqueous alkali solution having a pH of 8.5 to 10.8. The developer preferably comprises a surfactant, and more preferably at least an anionic surfactant or a nonionic surfactant. The surfactant contributes to improvement of processability.

The surfactant used in the developer may be any of anionic, nonionic, cationic, and amphoteric surfactants.

Examples of the anionic surfactant include a fatty acid salt, an abietic acid salt, a hydroxyalkanesulfonic acid salt, an alkanesulfonic acid salt, a dialkylsulfosuccinic acid salt, a straight-chain alkylbenzenesulfonic acid salt, a branched alkylbenzenesulfonic acid salt, an alkylnaphthalenesulfonic acid salt, an alkylphenoxypolyoxyethylene propylsulfonic acid salt, a polyoxyethylene alkylsulfophenyl ether salt, sodium N-methyl-N-oleyltaurine, a disodium N-alkylsulfosuccinic acid monoamide, a petroleum sulfonic acid salt, sulfated castor oil, sulfated tallow oil, a sulfate ester of a fatty acid alkyl ester, an alkylsulfate ester, a polyoxyethylene alkyl ether sulfate ester, a fatty acid monoglyceride sulfate ester, a polyoxyethylene alkylphenyl ether sulfate ester, a polyoxyethylene styrylphenyl ether sulfate ester, an alkyl phosphate ester, a polyoxyethylene alkyl ether phosphate ester, a polyoxyethylene alkylphenyl ether phosphate ester, a partially saponified styrene-maleic anhydride copolymer, a partially saponified olefin-maleic anhydride copolymer, a naphthalenesulfonic acid salt formalin condensate, an aromatic sulfonic acid salt, and an aromatic substituted polyoxyethylenesulfonic acid salt. Among them, a dialkylsulfosuccinic acid salt, an alkylsulfate ester, and an alkylnaphthalenesulfonic acid salt are particularly preferably used.

The cationic surfactant is not particularly limited, and a conventionally known cationic surfactant may be used. Examples thereof include an alkylamine salt, a quaternary ammonium salt, a polyoxyethylene alkylamine salt, and a polyethylene polyamine derivative.

Examples of the nonionic surfactant include a polyethylene glycol type higher alcohol ethylene oxide adduct, an alkylphenol ethylene oxide adduct, an aromatic compound polyethylene glycol adduct, a fatty acid ethylene oxide adduct, a polyhydric alcohol fatty acid ester ethylene oxide adduct, a higher alkylamine ethylene oxide adduct, a fatty acid amide ethylene oxide adduct, an ethylene oxide adduct of an oil or fat, a polypropylene glycol ethylene oxide adduct, a dimethylsiloxane-ethylene oxide block copolymer, a dimethylsiloxane-(propylene oxide-ethylene oxide) block copolymer, a polyhydric alcohol type glycerol fatty acid ester, a pentaerythritol fatty acid ester, sorbitol and sorbitan fatty acid esters, a sucrose fatty acid ester, a polyhydric alcohol alkyl ether, and an alkanolamine fatty acid amide.

In the present invention, a sorbitol and/or sorbitan fatty acid ester ethylene oxide adduct, a polypropylene glycol ethylene oxide adduct, a dimethylsiloxane-ethylene oxide block copolymer, a dimethylsiloxane-(propylene oxide-ethylene oxide) block copolymer, a polyhydric alcohol fatty acid ester, and an aromatic compound polyethylene glycol adduct are preferable.

Furthermore, from the viewpoint of stable solubility in water and turbidity, the HLB value is preferably at least 6, and more preferably at least 8.

As is well known in the surfactant field, an amphoteric surfactant is a compound having an anionic portion and a cationic portion in a single molecule, and includes amphoteric surfactants of the amino acid type, betaine type, amine oxide type, etc.

As the amphoteric surfactant that can be used in the developer, a compound represented by Formula <1> below and a compound represented by Formula <2> below are preferable.

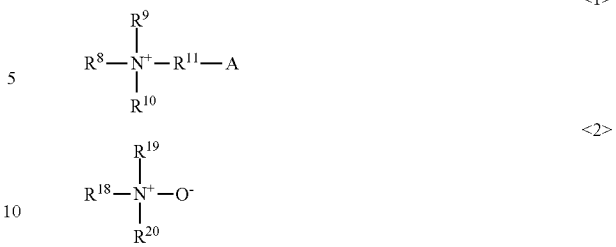

In Formula <1>, $R^8$ denotes an alkyl group, $R^9$ and $R^{10}$ independently denote a hydrogen atom or an alkyl group, $R^{11}$ denotes an alkylene group, and A denotes a carboxylic acid ion or a sulfonic acid ion.

In Formula <2>, $R^{18}$, $R^{19}$, and $R^{20}$ independently denote a hydrogen atom or an alkyl group, but not all of $R^{18}$, $R^{19}$, and $R^{20}$ are hydrogen atoms.

In Formula <1> above, the alkyl group denoted by $R^8$, $R^9$, or $R^{10}$ and the alkylene group denoted by $R^{11}$ may be straight chain or branched chain, may have a linking group in the chain, and may further have a substituent. As the linking group, one containing a hetero atom, such as an ester bond, an amide bond, or an ether bond is preferable. Furthermore, as the substituent a hydroxy group, an ethylene oxide group, a phenyl group, an amide group, a halogen atom, etc. are preferable.

In the compound represented by Formula <1>, the sum total of the carbon atoms of $R^8$ to $R^{11}$ is preferably 8 to 25, and more preferably 11 to 21. When in this range, a hydrophobic portion is appropriate, and the solubility in an aqueous developer is excellent.

Furthermore, by adding an organic solvent such as an alcohol as a dissolution adjuvant, the solubility of the surfactant in an aqueous developer can be improved.

In Formula <2> above, the alkyl group denoted by $R^{18}$, $R^{19}$, or $R^{20}$ may be straight chain or branched chain, may have a linking group in the chain, and may further have a substituent. As the linking group, one containing a hetero atom, such as an ester bond, an amide bond, or an ether bond is preferable. Furthermore, as the substituent a hydroxy group, an ethylene oxide group, a phenyl group, an amide group, a halogen atom, etc. are preferable.

In the compound represented by Formula <2>, the sum total of the carbon atoms of $R^{18}$ to $R^{20}$ is preferably 8 to 22, and more preferably 10 to 20. When in this range, a hydrophobic portion is appropriate, and the solubility in an aqueous developer is excellent.

The total number of carbon atoms of the amphoteric surfactant can depend on the properties of a material used in the photosensitive layer, in particular a binder. In the case of a highly hydrophilic binder, one in which the total number of carbon atoms is relatively small is preferable, and when the binder used has a low degree of hydrophilicity one in which the total number of carbon atoms is large tends to be preferable.

Preferred specific examples of the amphoteric surfactant that can be used in the developer are listed below, but the present invention is not limited thereto.

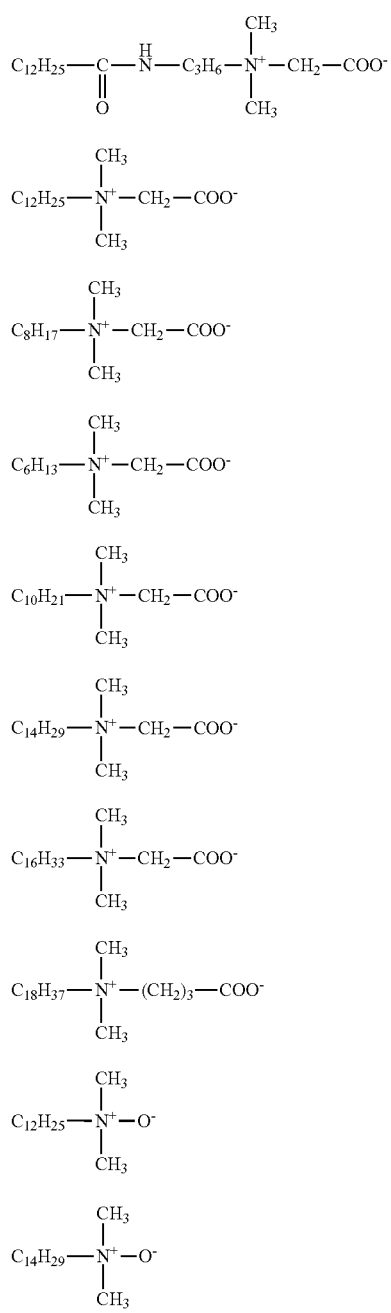

The surfactant used in the developer is more preferably an anionic surfactant, and particularly preferably an anionic surfactant containing a sulfonic acid or a sulfonate.

The surfactant may be used singly or in combination.

The content of the surfactant in the developer is preferably 0.01 to 10 wt %, and more preferably 0.01 to 5 wt %.

In order to maintain the pH of the developer at 6 to 13.5, the presence of carbonate ion and bicarbonate ion as a buffer agent enables variation in pH to be suppressed even when the developer is used for a long period of time, thus suppressing degradation in developability due to variation in pH, the occurrence of development residue, etc. In order to make carbonate ion and bicarbonate ion be present in the developer, a carbonate salt and a bicarbonate salt may be added to the developer, or carbonate ion and bicarbonate ion may be formed by adjusting the pH after a carbonate salt or a bicarbonate salt is added. The carbonate salt and the bicarbonate salt are not particularly limited, but an alkali metal salt is preferable. As the alkali metal, lithium, sodium, and potassium can be cited, and sodium is particularly preferable. They may be used singly or in a combination of two or more types.

The pH of the developer is not particularly limited as long as development is possible, but it is preferably in the range of 8.5 to 10.8.

The total amount of carbonate and bicarbonate salts relative to the total weight of the developer is preferably 0.3 to 20 wt %, more preferably 0.5 to 10 wt %, and particularly preferably 1 to 5 wt %. When the total amount is at least 0.3 wt % developability and processability do not degrade; when it is no greater than 20 wt % it becomes difficult for a precipitate and crystals to form and, furthermore, it becomes difficult for a gel to form when neutralizing during developer waste solution processing, and no problems are caused in waste solution processing.

In order to finely adjust the alkali concentration or assist dissolution of a non-image area photosensitive layer, another alkali agent such as for example an organic alkali agent may be supplementarily used. Examples of the organic alkali agent include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and tetramethylammonium hydroxide. These other alkali agents may be used singly or in a combination of two or more types.

The developer may comprise, in addition to the above-mentioned compound, a wetting agent, a preservative, a chelating compound, an antifoaming agent, an organic acid, an organic solvent, an inorganic acid, an inorganic salt, etc. However, it is preferable not to add a water-soluble polymer compound since the surface of the plate easily becomes tacky, particularly when the developer is exhausted.

As the wetting agent, ethylene glycol, propylene glycol, triethylene glycol, butylene glycol, hexylene glycol, diethylene glycol, dipropylene glycol, glycerol, trimethylolpropane, diglycerol, etc. are suitably used. The wetting agent may be used singly or in a combination of two or more types. The wetting agent is preferably used in an amount of 0.1 to 5 wt % relative to the total weight of the developer.

As the preservative, for example, phenol or a derivative thereof, formalin, an imidazole derivative, sodium dehydroacetate, a 4-isothiazolin-3-one derivative, benzisothiazolin-3-one, 2-methyl-4-isothiazolin-3-one, a benzotriazole derivative, an amidinoguanidine derivative, a quaternary ammonium salt, a pyridine derivative, a quinoline derivative, a guanidine derivative, diazine, a triazole derivative, oxazole, an oxazine derivative, or a nitrobromoalcohol such as 2-bromo-2-nitropropane-1,3-diol, 1,1-dibromo-1-nitro-2-ethanol, or 1,1-dibromo-1-nitro-2-propanol is preferably used. It is preferable to use at least two types of preservatives in combination so as to exhibit efficacy toward various types of molds and microbes. The amount of preservative added is an amount that exhibits stable efficacy toward bacteria, molds, yeasts, etc., and depends on the type of bacteria, molds, or yeasts, but is preferably in the range of 0.01 to 4 wt % relative to the total weight of the developer.

As the chelating compound there can be cited, for example, ethylenediaminetetraacetic acid, the potassium salt thereof, or the sodium salt thereof; diethylenetriaminepentaacetic acid, the potassium salt thereof, or the sodium salt thereof; triethylenetetraminehexaacetic acid, the potassium salt thereof, or the sodium salt thereof; hydroxyethylethylenediaminetriacetic acid, the potassium salt thereof, or the sodium salt thereof; nitrilotriacetic acid or the sodium salt thereof; an organic phosphonic acid, for example, 1-hydroxyethane-1,1-diphosphonic acid, the potassium salt thereof, or the sodium salt thereof; or aminotri(methylenephosphonic acid), the potassium salt thereof, or the sodium salt thereof; or a phosphonoalkanetricarboxylic acid. An organic amine salt is also effective instead of the sodium salt or potassium salt of the chelating compound. As the chelating agent, one that is present stably in the developer composition and does not inhibit printing properties is selected. The amount thereof added is suitably 0.001 to 1.0 wt % relative to the total weight of the developer.

As the antifoaming agent, a normal silicone-based self emulsifying type, emulsifying type, nonionic, etc. compound may be used, and a compound having an HLB of no greater than 5 is preferable. A silicone antifoaming agent is preferable. Among them, an emulsifying dispersion type and solubilizing type may be used. The content of the antifoaming agent is suitably in the range of 0.001 to 1.0 wt % relative to the total weight of the developer.

As the organic acid, for example, citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid, and an organic phosphonic acid can be cited. The organic acid may also be used in the form of an alkali metal salt or an ammonium salt. The content of the organic acid relative to the total weight of the developer is preferably 0.01 to 0.5 wt %.

Examples of the organic solvent include an aliphatic hydrocarbon (e.g. hexane, heptane, Isopar E, H, G (Esso Chemical Co., Ltd.), gasoline, or kerosene), an aromatic hydrocarbon (e.g. toluene or xylene), a halogenated hydrocarbon (e.g. methylene dichloride, ethylene dichloride, triclene, or monochlorobenzene), and a polar solvent.

Examples of the polar solvent include alcohols (methanol, ethanol, propanol, isopropanol, benzyl alcohol, ethylene glycol monomethyl ether, 2-ethoxyethanol, etc.), ketones (methyl ethyl ketone, cyclohexanone, etc.), esters (ethyl acetate, methyl lactate, propylene glycol monomethyl ether acetate, etc.), and others (triethyl phosphate, tricresyl phosphate, N-phenylethanolamine, N-phenyldiethanolamine, etc.).

Furthermore, when the organic solvent is insoluble in water, it may be employed by being solubilized in water using a surfactant, etc. In the case where the developer contains an organic solvent, the concentration of the organic solvent is preferably less than 40 wt % from the viewpoint of safety and inflammability.

As the inorganic acid and the inorganic salt, for example, phosphoric acid, metaphosphoric acid, monoammonium phosphate, diammonium phosphate, monosodium phosphate, disodium phosphate, monopotassium phosphate, dipotassium phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate, and nickel sulfate can be cited. The content of the inorganic salt relative to the total weight of the developer is preferably 0.01 to 0.5 wt %.

The development temperature is not particularly limited as long as development is possible, but is preferably no greater than 60° C., and more preferably 15° C. to 40° C. In development processing using an automatic processor, since the developer might be exhausted depending on the amount processed, the processing performance may be recovered by use of a replenisher or fresh developer. As one example of development and post-development treatments, there is a method in which alkali development is carried out, the alkali is removed by a water washing post-step, a gumming treatment is carried out in a gumming step, and drying is carried out in a drying step. As another example, a method in which a water washing pre-step, a development step, and a gumming step are carried out at the same time using an aqueous solution containing carbonate ions, bicarbonate ions, and a surfactant can be cited as a preferred example. It is therefore preferable to carry out a drying step after carrying out a water washing pre-step, a development step, and a gumming step by the use of one solution and, furthermore, with one bath, without particularly carrying out a water washing pre-step. It is preferable to carry out drying subsequent to removal of extra developer using a squeegee roller, etc. after development.

The development step is preferably carried out by an automatic processor equipped with a rubbing member. As the automatic processor there can be cited an automatic processor described in JP-A-2-220061 and JP-A-60-59351 in which a lithographic printing plate precursor after imagewise exposure is subjected to a rubbing treatment while being transported, and an automatic processor described in U.S. Pat. Nos. 5,148,746 and 5,568,768 and GB Patent No. 2,297,719 in which a lithographic printing plate precursor after imagewise exposure is placed on a cylinder and subjected to a rubbing treatment while rotating the cylinder. Among them, an automatic processor using a rotating brush roller as the rubbing member is particularly preferable.

The rotating brush roller used in the present invention may be appropriately selected by taking account, for example, of the scratch resistance of the image area and the robustness of the support of the lithographic printing plate precursor. As the rotating brush roller, a known rotating brush roller produced by implanting a brush material in a plastic or metal roller may be used. For example, a rotating brush roller described in JP-A-58-159533 and JP-A-3-100554, or a brush roller described in JU-B-62-167253 (JU-B denotes a Japanese examined utility model application publication), in which a metal or plastic groove-shaped member having implanted in rows therein a brush material is closely radially wrapped around a plastic or metal roller acting as a core, may be used.

As the brush material, a plastic fiber (for example, a polyester-based synthetic fiber such as polyethylene terephthalate or polybutylene terephthalate; a polyamide-based synthetic fiber such as nylon 6,6 or nylon 6,10; a polyacrylic synthetic fiber such as polyacrylonitrile or a polyalkyl (meth)acrylate; or a polyolefin-based synthetic fiber such as polypropylene or polystyrene) may be used. For example, a brush material having a fiber bristle diameter of 20 to 400 μm and a bristle length of 5 to 30 mm may preferably be used.

The outer diameter of the rotating brush roller is preferably 30 to 200 mm, and the peripheral speed at the tip of the brush rubbing the plate surface is preferably 0.1 to 5 m/sec. Furthermore, it is preferable to use a plurality of rotating brush rollers.

The direction of rotation of the rotating brush roller with respect to the transport direction of the lithographic printing plate precursor may be the same direction or the opposite direction, but when two or more rotating brush rollers are used, it is preferable that at least one rotating brush roller rotates in the same direction and at least one rotating brush roller rotates in the opposite direction. By such an arrangement, the photosensitive layer in the non-image area can be more reliably removed. Furthermore, swinging the rotating brush roller in the rotational axis direction of the brush roller is also effective.

It is preferable to carry out a drying step continuously or discontinuously after the development step. Drying may be carried out using hot air, infrared, far-infrared, etc.

One example of the structure of an automatic processor suitably used in the process for making a lithographic printing plate of the present invention is schematically illustrated in FIG. 1. The automatic processor shown in FIG. 1 basically comprises a developing section 6 and a drying section 10, and a lithographic printing plate precursor 4 is subjected to developing and gumming in a development tank 20 and drying in the drying section 10.

Furthermore, for the purpose of improving printing durability, etc., the printing plate after development may be heated under very severe conditions. The heating temperature is preferably in the range of 200° C. to 500° C. When the temperature is low, a sufficient image strengthening effect cannot be obtained, and when it is too high, there might be problems such as degradation of the support or thermal decomposition of the image area.

The lithographic printing plate thus obtained is set in an offset printer, and suitably used for printing of a large number of sheets.

In accordance with the present invention, there can be provided a positive-working lithographic printing plate precursor for infrared laser having excellent development latitude, dissolution discrimination, and printing durability and having little post-exposure degradation in developability over time, and a process for making a lithographic printing plate employing the positive-working lithographic printing plate precursor for infrared laser.

EXAMPLES

The present invention is explained in detail below by reference to Examples, but the present invention should not be construed as being limited thereto. Macromonomers (MM-1 to MM-41) and polyurethane resins (PU-1 to PU-97) are those having the structures described above.

Synthetic Examples

Synthesis of Macromonomer (MM-10)

A 1 L three-necked flask equipped with a condenser and a stirrer was charged with 139.55 g of N-(4-sulfamoylphenyl) methacrylamide, 470 g of N,N-dimethylacetamide, and 15.70 g of thioglycerol (Wako Pure Chemical Industries, Ltd.), and heating and stirring were carried out at 80° C. for 1 hour under a flow of nitrogen (50 mL/min). 1.337 g of V-601 (radical polymerization initiator: Wako Pure Chemical Industries, Ltd.) was added to this reaction mixture, stirring was carried out at 80° C. for 2 hours, a further 1.337 g of V-601 (radical polymerization initiator: Wako Pure Chemical Industries, Ltd.) was added to this reaction mixture, and stirring was carried out at 90° C. for 2 hours. The reaction mixture was cooled to room temperature, thus giving the target substance (MM-10). The target substance was confirmed using an NMR spectrum, an IR spectrum, and GPC (polystyrene basis). Here, the MM-10 was used in the following reaction without further purification, etc.

MM-1 to MM-9 and MM-11 to MM-41 could be synthesized in the same manner.

Synthetic Example of Polyurethane (PU-10)

A 300 mL three-necked flask equipped with a condenser and a stirrer was charged with 80.52 g of the MM-10 reaction mixture obtained above and 6.86 g of 2,2-bis(hydroxymethyl)propionic acid (Tokyo Chemical Industry Co., Ltd.), and the reaction mixture was set at 50° C., thus giving a uniform solution. 14.43 g of Millionate MT (Nippon Polyurethane Industry Co., Ltd.), 2.51 g of 2,4-tolylene diisocyanate (Tokyo Chemical Industry Co., Ltd.), and 0.13 g of Neostann U-600 (Nitto Kasei Co., Ltd.: bismuth catalyst) were added in that order, and a reaction was carried out at 80° C. for 4 hours. The reaction mixture was poured into 1.5 L of water, thus making the polyurethane precipitate. This was filtered, washed, and dried, thus giving a binder polymer (PU-10). The target substance was confirmed using an NMR spectrum, an IR spectrum, and GPC (polystyrene basis).

PU-1 to PU-9 and PU-11 to PU-97 could be synthesized in the same manner.

Examples 1-1 to 1-37, Comparative Examples 1-1 and 1-2, and Reference Example 1-1

Preparation of Support

The surface of a JIS A 1050 aluminum sheet was subjected to graining by means of a rotating nylon brush using a pumice-water suspension as an abrasive. Here, the surface roughness (center line average roughness) was 0.5 μm. After washing with water, the sheet was immersed in a 10% sodium hydroxide aqueous solution, that had been heated to 70° C., and subjected to etching so that the amount of aluminum dissolved was 6 g/m$^3$. After washing with water, the sheet was immersed in a 30% nitric acid aqueous solution for 1 min so as to carry out neutralization, and washed well with water. Subsequently, it was subjected to electrolytic roughening for 20 sec in a 0.7% nitric acid aqueous solution using a rectangular alternating waveform voltage with a voltage of 13 V for the anode and a voltage of 6 V for the cathode, immersed in a 20% sulfuric acid solution at 50° C. so as to wash the surface, and then washed with water. The roughened aluminum sheet was subjected to formation of a porous anodized coating using direct current in a 20% sulfuric acid aqueous solution. Electrolysis was carried out at an electric current density of 5 A/dm$^2$, and a substrate having on the surface an anodized coating with a weight of 4.0 g/m$^2$ was formed by controlling the electrolysis time. This substrate was treated for 10 sec in a vapor chamber that had been saturated at 100° C. and 1 atm, thus giving a substrate (a) with a sealing ratio of 60%. The substrate (a) was subjected to a surface hydrophilization treatment using a 2.5 wt % aqueous solution of sodium silicate at 30° C. for 10 sec and then coated with undercoat solution 1 described below, and the coating was dried at 80° C. for 15 sec, thus giving a lithographic printing plate support [A]. The dried coating coverage was 15 mg/m$^2$.

Undercoat Solution 1

| | |
|---|---|
| Copolymer below having a weight-average molecular weight (Mw) of 28,000 | 0.3 g |
| Methanol | 100 g |
| Water | 1 g |

-continued

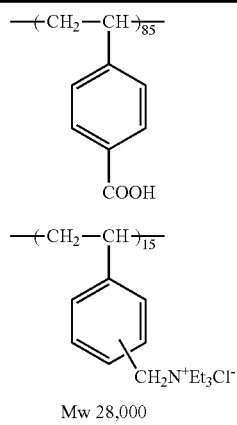

Mw 28,000

Formation of Recording Layer

The undercoated support [A] thus obtained was provided with a lower layer by coating it with photosensitive liquid I having the composition below using a wire bar and drying in a drying oven at 150° C. for 40 sec so as to give a coat weight of 0.8 g/m². After the lower layer was provided, an upper layer was provided by coating with photosensitive liquid II having the composition below using a wire bar. After coating, drying was carried out at 150° C. for 40 sec, thus giving a positive-working lithographic printing plate precursor for infrared laser having a total coat weight for the lower layer and the upper layer of 1.0 g/m².

Photosensitive Liquid I

| | |
|---|---|
| Polyurethane (compound of Table 1) | 3.5 g |
| Infrared absorbing agent (compound of Table 1) | 0.25 g |
| Bisphenolsulfone | 0.3 g |
| Tetrahydrophthalic anhydride | 0.4 g |
| Dye in which the counteranion of Ethyl Violet was 6-hydroxy-β-naphthalenesulfonic acid ion | 0.15 g |
| Fluorine-based surfactant (Megafac F-780, DIC Corporation) | 0.02 g |
| γ-Butyrolactone | 20 g |
| Methyl ethyl ketone | 60 g |
| 1-Methoxy-2-propanol | 20 g |

Photosensitive Liquid II

| | |
|---|---|
| Novolac resin (m-cresol/p-cresol/phenol = 3/2/5, Mw 8,000) | 1.7 g |
| Infrared absorbing agent (IR dye (1) below) | 0.15 g |
| Compound Q below | 0.35 g |
| Fluorine-based surfactant (Megafac F-780, manufacturer as above) | 0.03 g |
| Copolymer of tridecafluorooctyl methacrylate/2-adamantyl acrylate/2-carboxyethyl methacrylate = 30/50/20 with a weight-average molecular weight of 30,000 | 0.1 g |
| Acrylic resin (polymer A below) | 0.3 g |
| Methyl ethyl ketone | 33.0 g |
| 1-Methoxy-2-propanol | 67.0 g |

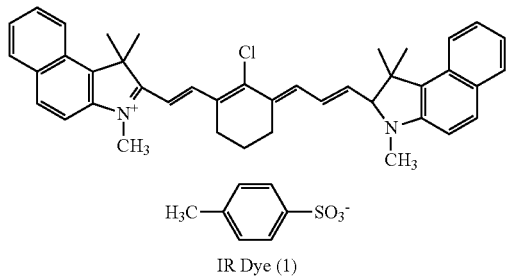

IR Dye (1)

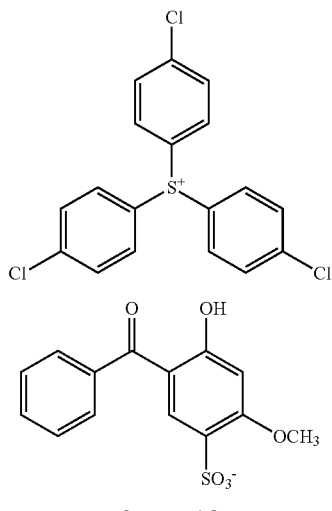

Compound Q

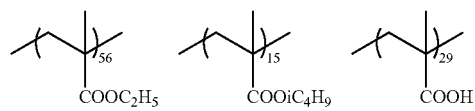
Polymer A
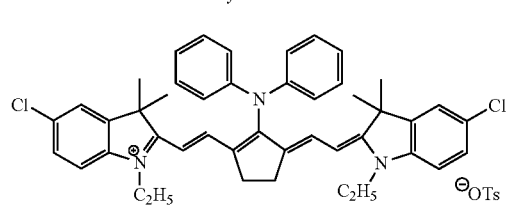
IR Dye (2)
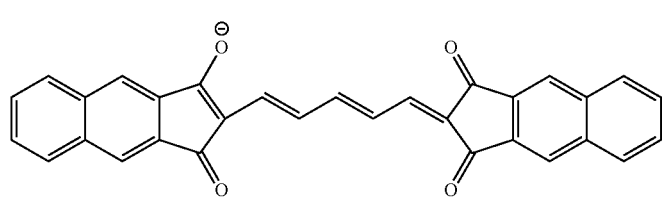
IR Dye (3)
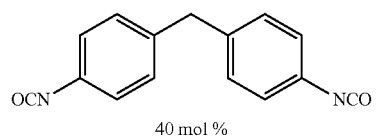
40 mol %
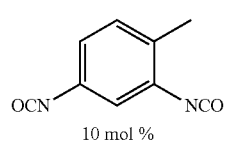
10 mol %
Mw = 25000
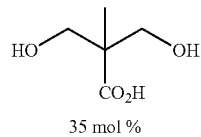
35 mol %
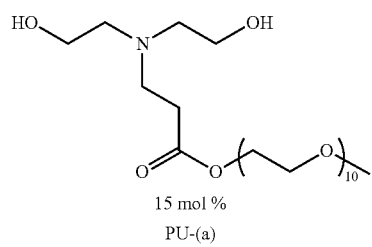
15 mol %
PU-(a)
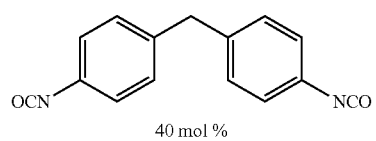
40 mol %

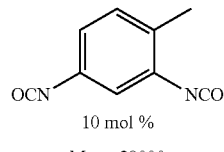

10 mol %

Mw = 28000

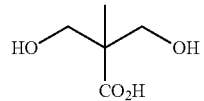

50 mol %

REF-1

REF-2: copolymer of N-phenylmaleimide/methacrylamide/methacrylic acid = 45/35/20 (molar ratio) (weight-average molecular weight 50,000)

Evaluation of Printing Durability

A test pattern was written imagewise on the lithographic printing plate precursor using a Trendsetter manufactured by Creo while changing the exposure energy. Subsequently, it was developed using an LP940H PS processor manufactured by Fujifilm charged with DT-2 developer (diluted so as to have an electrical conductivity of 43 mS/cm) manufactured by Fujifilm at a development temperature of 30° C. for a development time of 12 sec. This was used for continuous printing using a Lithron printer manufactured by Komori Corporation. The number of sheets that could be printed with sufficient ink density was visually measured, and the printing durability was evaluated. The printing durability was expressed as a relative value when the number for the printing durability of Comparative Example 1-1 was defined as 1.0.

Evaluation of Development Latitude

A test pattern was written imagewise on the lithographic printing plate precursor using a Trendsetter 3244VX manufactured by Creo at a beam intensity of 9 W and a drum rotational speed of 150 rpm. Subsequently, it was developed at a liquid temperature of 30° C. for a development time of 22 sec using a 900H PS processor manufactured by Fujifilm charged with alkali developer having the composition below for which the electrical conductivity had been varied by changing the dilution ratio by changing the amount of water. In this process, the difference between the highest electrical conductivity and the lowest electrical conductivity of the developer that enabled good development to be carried out without the image area being dissolved and without causing stains or coloration due to residual photosensitive layer as a result of incomplete development was evaluated as the development latitude.

The results are given in Table 1.

Evaluation of Sensitivity

A test pattern was written on the lithographic printing plate precursor using a Trendsetter 3244VFS manufactured by Creo while changing the exposure energy. Subsequently, development was carried out using an alkali developer having an electrical conductivity at the midpoint (average value) between the highest electrical conductivity and the lowest electrical conductivity of the developer that enabled good development to be carried out without the image area being dissolved and without causing stains or coloration due to residual photosensitive layer as a result of incomplete development in the above-mentioned evaluation of development latitude, and the exposure (beam intensity when drum rotational speed was 160 rpm) at which a non-image area could be developed using this developer was measured and defined as the sensitivity. The smaller this value, the higher the sensitivity. The results are given in Table 1.

Evaluation of Change in Post-Exposure Sensitivity Over Time

Evaluation was carried out in the same manner as for the above-mentioned sensitivity evaluation except that after exposure the precursor was stored at 25° C. with a relative humidity of 70% for 1 hour. The result of the above-mentioned sensitivity evaluation was stored as the sensitivity immediately after exposure, and the extent of decrease in sensitivity was used as an index. The results are given in Table 1. The values in Table 1 denote sensitivity 1 hour after exposure, and when this value was close to the sensitivity immediately after exposure the evaluation was that the change in post-exposure sensitivity over time was good.

Evaluation of Chemical Resistance

A lithographic printing plate precursor of an Example was subjected to exposure, development, and printing in the same manner as in the above-mentioned printing durability evaluation. A step in which the plate face was wiped with a cleaner (Multicleaner, Fujifilm) each time after 5,000 sheets were printed was added, and the chemical resistance was evaluated. When this printing durability was at least 95% but no greater than 100% of the above-mentioned number of sheets for printing durability it was evaluated as Excellent, at least 80% but less than 95% as Good, at least 60% but less than 80% as Fair, and less than 60% as Poor. When the step of wiping the plate face using a cleaner was added, the smaller the change in the number of sheets for printing durability, the better the chemical resistance. The results are given in Table 1.

Developer

| | |
|---|---|
| D-Sorbitol | 2.5 wt % |
| Sodium hydroxide | 0.85 wt % |
| Polyethylene glycol lauryl ether (weight-average molecular weight 1,000) | 0.5 wt % |
| Water | 96.15 wt % |

Samples of Examples 1-2 to 1-37, Comparative Examples 1-1 and 1-2, and Reference Example 1-1 were prepared by changing the polyurethane and the infrared-absorbing dye of Example 1-1 as shown in Table 1.

TABLE 1

| | Material in photosensitive liquid | | Printing durability | Development latitude | | | Sensitivity (W) | Post-exposure sensitivity | Chemical resistance |
|---|---|---|---|---|---|---|---|---|---|
| | Polyurethane | IR dye | | Upper limit (mS/cm) | Lower limit (mS/cm) | Δ (mS/cm) | | | |
| Example 1-1 | PU-1 | IR dye (1) | 1.0 | 80 | 70 | 10 | 5.0 | 5.3 | Fair |
| Example 1-2 | PU-5 | IR dye (1) | 1.1 | 80 | 70 | 10 | 5.0 | 5.3 | Fair |
| Example 1-3 | PU-6 | IR dye (1) | 1.0 | 80 | 68 | 12 | 5.0 | 5.3 | Fair |
| Example 1-4 | PU-7 | IR dye (1) | 1.0 | 78 | 64 | 14 | 4.8 | 5.3 | Fair |
| Example 1-5 | PU-9 | IR dye (1) | 1.0 | 77 | 63 | 14 | 4.8 | 5.3 | Fair |
| Example 1-6 | PU-10 | IR dye (1) | 1.2 | 77 | 60 | 17 | 4.6 | 5.0 | Excellent |
| Example 1-7 | PU-11 | IR dye (1) | 1.3 | 77 | 60 | 17 | 4.5 | 4.7 | Excellent |
| Example 1-8 | PU-12 | IR dye (1) | 1.4 | 77 | 60 | 17 | 4.5 | 4.7 | Excellent |
| Example 1-9 | PU-13 | IR dye (1) | 1.4 | 77 | 60 | 17 | 4.6 | 4.8 | Excellent |
| Example 1-10 | PU-14 | IR dye (1) | 1.2 | 77 | 60 | 17 | 4.6 | 5.0 | Excellent |
| Example 1-11 | PU-15 | IR dye (1) | 1.2 | 77 | 60 | 17 | 4.6 | 5.0 | Excellent |
| Example 1-12 | PU-16 | IR dye (1) | 1.1 | 78 | 63 | 15 | 5.0 | 5.3 | Good |
| Example 1-13 | PU-17 | IR dye (1) | 1.0 | 80 | 65 | 15 | 4.7 | 5.0 | Good |
| Example 1-14 | PU-18 | IR dye (1) | 1.2 | 80 | 65 | 15 | 4.7 | 5.0 | Good |
| Example 1-15 | PU-19 | IR dye (1) | 1.2 | 80 | 65 | 15 | 4.7 | 5.0 | Good |
| Example 1-16 | PU-20 | IR dye (1) | 1.1 | 78 | 65 | 13 | 5.0 | 5.5 | Good |
| Example 1-17 | PU-23 | IR dye (1) | 1.3 | 77 | 60 | 17 | 4.9 | 5.3 | Excellent |
| Example 1-18 | PU-26 | IR dye (1) | 1.2 | 78 | 64 | 14 | 5.0 | 5.4 | Good |
| Example 1-19 | PU-28 | IR dye (1) | 1.3 | 80 | 65 | 15 | 4.8 | 5.1 | Good |
| Example 1-20 | PU-29 | IR dye (1) | 1.3 | 80 | 65 | 15 | 4.8 | 5.1 | Good |
| Example 1-21 | PU-10 | IR dye (2) | 1.1 | 77 | 62 | 15 | 4.6 | 5.0 | Excellent |
| Example 1-22 | PU-10 | IR dye (3) | 1.0 | 77 | 62 | 15 | 4.6 | 5.1 | Excellent |
| Example 1-23 | PU-43 | IR dye (1) | 1.3 | 77 | 60 | 17 | 4.6 | 5.0 | Excellent |
| Example 1-24 | PU-44 | IR dye (1) | 1.0 | 76 | 59 | 17 | 4.5 | 5.0 | Excellent |
| Example 1-25 | PU-45 | IR dye (1) | 1.0 | 76 | 59 | 17 | 4.5 | 5.0 | Excellent |
| Example 1-26 | PU-46 | IR dye (1) | 1.0 | 76 | 59 | 17 | 4.5 | 5.0 | Excellent |
| Example 1-27 | PU-47 | IR dye (1) | 1.0 | 76 | 59 | 17 | 4.5 | 5.0 | Excellent |
| Example 1-28 | PU-48 | IR dye (1) | 1.0 | 76 | 59 | 17 | 4.5 | 5.0 | Excellent |
| Example 1-29 | PU-49 | IR dye (1) | 1.0 | 76 | 59 | 17 | 4.5 | 5.0 | Excellent |
| Example 1-30 | PU-50 | IR dye (1) | 1.0 | 76 | 59 | 17 | 4.5 | 5.0 | Excellent |
| Example 1-31 | PU-51 | IR dye (1) | 1.0 | 78 | 61 | 17 | 4.7 | 5.2 | Excellent |
| Example 1-32 | PU-52 | IR dye (1) | 1.1 | 77 | 60 | 17 | 4.7 | 5.1 | Excellent |
| Example 1-33 | PU-53 | IR dye (1) | 1.3 | 76 | 59 | 17 | 4.6 | 5.0 | Excellent |
| Example 1-34 | PU-54 | IR dye (1) | 1.4 | 76 | 59 | 17 | 4.6 | 5.0 | Excellent |
| Example 1-35 | PU-55 | IR dye (1) | 1.4 | 76 | 59 | 17 | 4.5 | 4.9 | Excellent |
| Example 1-36 | PU-56 | IR dye (1) | 1.4 | 76 | 59 | 17 | 4.5 | 4.9 | Excellent |
| Example 1-37 | PU-57 | IR dye (1) | 1.0 | 78 | 61 | 17 | 4.7 | 5.2 | Excellent |
| Comp. Ex. 1-1 | REF-1 | IR dye (1) | 1.0 | 78 | 74 | 4 | 6.5 | 8.0 | Poor |
| Comp. Ex. 1-2 | REF-2 | IR dye (1) | 0.7 | 78 | 74 | 4 | 6.0 | 7.5 | Fair |
| Ref. Ex. 1-1 | PU-10 | None | 0.9 | 77 | 74 | 3 | 6.0 | 7.5 | Excellent |

As can be seen in Table 1, it was found that when the above-mentioned polyurethanes were used, development latitude was greatly improved. In particular, those having an amide structure, a phosphoric acid structure, a phosphonic acid structure, or a sulfonamide structure were excellent not only for development latitude but also for exposure discrimination (sensitivity), and in particular one having a sulfonamide structure was good for chemical resistance as well. The effect of the change in post-exposure sensitivity over time being improved by the use of the polyurethane of the present invention was unexpectedly exhibited.

Examples 1-38 to 1-67 and Comparative Examples 1-3 and 1-4

Preparation of Support

A support [B] was prepared by subjecting a 0.3 mm thick JIS A 1050 aluminum plate to the treatments below.
(a) Mechanical Roughening Treatment
The surface of the aluminum plate was subjected to a mechanical roughening treatment by means of a rotating roll-shaped nylon brush while supplying a suspension of an abrasive (silica sand) having a specific gravity of 1.12 in water as an abrasive slurry to the surface of the aluminum plate. The abrasive had an average particle size of 8 μm and a maximum particle size of 50 μm. The material of the nylon brush was nylon 6,10, the bristle length was 50 mm, and the diameter of the bristles was 0.3 mm. The nylon brush was formed by making holes in a stainless steel tube having a diameter of 300 mm and densely implanting the bristles. Three rotating brushes were used. The distance of two support rollers (φ 200 mm) below the brushes was 300 mm. The brush rollers were pressed against the aluminum plate so that the load on a drive motor for rotating the brushes increased by 7 kW from the load before pressing the brush rollers. The direction of rotation of the brushes was the same as the direction in which the aluminum plate moved. The rotational speed of the brushes was 200 rpm.
(b) Alkali Etching Treatment
The aluminum plate obtained above was subjected to an etching treatment by spraying an NaOH aqueous solution (concentration 26 wt %, aluminum ion concentration 6.5 wt %) at 70° C. so as to dissolve 6 g/m² of the aluminum plate. Subsequently, washing with water was carried out by means of a spray using well water.
(c) Desmutting Treatment
A desmutting treatment was carried out by means of a spray using an aqueous solution having a nitric acid concentration of 1 wt % and a temperature of 30° C. (containing 0.5 wt % of aluminum ion), and following this washing with water was carried out by means of a spray. The aqueous solution of nitric acid used in the desmutting treatment employed liquid waste from a step involving carrying out an electrochemical roughening treatment using alternating current in an aqueous solution of nitric acid.

(d) Electrochemical Roughening Treatment

An electrochemical roughening treatment was carried out consecutively using an AC voltage of 60 Hz. The electrolytic liquid in this process was a 10.5 g/L aqueous solution of nitric acid (containing 5 g/L of aluminum ion), and the temperature was 50° C. The electrochemical roughening treatment was carried out using as an AC power source waveform a trapezoidal rectangular wave alternating current having a duty ratio of 1:1 and a time TP from zero to peak current value of 0.8 msec, with a carbon electrode as a counter electrode. Ferrite was used as an auxiliary anode. The electrolytic vessel used was of a radial cell type.

The current density was 30 A/dm$^2$ as a peak current value, and the quantity of electricity was 220 C/dm$^2$ as the total quantity of electricity when the aluminum plate was the anode. 5% of the current flowing from the power source was diverted to the auxiliary anode.

Subsequently, washing with water was carried out by means of a spray using well water.

(e) Alkali Etching Treatment

The aluminum plate was subjected to an etching treatment at 32° C. by means of a spray with a sodium hydroxide concentration of 26 wt % and an aluminum ion concentration of 6.5 wt % so as to dissolve 0.20 g/m$^2$ of the aluminum plate, remove a smut component containing aluminum hydroxide as a main component formed in the previous stage when carrying out the electrochemical roughening treatment using alternating current, and dissolve an edge portion of a pit formed to thus make the edge portion smooth. Subsequently, washing with water was carried out by means of a spray using well water.

(f) Desmutting Treatment

A desmutting treatment was carried out by means of a spray using an aqueous solution having a nitric acid concentration of 15 wt % and a temperature of 30° C. (containing 4.5 wt % of aluminum ion), and following this washing with water was carried out by means of a spray using well water. The aqueous solution of nitric acid used in the desmutting treatment employed liquid waste from the step involving carrying out the electrochemical roughening treatment using alternating current in an aqueous solution of nitric acid.

(g) Electrochemical Roughening Treatment

An electrochemical roughening treatment was carried out consecutively using an AC voltage of 60 Hz. The electrolytic liquid in this process was a 7.5 g/L aqueous solution of hydrochloric acid (containing 5 g/L of aluminum ion), and the temperature was 35° C. The alternating current waveform of the power source was a rectangular wave, and the electrochemical roughening treatment was carried out using a carbon electrode as a counter electrode. Ferrite was used as an auxiliary anode. The electrolytic vessel was of a radial cell type.

The current density was 25 A/dm$^2$ as a peak current value, and the quantity of electricity was 50 C/dm$^2$ as the total quantity of electricity when the aluminum plate was the anode. Following this, washing with water was carried out by means of a spray using well water.

(h) Alkali Etching Treatment

The aluminum plate was subjected to an etching treatment at 32° C. by means of a spray with a sodium hydroxide concentration of 26 wt % and an aluminum ion concentration of 6.5 wt % so as to dissolve 0.10 g/m$^2$ of the aluminum plate, remove a smut component containing aluminum hydroxide as a main component formed in the previous stage when carrying out the electrochemical roughening treatment using alternating current, and dissolve an edge portion of a pit formed to thus make the edge portion smooth. Subsequently, washing with water was carried out by means of a spray using well water.

(i) Desmutting Treatment

A desmutting treatment was carried out by means of a spray using an aqueous solution having a sulfuric acid concentration of 25 wt % and a temperature of 60° C. (containing 0.5 wt % of aluminum ion), and following this washing with water was carried out by means of a spray using well water.

(j) Anodizing Treatment

As an electrolytic liquid, sulfuric acid was used. The electrolytic liquid had a sulfuric acid concentration of 170 g/L (containing 0.5 wt % of aluminum ion), and the temperature was 43° C. Subsequently, washing with water was carried out by means of a spray using well water.

The current density was about 30 A/dm$^2$. The final amount of oxide film was 2.7 g/m$^2$.

(k) Alkali Metal Silicate Treatment

An aluminum support obtained by the anodizing treatment was immersed in a treatment bath with a 1 wt % aqueous solution of No. 3 sodium silicate at a temperature of 30° C. for 10 sec, thus carrying out an alkali metal silicate treatment (silicate treatment). Subsequently, washing with water was carried out by means of a spray using well water. The amount of silicate attached was 3.5 mg/dm$^2$.

A support [B] was prepared by carrying out the steps (a) to (k) above in sequence so that the amount etched in step (e) was 3.5 g/m$^2$.

Formation of Undercoat Layer

An undercoat layer was provided by coating the support [B] prepared as above with the undercoat layer-forming coating solution below and then drying at 80° C. for 15 sec. The coverage after drying was 15 mg/m$^2$.

Undercoat Layer-Forming Coating Solution

| | |
|---|---|
| Specific polymer described below | 0.3 g |
| Methanol | 100 g |
| Water | 1 g |

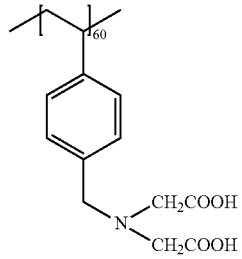

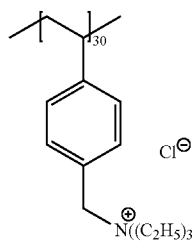

-continued

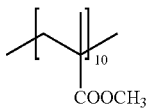

Formation of Recording Layer printing durability after baking was evaluated by the number of prints at the point where the density of a solid image could be visually recognized to have become weak. The printing durability was expressed as a relative value with the number for the printing durability of Comparative Example 1-3 defined as 1.0.

The results are given in Table 2.

TABLE 2

|  | Polyurethane in photosensitive liquid | Printing durability | Printing durability after baking | Development latitude | | | Sensitivity (W) | Post-exposure sensitivity | Chemical resistance |
| --- | --- | --- | --- | --- | --- | --- | --- | --- | --- |
|  |  |  |  | Upper limit (mS/cm) | Lower limit (mS/cm) | Δ (mS/cm) |  |  |  |
| Example 1-38 | PU-2 | 1.0 | 1.0 | 78 | 68 | 10 | 5.5 | 5.8 | Fair |
| Example 1-39 | PU-3 | 1.0 | 1.0 | 78 | 68 | 10 | 5.5 | 5.8 | Fair |
| Example 1-40 | PU-4 | 1.0 | 1.0 | 80 | 70 | 10 | 5.5 | 5.8 | Fair |
| Example 1-41 | PU-8 | 1.0 | 1.0 | 78 | 64 | 14 | 5.0 | 5.3 | Fair |
| Example 1-42 | PU-10 | 1.2 | 1.2 | 77 | 60 | 17 | 4.6 | 4.8 | Excellent |
| Example 1-43 | PU-21 | 1.2 | 1.2 | 77 | 62 | 15 | 4.8 | 5.0 | Excellent |
| Example 1-44 | PU-22 | 1.2 | 1.2 | 77 | 62 | 15 | 4.8 | 5.0 | Excellent |
| Example 1-45 | PU-30 | 1.0 | 1.3 | 80 | 68 | 12 | 5.5 | 5.9 | Good |
| Example 1-46 | PU-31 | 1.1 | 1.4 | 81 | 69 | 12 | 5.5 | 5.9 | Good |
| Example 1-47 | PU-32 | 1.0 | 1.3 | 81 | 69 | 12 | 5.4 | 5.8 | Good |
| Example 1-48 | PU-33 | 1.0 | 1.3 | 81 | 68 | 13 | 5.3 | 5.6 | Good |
| Example 1-49 | PU-34 | 1.0 | 1.3 | 80 | 68 | 12 | 5.2 | 5.6 | Good |
| Example 1-50 | PU-35 | 1.0 | 1.3 | 78 | 65 | 13 | 5.2 | 5.6 | Good |
| Example 1-51 | PU-36 | 1.0 | 1.2 | 80 | 68 | 12 | 5.2 | 5.6 | Good |
| Example 1-52 | PU-37 | 1.0 | 1.2 | 80 | 68 | 12 | 5.0 | 5.4 | Good |
| Example 1-53 | PU-38 | 1.0 | 1.2 | 80 | 68 | 12 | 5.0 | 5.4 | Good |
| Example 1-54 | PU-39 | 1.2 | 1.6 | 77 | 62 | 15 | 4.5 | 4.8 | Excellent |
| Example 1-55 | PU-40 | 1.2 | 1.6 | 77 | 62 | 15 | 4.5 | 4.8 | Excellent |
| Example 1-56 | PU-41 | 1.2 | 1.5 | 78 | 64 | 14 | 4.5 | 4.8 | Excellent |
| Example 1-57 | PU-42 | 1.2 | 1.6 | 78 | 63 | 15 | 4.5 | 4.8 | Excellent |
| Example 1-58 | PU-58 | 1.2 | 1.2 | 77 | 60 | 17 | 4.6 | 4.8 | Excellent |
| Example 1-59 | PU-59 | 1.2 | 1.2 | 80 | 65 | 15 | 4.6 | 4.9 | Excellent |
| Example 1-60 | PU-60 | 1.2 | 1.2 | 80 | 65 | 15 | 4.6 | 4.9 | Excellent |
| Example 1-61 | PU-61 | 1.2 | 1.2 | 80 | 65 | 15 | 4.6 | 4.9 | Excellent |
| Example 1-62 | PU-62 | 1.2 | 1.2 | 77 | 60 | 17 | 4.6 | 4.8 | Excellent |
| Example 1-63 | PU-63 | 1.2 | 1.2 | 77 | 60 | 17 | 4.6 | 4.8 | Excellent |
| Example 1-64 | PU-64 | 1.2 | 1.2 | 77 | 60 | 17 | 4.6 | 4.8 | Excellent |
| Example 1-65 | PU-65 | 1.3 | 1.3 | 80 | 62 | 18 | 4.6 | 4.7 | Excellent |
| Example 1-66 | PU-66 | 1.2 | 1.2 | 77 | 59 | 18 | 4.6 | 4.7 | Excellent |
| Example 1-67 | PU-67 | 1.2 | 1.2 | 77 | 59 | 18 | 4.6 | 4.7 | Excellent |
| Comp. Ex. 1-3 | REF-1 | 1.0 | 1.0 | 78 | 74 | 4 | 6.5 | 8.0 | Poor |
| Comp. Ex. 1-4 | REF-2 | 0.7 | 0.7 | 78 | 74 | 4 | 6.0 | 7.5 | Fair |

A recording layer was formed on the undercoated support [B] so obtained using the same photosensitive liquid I and photosensitive liquid II as in Example 1-1 in the form of a lower layer and an upper layer, in that order. IR dye (1) was used for all of the infrared absorbing agents in the photosensitive liquid I.

Evaluation of Printing Durability after Baking

The plate face of a lithographic printing plate obtained in the same manner as in the above-mentioned printing durability evaluation was washed with water, then wiped with BC-7 plate baking conditioner manufactured by Fujifilm, and then subjected to baking at about 270° C. for 2 min. Subsequently, washing with water was carried out, and the plate face was treated with a liquid prepared by diluting FP-2W gum manufactured by Fujifilm with water to double the volume. Subsequently, in the same manner as for the printing durability evaluation, printing was carried out by means of a Lithron printer manufactured by Komori Corporation using DIC-GEOS(N) black ink manufactured by DIC Corporation, and As can be seen in Table 2, it was found that when the polyurethanes were used, the development latitude and exposure discrimination (sensitivity) greatly improved. In the same way as for the results in Table 1, those having a sulfonamide structure had excellent development latitude, exposure discrimination (sensitivity), and chemical resistance. It was found that when a polyurethane containing a thermally crosslinkable group in a side chain was used, the printing durability after baking greatly improved.

Examples 1-68 to 1-91 and Comparative Examples 1-7 and 1-8

Preparation of Support and Formation of Intermediate Layer

A support and an intermediate layer were formed in the same manner as in Example 1-1.

Formation of Recording Layer

A recording layer was formed using the same photosensitive liquid I and photosensitive liquid II as in Example 1-1 in the form of a lower layer and an upper layer, in that order. The IR dye (1) was used for all of the infrared absorbing agents in the photosensitive liquid I.

Development Step

The exposed lithographic printing plate precursor was developed at 30° C. using the developer below by means of the automatic processor shown in FIG. 1 (development tank 25 L, plate transport speed 100 cm/min, one brush roller having an outer diameter of 50 mm and having implanted therein fibers of polybutylene terephthalate (bristle diameter: 200 μm, bristle length: 17 mm) and being rotated at 200 rpm in the same direction as the transport direction (peripheral speed at brush tip: 0.52 m/sec), drying temperature 80° C.).

Developer

| | |
|---|---|
| Water | 8,963.8 g |
| Sodium carbonate | 200 g |
| Sodium bicarbonate | 100 g |
| Surfactant (described in Table 3) | 656 g |
| EDTA 4Na | 80 g |
| 2-Bromo-2-nitropropanediol | 0.1 g |
| 2-Methyl-4-isothiazolin-3-one | 0.1 g |
| (pH = 9.7) | |

SU-1: Newcol B4SN (polyoxyethylene naphthyl ether sulfate, Nippon Nyukazai Co., Ltd.)
SU-2: Pionin B-111 (lauryltrimethylammonium chloride, Takemoto Oil & Fat Co., Ltd.)
SU-3: Newcol B13 (nonionic surfactant, Nippon Nyukazai Co., Ltd.)

mide structure had excellent development latitude, exposure discrimination (sensitivity), and chemical resistance.

Subsequently, development processing was carried out in an automatic processor having the type of structure shown in FIG. 1 using the above developer. The automatic processor had a 25 L development tank and one brush roller having an outer diameter of 50 mm and having implanted therein fibers of polybutylene terephthalate (bristle diameter: 200 μm, bristle length: 17 mm), and the brush roller was rotated at 200 rpm in the same direction as the transport direction (peripheral speed at brush tip: 0.52 m/sec). The processing liquid temperature was 30° C. Transport of the lithographic printing plate precursor was carried out at a transport speed of 100 cm/min. After development processing, drying was carried out in a drying section. The drying temperature was 80° C.

The lithographic printing plate thus obtained was mounted on an SOR-M printer (Heidelberg), and printing was carried out at a printing speed of 6,000 sheets per hour using dampening water (EU-3 (etching liquid, Fujifilm))/water/isopropyl alcohol=1/89/10 (ratio by volume)) and TRANS-G(N) black ink (DIC Corporation).

Evaluation

Developability, processability, and printing durability were evaluated as described above using each lithographic printing plate precursor.

From the above-mentioned evaluation results, it was found that the lithographic printing plate precursors of the present invention did not cause any residue in the development tank

TABLE 3

| | Polyurethane in photosensitive layer | Surfactant in processing solution | Printing durability | Development latitude | | | Sensitivity (W) | Post-exposure sensitivity | Chemical resistance |
|---|---|---|---|---|---|---|---|---|---|
| | | | | Upper limit (mS/cm) | Lower limit (mS/cm) | Δ (mS/cm) | | | |
| Example 1-68 | PU-1 | SU-1 | 1.0 | 82 | 72 | 10 | 5.2 | 5.5 | Fair |
| Example 1-69 | PU-5 | SU-1 | 1.1 | 82 | 72 | 10 | 5.2 | 5.5 | Fair |
| Example 1-70 | PU-6 | SU-1 | 1.0 | 82 | 70 | 12 | 5.2 | 5.5 | Fair |
| Example 1-71 | PU-7 | SU-1 | 1.0 | 80 | 66 | 14 | 5.0 | 5.5 | Fair |
| Example 1-72 | PU-9 | SU-1 | 1.0 | 79 | 65 | 14 | 5.0 | 5.5 | Fair |
| Example 1-73 | PU-10 | SU-1 | 1.2 | 79 | 62 | 17 | 5.0 | 5.2 | Excellent |
| Example 1-74 | PU-11 | SU-1 | 1.3 | 79 | 62 | 17 | 4.7 | 4.9 | Excellent |
| Example 1-75 | PU-12 | SU-1 | 1.4 | 79 | 62 | 17 | 4.7 | 4.9 | Excellent |
| Example 1-76 | PU-13 | SU-1 | 1.4 | 79 | 62 | 17 | 4.8 | 5.0 | Excellent |
| Example 1-77 | PU-14 | SU-1 | 1.2 | 79 | 62 | 17 | 4.8 | 5.2 | Excellent |
| Example 1-78 | PU-15 | SU-1 | 1.2 | 79 | 62 | 17 | 4.8 | 5.2 | Excellent |
| Example 1-79 | PU-16 | SU-1 | 1.1 | 80 | 65 | 15 | 5.2 | 5.5 | Good |
| Example 1-80 | PU-17 | SU-1 | 1.0 | 82 | 67 | 15 | 4.9 | 5.2 | Good |
| Example 1-81 | PU-18 | SU-1 | 1.2 | 82 | 67 | 15 | 4.9 | 5.2 | Good |
| Example 1-82 | PU-19 | SU-1 | 1.2 | 82 | 67 | 15 | 4.9 | 5.2 | Good |
| Example 1-83 | PU-10 | None | 1.2 | 85 | 72 | 13 | 5.0 | 5.5 | Excellent |
| Example 1-84 | PU-10 | SU-2 | 1.3 | 85 | 73 | 12 | 4.9 | 5.3 | Excellent |
| Example 1-85 | PU-10 | SU-3 | 1.2 | 79 | 62 | 17 | 5.0 | 5.4 | Excellent |
| Example 1-86 | PU-58 | SU-1 | 1.3 | 79 | 62 | 17 | 4.8 | 5.1 | Excellent |
| Example 1-87 | PU-77 | SU-1 | 1.0 | 77 | 65 | 12 | 4.8 | 5.1 | Fair |
| Example 1-88 | PU-81 | SU-1 | 1.4 | 79 | 62 | 17 | 4.6 | 5.0 | Excellent |
| Example 1-89 | PU-84 | SU-1 | 1.1 | 77 | 62 | 15 | 4.6 | 5.1 | Good |
| Example 1-90 | PU-88 | SU-1 | 1.0 | 77 | 62 | 15 | 4.6 | 5.0 | Good |
| Example 1-91 | PU-91 | SU-1 | 1.2 | 77 | 62 | 15 | 4.5 | 5.0 | Good |
| Comp. Ex. 1-7 | REF-1 | SU-1 | 1.0 | 78 | 74 | 4 | 6.5 | 8.0 | Poor |
| Comp. Ex. 1-8 | REF-2 | SU-1 | 0.7 | 78 | 74 | 4 | 6.0 | 7.5 | Fair |

As can be seen in Table 3, it was found that when the polyurethanes were used, the development latitude and exposure discrimination (sensitivity) greatly improved. In the same way as for the results in Table 1, those having a sulfonamide structure had excellent development latitude, exposure discrimination (sensitivity), and chemical resistance.

even with single bath processing using a weakly alkaline developer, processability was excellent, and there was hardly any degradation in printing durability after the plate was left subsequent to processing.

Examples 2-1 to 2-53, Comparative Examples 2-1 to 2-4, and Reference Example 2-1

Preparation of Support

The surface of a 0.3 mm thick JIS A 1050 aluminum plate was subjected to graining by means of a rotating nylon brush using a pumice-water suspension as an abrasive. Here, the surface roughness (center line average roughness) was 0.5 μm. After washing with water, the plate was immersed in a 10% sodium hydroxide aqueous solution, that had been heated to 70° C., and subjected to etching so that the amount of aluminum dissolved was 6 g/m³. After washing with water, the plate was immersed in a 30% nitric acid aqueous solution for 1 min so as to carry out neutralization, and washed well with water. Subsequently, it was subjected to electrolytic roughening for 20 sec in a 0.7% nitric acid aqueous solution using a rectangular alternating waveform voltage with a voltage of 13 V for the anode and a voltage of 6 V for the cathode, immersed in a 20% sulfuric acid solution at 50° C. so as to wash the surface, and then washed with water. The roughened aluminum plate was subjected to formation of a porous anodized coating using direct current in a 20% sulfuric acid aqueous solution. Electrolysis was carried out at an electric current density of 5 A/dm², and a substrate having on the surface an anodized coating with a weight of 4.0 g/m² was formed by controlling the electrolysis time. This substrate was treated for 10 sec in a vapor chamber that had been saturated at 100° C. and 1 atm, thus giving a substrate (a) with a sealing ratio of 60%. The substrate (a) was subjected to a surface hydrophilization treatment using a 2.5 wt % aqueous solution of sodium silicate at 30° C. for 10 sec and then coated with undercoat solution 1 described below, and the coating was dried at 80° C. for 15 sec, thus giving a lithographic printing plate support [A]. The dried coating coverage was 15 mg/m².

Formation of Undercoat Layer

An undercoat layer was provided on the support [A] formed as above by coating it with the undercoat solution 1 below and drying at 80° C. for 15 sec. The coverage after drying was 15 mg/m².

Undercoat Solution 1

| | |
|---|---|
| Copolymer below having a weight-average molecular weight of 28,000 | 0.3 parts by weight |
| Methanol | 100 parts by weight |
| Water | 1 part by weight |

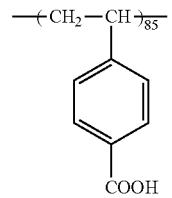

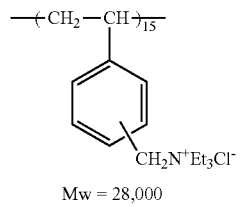

Mw = 28,000

Here, Et denotes an ethyl group, and the FIGURE on the lower right of the parentheses denotes molar ratio.

Formation of Recording Layer

The undercoated support [A] thus obtained was provided with a lower layer by coating it with photosensitive liquid III or photosensitive liquid IV having the composition below using a wire bar and drying in a drying oven at 150° C. for 40 sec so as to give a coat weight of 0.8 g/m². After the lower layer was provided, an upper layer was provided by coating with photosensitive liquid V having the composition below using a wire bar. After coating, drying was carried out at 150° C. for 40 sec, thus giving a photosensitive lithographic printing plate precursor for infrared laser having a total coat weight for the lower layer and the upper layer of 1.0 g/m².

Photosensitive Liquid II

| | |
|---|---|
| Copolymer of N-(p-aminosulfonylphenyl)methacrylamide/methyl methacrylate/acrylonitrile = 35/35/30 (molar ratio) (weight-average molecular weight 65,000) | 3.5 parts by weight |
| m,p-Cresol novolac (m/p ratio = 6/4, weight-average molecular weight 6,000) | 0.6 parts by weight |
| Infrared absorbing agent (IR dye 1) | 0.25 parts by weight |
| Dye in which the counteranion of Ethyl Violet was 6-hydroxy-β-naphthalenesulfonic acid ion | 0.15 parts by weight |
| Bisphenolsulfone | 0.3 parts by weight |
| Tetrahydrophthalic acid | 0.4 parts by weight |
| Fluorine-based surfactant (Megafac F-780, DIC Corporation) | 0.02 parts by weight |
| Methyl ethyl ketone | 60 parts by weight |
| Propylene glycol monomethyl ether | 20 parts by weight |
| γ-Butyrolactone | 20 parts by weight |

Photosensitive Liquid IV

| | |
|---|---|
| Copolymer of N-phenylmaleimide/methacrylamide/methacrylic acid = 45/35/20 (molar ratio) (weight-average molecular weight 50,000) | 0.85 parts by weight |
| Infrared absorbing agent (IR dye 1) | 0.25 parts by weight |
| Ethyl Violet | 0.05 parts by weight |
| Fluorine-based surfactant (Megafac F-780, DIC Corporation) | 0.02 parts by weight |
| Methyl ethyl ketone | 5 parts by weight |
| Propylene glycol monomethyl ether | 15 parts by weight |
| γ-Butyrolactone | 5 parts by weight |

Photosensitive Liquid V

| | |
|---|---|
| Polyurethane resin (compound described in Table 4 or 5) | 1.7 parts by weight |
| Infrared absorbing agent (IR dye 1) | 0.15 parts by weight |
| Compound Q below | 0.35 parts by weight |
| Fluorine-based surfactant (Megafac F-780, DIC Corporation) | 0.03 parts by weight |
| Copolymer of tridecafluorooctyl methacrylate/2-adamantyl acrylate/2-carboxyethyl methacrylate = 30/50/20 with weight-average molecular weight of 30,000 | 0.1 parts by weight |
| Methyl ethyl ketone | 33.0 parts by weight |

-continued
1-Methoxy-2-propanol 67.0 parts by weight
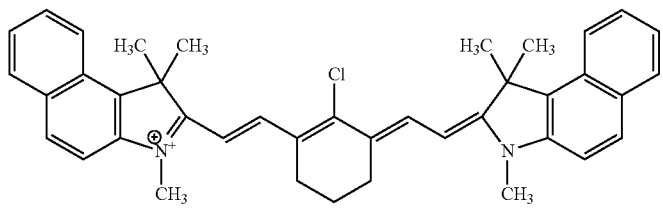
IR dye (1)
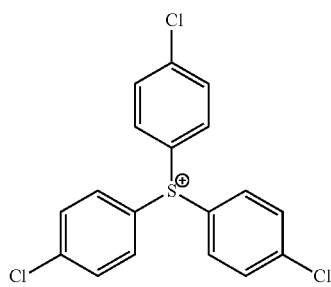
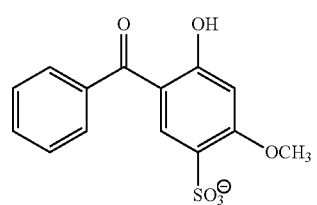
Compound Q
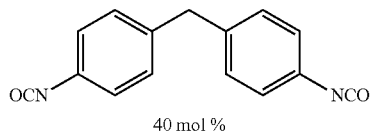
40 mol %
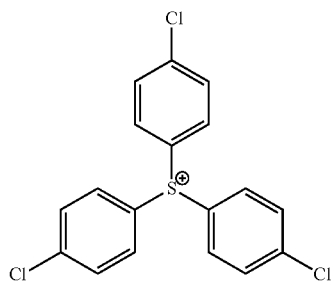
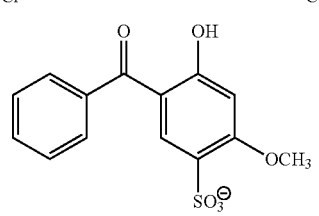
Compound Q

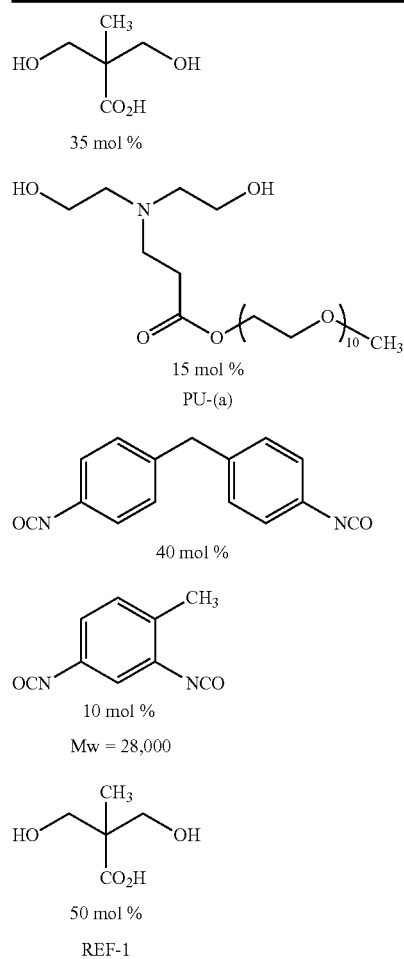

REF-2: copolymer of N-phenylmaleimide/methacrylamide/methacrylic acid = 45/35/20 (molar ratio) (weight-average molecular weight 50,000)

Evaluation of Printing Durability

A test pattern was written imagewise on the lithographic printing plate precursor using a Trendsetter manufactured by Creo while changing the exposure energy. Subsequently, it was developed using an LP940H PS processor manufactured by Fujifilm charged with DT-2 developer (diluted so as to have an electrical conductivity of 43 mS/cm) manufactured by Fujifilm at a development temperature of 30° C. for a development time of 12 sec. This was used for continuous printing using a Lithron printer manufactured by Komori Corporation. The number of sheets that could be printed with sufficient ink density was visually measured, and the printing durability was evaluated. The printing durability was expressed as a relative value when the number for the printing durability of Comparative Example 2-1 was defined as 1.0. The results are given in Table 4.

Evaluation of Development Latitude

A test pattern was written imagewise on the lithographic printing plate precursor using Trendsetter 3244VX manufactured by Creo at a beam intensity of 9 W and a drum rotational speed of 150 rpm. Subsequently, it was developed at a liquid temperature of 30° C. for a development time of 22 sec using a 900H PS processor manufactured by Fujifilm charged with alkali developer having the composition below for which the electrical conductivity had been varied by changing the dilution ratio by changing the amount of water. In this process, the difference between the highest electrical conductivity and the lowest electrical conductivity of the developer that enabled good development to be carried out without the image area being dissolved and without causing stains or coloration due to residual photosensitive layer as a result of incomplete development was evaluated as the development latitude. The results are given in Table 4.

Evaluation of Sensitivity

A test pattern was written on the lithographic printing plate precursor using a Trendsetter 3244VFS manufactured by Creo while changing the exposure energy. Subsequently, development was carried out using an alkali developer having an electrical conductivity at the midpoint (average value) between the highest electrical conductivity and the lowest electrical conductivity of the developer that enabled good development to be carried out without the image area being dissolved and without causing stains or coloration due to residual photosensitive layer as a result of incomplete development in the above-mentioned evaluation of development latitude, and the exposure at which a non-image area could be developed using this developer (beam intensity when drum rotational speed was 160 rpm) was measured and defined as the sensitivity. The smaller this value, the higher the sensitivity. The results are given in Table 4.

Evaluation of Change in Post-Exposure Sensitivity Over Time

Evaluation was carried out in the same manner as for the above-mentioned sensitivity evaluation except that after exposure the precursor was stored at 25° C. with a relative humidity of 70% for 1 hour. The result of the above-mentioned sensitivity evaluation was stored as the sensitivity immediately after exposure, and the extent of decrease in sensitivity was used as an index. The results are given in Table 4. The values in Table 4 denote sensitivity 1 hour after exposure, and when this value was close to the sensitivity immediately after exposure the evaluation was that the change in post-exposure sensitivity over time was good.

Evaluation of Chemical Resistance

The lithographic printing plate precursor was subjected to exposure, development, and printing in the same manner as in the above-mentioned printing durability evaluation. A step in which the plate face was wiped with a cleaner (Multicleaner, Fujifilm) each time after 5,000 sheets were printed was added, and the chemical resistance was evaluated. When this printing durability was at least 95% but no greater than 100% of the above-mentioned number of sheets for printing durability it was evaluated as Excellent, at least 80% but less than 95% as Good, at least 60% but less than 80% as Fair, and less than 60% as Poor. When the step of wiping the plate face using a cleaner was added, the smaller the change in the number of sheets for printing durability, the better the chemical resistance. The results are given in Table 4 below.

Developer

| | |
|---|---|
| D-Sorbitol | 2.5 wt % |
| Sodium hydroxide | 0.85 wt % |
| Polyethylene glycol lauryl ether (weight-average molecular weight 1,000) | 0.5 wt % |
| Water | 96.15 wt % |

TABLE 4

| | Polyurethane resin of upper layer | Lower layer photo sensitive liquid | Printing durability | Development latitude Δ (mS/cm) | Sensitivity (W) | Post-exposure sensitivity | Chemical resistance |
|---|---|---|---|---|---|---|---|
| Example 2-1 | PU-10 | Photosensitive layer IV | 1.2 | 17 | 4.6 | 5.0 | Excellent |
| Example 2-2 | PU-11 | Photosensitive layer IV | 1.3 | 17 | 4.5 | 4.7 | Excellent |
| Example 2-3 | PU-12 | Photosensitive layer IV | 1.4 | 17 | 4.5 | 4.7 | Excellent |
| Example 2-4 | PU-13 | Photosensitive layer IV | 1.4 | 17 | 4.6 | 4.8 | Excellent |
| Example 2-5 | PU-14 | Photosensitive layer IV | 1.2 | 17 | 4.6 | 5.0 | Excellent |
| Example 2-6 | PU-15 | Photosensitive layer IV | 1.2 | 17 | 4.6 | 5.0 | Excellent |
| Example 2-7 | PU-16 | Photosensitive layer IV | 1.1 | 15 | 5.0 | 5.3 | Good |
| Example 2-8 | PU-23 | Photosensitive layer IV | 1.3 | 17 | 4.9 | 5.3 | Excellent |
| Example 2-9 | PU-26 | Photosensitive layer III | 1.2 | 14 | 5.0 | 5.4 | Good |
| Example 2-10 | PU-43 | Photosensitive layer IV | 1.3 | 17 | 4.6 | 5.0 | Excellent |
| Example 2-11 | PU-44 | Photosensitive layer IV | 1.0 | 17 | 4.5 | 5.0 | Excellent |
| Example 2-12 | PU-45 | Photosensitive layer IV | 1.0 | 17 | 4.5 | 5.0 | Excellent |
| Example 2-13 | PU-46 | Photosensitive layer IV | 1.0 | 17 | 4.5 | 5.0 | Excellent |
| Example 2-14 | PU-47 | Photosensitive layer IV | 1.0 | 17 | 4.5 | 5.0 | Excellent |
| Example 2-15 | PU-48 | Photosensitive layer IV | 1.0 | 17 | 4.5 | 5.0 | Excellent |
| Example 2-16 | PU-49 | Photosensitive layer IV | 1.0 | 17 | 4.5 | 5.0 | Excellent |
| Example 2-17 | PU-50 | Photosensitive layer IV | 1.0 | 17 | 4.5 | 5.0 | Excellent |
| Example 2-18 | PU-51 | Photosensitive layer IV | 1.0 | 17 | 4.7 | 5.2 | Excellent |
| Example 2-19 | PU-52 | Photosensitive layer IV | 1.1 | 17 | 4.7 | 5.1 | Excellent |
| Example 2-20 | PU-53 | Photosensitive layer IV | 1.3 | 17 | 4.6 | 5.0 | Excellent |
| Example 2-21 | PU-54 | Photosensitive layer IV | 1.4 | 17 | 4.6 | 5.0 | Excellent |
| Example 2-22 | PU-55 | Photosensitive layer IV | 1.4 | 17 | 4.5 | 4.9 | Excellent |
| Example 2-23 | PU-56 | Photosensitive layer IV | 1.4 | 17 | 4.5 | 4.9 | Excellent |
| Example 2-24 | PU-57 | Photosensitive layer IV | 1.0 | 17 | 4.7 | 5.2 | Excellent |
| Comp. Ex. 2-1 | REF-1 | IR dye 1 | 1.0 | 4 | 6.5 | 8.0 | Poor |
| Comp. Ex. 2-2 | REF-2 | IR dye 1 | 0.7 | 4 | 6.0 | 7.5 | Fair |
| Ref. Ex. 2-1 | PU-10 | None | 0.9 | 3 | 6.0 | 7.5 | Excellent |

As shown in Table 4, it was found that when the polyurethane resins were used, development latitude and dissolution discrimination (sensitivity) greatly improved. Furthermore, those having a sulfonamide group in a graft chain of the polyurethane resin had particularly excellent development latitude, dissolution discrimination (sensitivity), and chemical resistance.

Evaluation of Printing Durability after Baking

The plate face of a lithographic printing plate obtained in the same manner as in the above-mentioned printing durability evaluation was washed with water, then wiped with BC-7 plate baking conditioner manufactured by Fujifilm, and then subjected to baking at about 270° C. for 2 min. Subsequently, washing with water was carried out, and the plate face was treated with a liquid prepared by diluting FP-2W gum manufactured by Fujifilm with water to double the volume. Subsequently, in the same manner as for the printing durability evaluation, printing was carried out by means of a Lithron printer manufactured by Komori Corporation using DIC-GEOS(N) black ink manufactured by DIC Corporation, and printing durability after baking was evaluated by the number of prints at the point where the density of a solid image could be visually recognized to have become weak. The printing durability was expressed as a relative value with the number for the printing durability of Comparative Example 2-3 defined as 1.0.

The results are given in Table 5

TABLE 5

|  | Polyurethane resin of upper layer | Lower layer photosensitive liquid | Printing durability | Printing durability after baking | Development latitude Δ (mS/cm) | Sensitivity (W) | Post-exposure sensitivity | Chemical resistance |
|---|---|---|---|---|---|---|---|---|
| Example 2-25 | PU-10 | Photosensitive liquid IV | 1.2 | 1.2 | 17 | 4.6 | 4.8 | Excellent |
| Example 2-26 | PU-16 | Photosensitive liquid III | 1.0 | 1.0 | 15 | 4.8 | 5.3 | Good |
| Example 2-27 | PU-21 | Photosensitive liquid IV | 1.2 | 1.2 | 15 | 4.8 | 5.0 | Excellent |
| Example 2-28 | PU-22 | Photosensitive liquid IV | 1.2 | 1.2 | 15 | 4.8 | 5.0 | Excellent |
| Example 2-29 | PU-30 | Photosensitive liquid IV | 1.0 | 1.3 | 12 | 5.5 | 5.9 | Good |
| Example 2-30 | PU-31 | Photosensitive liquid IV | 1.1 | 1.4 | 12 | 5.5 | 5.9 | Good |
| Example 2-31 | PU-32 | Photosensitive liquid IV | 1.0 | 1.3 | 12 | 5.4 | 5.8 | Good |
| Example 2-32 | PU-33 | Photosensitive liquid IV | 1.0 | 1.3 | 13 | 5.3 | 5.6 | Good |
| Example 2-33 | PU-34 | Photosensitive liquid IV | 1.0 | 1.3 | 12 | 5.2 | 5.6 | Good |
| Example 2-34 | PU-35 | Photosensitive liquid IV | 1.0 | 1.3 | 13 | 5.2 | 5.6 | Good |
| Example 2-35 | PU-36 | Photosensitive liquid IV | 1.0 | 1.2 | 12 | 5.2 | 5.6 | Good |
| Example 2-36 | PU-37 | Photosensitive liquid IV | 1.0 | 1.2 | 12 | 5.0 | 5.4 | Good |
| Example 2-37 | PU-38 | Photosensitive liquid IV | 1.0 | 1.2 | 12 | 5.0 | 5.4 | Good |
| Example 2-38 | PU-58 | Photosensitive liquid IV | 1.2 | 1.2 | 17 | 4.6 | 4.8 | Excellent |
| Example 2-39 | PU-59 | Photosensitive liquid IV | 1.2 | 1.2 | 15 | 4.6 | 4.9 | Excellent |
| Example 2-40 | PU-60 | Photosensitive liquid IV | 1.2 | 1.2 | 15 | 4.6 | 4.9 | Excellent |
| Example 2-41 | PU-61 | Photosensitive liquid IV | 1.2 | 1.2 | 15 | 4.6 | 4.9 | Excellent |
| Example 2-42 | PU-62 | Photosensitive liquid IV | 1.2 | 1.2 | 17 | 4.6 | 4.8 | Excellent |
| Example 2-43 | PU-63 | Photosensitive liquid IV | 1.2 | 1.2 | 17 | 4.6 | 4.8 | Excellent |
| Example 2-44 | PU-64 | Photosensitive liquid IV | 1.2 | 1.2 | 17 | 4.6 | 4.8 | Excellent |
| Example 2-45 | PU-65 | Photosensitive liquid IV | 1.3 | 1.3 | 18 | 4.6 | 4.7 | Excellent |
| Example 2-46 | PU-66 | Photosensitive liquid IV | 1.2 | 1.2 | 18 | 4.6 | 4.7 | Excellent |
| Example 2-47 | PU-67 | Photosensitive liquid IV | 1.2 | 1.2 | 18 | 4.6 | 4.7 | Excellent |
| Example 2-48 | PU-81 | Photosensitive liquid IV | 1.2 | 1.2 | 17 | 4.6 | 4.8 | Excellent |
| Example 2-49 | PU-82 | Photosensitive liquid IV | 1.2 | 1.2 | 17 | 4.6 | 4.8 | Excellent |
| Example 2-50 | PU-83 | Photosensitive liquid IV | 1.2 | 1.2 | 17 | 4.6 | 4.8 | Excellent |
| Example 2-51 | PU-84 | Photosensitive liquid III | 1.0 | 1.0 | 15 | 4.8 | 5.3 | Good |
| Example 2-52 | PU-85 | Photosensitive liquid III | 1.0 | 1.0 | 15 | 4.8 | 5.3 | Good |
| Example 2-53 | PU-86 | Photosensitive liquid III | 1.0 | 1.0 | 15 | 4.8 | 5.3 | Good |
| Comp. Ex. 2-3 | REF-1 | Photosensitive liquid IV | 1.0 | 1.0 | 4 | 6.5 | 8.0 | Poor |
| Comp. Ex. 2-4 | REF-2 | Photosensitive liquid III | 0.7 | 0.7 | 4 | 6.0 | 7.5 | Fair |

As shown in Table 5, it was found that when the polyurethane resins were used in the upper layer, development latitude and dissolution discrimination (sensitivity) greatly improved. In the same way as for the results of Table 4, those having a sulfonamide group in a graft chain of the polyurethane resin had particularly excellent development latitude, dissolution discrimination (sensitivity), and chemical resistance. It was also found that when a polyurethane resin containing a thermally crosslinkable group in a side chain was used, printing durability after baking greatly improved.

Examples 2-54 to 2-86 and Comparative Examples 2-5 and 2-6

Preparation of Lithographic Printing Plate Precursor

A support, an intermediate layer, a lower layer, and an upper layer were formed in the same manner as in Example 2-1. IR dye 1 was used for all of the infrared absorbing agents in the photosensitive liquid.

Development Step

The exposed lithographic printing plate precursor was developed at 30° C. using the developer below by means of the automatic processor shown in FIG. 1 (development tank 25 L, plate transport speed 100 cm/min, one brush roller having an outer diameter of 50 mm and having implanted therein fibers of polybutylene terephthalate (bristle diameter: 200 μm, bristle length: 17 mm) and being rotated at 200 rpm in the same direction as the transport direction (peripheral speed at brush tip: 0.52 m/sec), drying temperature 80° C.).

Developer

| Water | 8963.8 parts by weight |
|---|---|
| Sodium carbonate | 200 parts by weight |
| Sodium bicarbonate | 100 parts by weight |
| Surfactant (compound described in Table 6 below) | 656 parts by weight |
| Tetrasodium ethylenediaminetetraacetate (EDTA 4Na) | 80 parts by weight |
| 2-Bromo-2-nitropropanediol | 0.1 parts by weight |
| 2-Methyl-4-isothiazolin-3-one (pH = 9.7) | 0.1 parts by weight |

SU-1: Newcol B4SN (polyoxyethylene naphthyl ether sulfate, Nippon Nyukazai Co., Ltd.)
SU-2: Pionin B-111 (lauryltrimethylammonium chloride, Takemoto Oil & Fat Co., Ltd.)
SU-3: Newcol B13 (nonionic surfactant, Nippon Nyukazai Co., Ltd.)

TABLE 6

|  | Polyurethane resin of upper layer | Lower layer photosensitive liquid | Surfactant in processing solution | Printing durability | Printing durability after baking | Development latitude Δ (mS/cm) | Sensitivity (W) | Post-exposure Sensitivity | Chemical resistance |
|---|---|---|---|---|---|---|---|---|---|
| Example 2-54 | PU-10 | Photosensitive liquid IV | SU-1 | 0.9 | 1.2 | 17 | 4.7 | 4.9 | Excellent |
| Example 2-55 | PU-16 | Photosensitive liquid III | SU-1 | 0.8 | 1.0 | 15 | 4.9 | 5.4 | Good |

TABLE 6-continued

| | Polyurethane resin of upper layer | Lower layer photosensitive liquid | Surfactant in processing solution | Printing durability | Printing durability after baking | Development latitude Δ (mS/cm) | Sensitivity (W) | Post-exposure Sensitivity | Chemical resistance |
|---|---|---|---|---|---|---|---|---|---|
| Example 2-56 | PU-21 | Photosensitive liquid IV | SU-1 | 0.9 | 1.2 | 15 | 4.9 | 5.1 | Excellent |
| Example 2-57 | PU-22 | Photosensitive liquid IV | SU-1 | 0.9 | 1.2 | 15 | 4.9 | 5.1 | Excellent |
| Example 2-58 | PU-10 | Photosensitive liquid IV | None | 0.9 | 0.9 | 13 | 4.7 | 4.9 | Excellent |
| Example 2-59 | PU-10 | Photosensitive liquid IV | SU-1 | 0.9 | 0.9 | 15 | 4.9 | 5.1 | Excellent |
| Example 2-60 | PU-10 | Photosensitive liquid IV | SU-2 | 0.9 | 0.9 | 13 | 4.9 | 5.1 | Excellent |
| Example 2-61 | PU-10 | Photosensitive liquid IV | SU-3 | 0.9 | 0.9 | 15 | 4.7 | 5.0 | Excellent |
| Example 2-62 | PU-30 | Photosensitive liquid III | SU-1 | 0.7 | 1.0 | 12 | 5.5 | 5.9 | Good |
| Example 2-63 | PU-31 | Photosensitive liquid III | SU-1 | 0.8 | 1.1 | 12 | 5.5 | 5.9 | Good |
| Example 2-64 | PU-32 | Photosensitive liquid III | SU-1 | 0.7 | 1.0 | 12 | 5.4 | 5.8 | Good |
| Example 2-65 | PU-33 | Photosensitive liquid III | SU-1 | 0.7 | 1.0 | 13 | 5.3 | 5.6 | Good |
| Example 2-66 | PU-34 | Photosensitive liquid III | SU-1 | 0.7 | 1.0 | 12 | 5.2 | 5.6 | Good |
| Example 2-67 | PU-35 | Photosensitive liquid III | SU-1 | 0.7 | 1.0 | 13 | 5.2 | 5.6 | Good |
| Example 2-68 | PU-36 | Photosensitive liquid III | SU-1 | 0.7 | 0.9 | 12 | 5.2 | 5.6 | Good |
| Example 2-69 | PU-37 | Photosensitive liquid III | SU-1 | 0.7 | 0.9 | 12 | 5.0 | 5.4 | Good |
| Example 2-70 | PU-38 | Photosensitive liquid III | SU-1 | 0.7 | 0.9 | 12 | 5.0 | 5.4 | Good |
| Example 2-71 | PU-58 | Photosensitive liquid IV | SU-1 | 0.9 | 0.9 | 17 | 4.6 | 4.9 | Excellent |
| Example 2-72 | PU-59 | Photosensitive liquid IV | SU-1 | 0.9 | 0.9 | 15 | 4.7 | 5.0 | Excellent |
| Example 2-73 | PU-60 | Photosensitive liquid IV | SU-1 | 0.9 | 0.9 | 15 | 4.7 | 5.0 | Excellent |
| Example 2-74 | PU-61 | Photosensitive liquid IV | SU-1 | 0.9 | 0.9 | 15 | 4.7 | 5.0 | Excellent |
| Example 2-75 | PU-62 | Photosensitive liquid IV | SU-1 | 0.9 | 0.9 | 17 | 4.7 | 4.9 | Excellent |
| Example 2-76 | PU-63 | Photosensitive liquid IV | SU-1 | 0.9 | 0.9 | 17 | 4.7 | 4.9 | Excellent |
| Example 2-77 | PU-64 | Photosensitive liquid IV | SU-1 | 0.9 | 0.9 | 17 | 4.7 | 4.9 | Excellent |
| Example 2-78 | PU-65 | Photosensitive liquid IV | SU-1 | 1.0 | 1.0 | 18 | 4.7 | 4.8 | Excellent |
| Example 2-79 | PU-66 | Photosensitive liquid IV | SU-1 | 0.9 | 0.9 | 18 | 4.7 | 4.8 | Excellent |
| Example 2-80 | PU-67 | Photosensitive liquid IV | SU-1 | 0.9 | 0.9 | 18 | 4.7 | 4.8 | Excellent |
| Example 2-81 | PU-81 | Photosensitive liquid IV | SU-1 | 0.9 | 0.9 | 17 | 4.7 | 4.9 | Excellent |
| Example 2-82 | PU-82 | Photosensitive liquid IV | SU-1 | 0.9 | 0.9 | 17 | 4.7 | 4.9 | Excellent |
| Example 2-83 | PU-83 | Photosensitive liquid IV | SU-1 | 0.9 | 0.9 | 17 | 4.7 | 4.9 | Excellent |
| Example 2-84 | PU-84 | Photosensitive liquid III | SU-1 | 0.7 | 0.7 | 15 | 4.9 | 5.4 | Good |
| Example 2-85 | PU-85 | Photosensitive liquid III | SU-1 | 0.7 | 0.7 | 15 | 4.9 | 5.4 | Good |
| Example 2-86 | PU-86 | Photosensitive liquid III | SU-1 | 0.7 | 0.7 | 15 | 4.9 | 5.4 | Good |
| Comp. Ex. 2-5 | REF-1 | Photosensitive liquid V | SU-1 | 0.7 | 0.7 | 4 | 6.5 | 8.0 | Good |
| Comp. Ex. 2-6 | REF-2 | Photosensitive liquid V | SU-1 | 0.5 | 0.5 | 4 | 6.0 | 7.5 | Good |

As shown in Table 6, it was found that when the polyurethane resins were used in the upper layer, development latitude and dissolution discrimination (sensitivity) greatly improved. In the same way as for the results of Table 4, those having a sulfonamide group in a graft chain of the polyurethane resin had particularly excellent development latitude, dissolution discrimination (sensitivity), and chemical resistance.

What is claimed is:

1. A positive-working lithographic printing plate precursor for infrared laser comprising, layered sequentially above a support;
    a lower layer comprising a water-insoluble and alkali-soluble resin and an infrared absorbing agent; and
    an upper layer comprising a sulfonamide group-, active imide group-, and/or amide group-containing graft copolymer;
    the graft copolymer being a polyurethane resin having as a graft chain an ethylenically unsaturated monomer-derived constitutional unit,
    wherein the polyurethane resin is a reaction product of a diisocyanate and a diol, and the diol comprises (A-1) a diol having a graft chain comprising a sulfonamide group.

2. The positive-working lithographic printing plate precursor for infrared laser according to claim 1, wherein the diol further comprises (A-2) a carboxy group-containing diol.

3. The positive-working lithographic printing plate precursor for infrared laser according to claim 1, wherein the graft chain has a terminal bonded to a diol compound residue via a sulfur atom.

4. The positive-working lithographic printing plate precursor for infrared laser according to claim 1, wherein the upper layer further comprises an infrared absorbing agent.

5. The positive-working lithographic printing plate precursor for infrared laser according to claim 1, wherein the water-insoluble and alkali-soluble resin comprises at least one type of group selected from the group consisting of a phenolic hydroxy group, a carboxy group, a sulfonic acid group, a phosphoric acid group, a sulfonamide group, and an active imide group.

6. The positive-working lithographic printing plate precursor for infrared laser according to claim 5, wherein the water-insoluble and alkali-soluble resin comprises a sulfonamide group.

7. A process for making a lithographic printing plate, comprising in sequence:
    an exposure step of imagewise exposing by means of an infrared laser the positive-working lithographic printing plate precursor for infrared laser according to claim 1; and
    a development step of developing using an aqueous alkali solution with a pH of 8.5 to 10.8.

8. The process for making a lithographic printing plate according to claim 7, wherein the aqueous alkali solution comprises an anionic surfactant or a nonionic surfactant.

* * * * *